(12) United States Patent
Akimoto

(10) Patent No.: US 12,733,319 B2
(45) Date of Patent: Sep. 8, 2026

(54) IMAGE DISPLAY DEVICE AND METHOD FOR MANUFACTURING IMAGE DISPLAY DEVICE

(71) Applicant: NICHIA CORPORATION, Anan (JP)

(72) Inventor: Hajime Akimoto, Anan (JP)

(73) Assignee: NICHIA CORPORATION, Anan (JP)

( * ) Notice: Subject to any disclaimer, the term of this patent is extended or adjusted under 35 U.S.C. 154(b) by 694 days.

(21) Appl. No.: 18/181,002

(22) Filed: Mar. 9, 2023

(65) Prior Publication Data

US 2023/0216015 A1 Jul. 6, 2023

Related U.S. Application Data

(63) Continuation of application No. PCT/JP2021/032870, filed on Sep. 7, 2021.

(30) Foreign Application Priority Data

Sep. 18, 2020 (JP) ................................ 2020-157949

(51) Int. Cl.
*H10H 20/857* (2025.01)
*H10H 20/01* (2025.01)
(Continued)

(52) U.S. Cl.
CPC .... *H10H 20/857* (2025.01); *H10H 20/01335* (2025.01); *H10H 20/825* (2025.01);
(Continued)

(58) Field of Classification Search
CPC ........... H10H 20/01335; H10H 20/825; H10H 20/8312; H10H 29/142; H10H 20/857;
(Continued)

(56) References Cited

U.S. PATENT DOCUMENTS 6,087,680 A 7/2000 Gramann et al.
2003/0197475 A1 10/2003 Takamura et al.
(Continued)

FOREIGN PATENT DOCUMENTS

CN 101789206 A 7/2010
CN 103493119 A 1/2014
(Continued)

OTHER PUBLICATIONS

International Search Report with English Translation and Written Opinion dated Nov. 30, 2021 in corresponding International Application No. PCT/JP2021/032870.

*Primary Examiner* — Latanya N Crawford Eason
(74) *Attorney, Agent, or Firm* — Foley & Lardner LLP

(57) ABSTRACT

An image display device according to an embodiment includes a substrate, a first wiring line formed on the substrate along a first direction, a first light-emitting element located on the first wiring line and including a first light-emitting surface, a light-transmitting electrode formed along a second direction intersecting the first direction and located on the first light-emitting surface, a first anisotropic conductive member located on the first wiring line, a first terminal electrically connected to the first wiring line via the first anisotropic conductive member, a second anisotropic conductive member located on the light-transmitting electrode, and a second terminal electrically connected to the light-transmitting electrode via the second anisotropic conductive member. The first light-emitting element includes a first bottom surface in contact with the first wiring line, and the first light-emitting surface is located on a side of the first light-emitting element opposite to the first bottom surface.

22 Claims, 49 Drawing Sheets

(51) Int. Cl.

| | |
|---|---|
| ***H10H 20/825*** | (2025.01) |
| ***H10H 20/831*** | (2025.01) |
| ***H10H 20/851*** | (2025.01) |

(52) U.S. Cl.
CPC ...... *H10H 20/8312* (2025.01); *H10H 20/851* (2025.01); *H10H 20/032* (2025.01); *H10H 20/0361* (2025.01); *H10H 20/0364* (2025.01)

(58) Field of Classification Search
CPC ............ H10H 20/032; H10H 20/0364; H10H 20/833; H10H 29/49; H10H 29/857; H10H 29/922; H10H 29/942; H10H 20/84; H10H 20/018; H10H 20/851; H10H 20/0361; H10W 90/10; H10W 90/15; H10W 90/155; H10W 90/00; H10W 90/723
See application file for complete search history.

(56) References Cited

U.S. PATENT DOCUMENTS

| | | | | |
|---|---|---|---|---|
| 2004/0135166 | A1 | 7/2004 | Yamada et al. | |
| 2010/0188720 | A1 | 7/2010 | Nakamura et al. | |
| 2014/0043569 | A1 | 2/2014 | Yabuta et al. | |
| 2015/0115296 | A1 | 4/2015 | Rhee et al. | |
| 2015/0249069 | A1 | 9/2015 | Yoshida et al. | |
| 2016/0005789 | A1 | 1/2016 | Rhee | |
| 2016/0240561 | A1 | 8/2016 | Saito et al. | |
| 2019/0229235 | A1 | 7/2019 | Iguchi | |
| 2019/0267357 | A1 | 8/2019 | Iguchi et al. | |
| 2019/0273179 | A1 | 9/2019 | Iguchi et al. | |
| 2019/0385513 | A1 | 12/2019 | Iguchi et al. | |
| 2020/0075663 | A1 | 3/2020 | Matsushita et al. | |
| 2020/0217460 | A1 | 7/2020 | Park et al. | |
| 2023/0216015 | A1 * | 7/2023 | Akimoto .......... | H10H 20/01335 257/79 |

FOREIGN PATENT DOCUMENTS

| | | | |
|---|---|---|---|
| JP | 2000-504153 | A | 4/2000 |
| JP | 2003-295782 | A | 10/2003 |
| JP | 2004-146539 | A | 5/2004 |
| JP | 2013-077305 | A | 4/2013 |
| JP | 2015-019020 | A | 1/2015 |
| JP | 2016-154213 | A | 8/2016 |
| JP | 2019-129226 | A | 8/2019 |
| JP | 2019-152851 | A | 9/2019 |
| JP | 2019-153783 | A | 9/2019 |
| JP | 2020-038895 | A | 3/2020 |
| WO | WO-2014/050876 | A1 | 4/2014 |
| WO | WO-2018/116814 | A1 | 6/2018 |

* cited by examiner 150
1192
100
Z
Y
X 181
150
1192
100
Z
Y
X 183
181
150
1192
100
Z
Y
X 184
183
181
150
1192
100
Z
Y
X

IMAGE DISPLAY DEVICE AND METHOD FOR MANUFACTURING IMAGE DISPLAY DEVICE

CROSS-REFERENCE TO RELATED APPLICATIONS

The present application is a bypass continuation of PCT Application No. PCT/JP2021/032870, filed Sep. 7, 2021, which claims priority to Japanese Application No. 2020-157949, filed Sep. 18, 2020. The contents of these applications are hereby incorporated by reference in their entireties.

BACKGROUND

Embodiments of the present disclosure relate to an image display device and a method for manufacturing the image display device.

There is a demand for image display devices having high definition exceeding 1000 pixels per inch (ppi). A video source displayed by such a high-definition image display device may demand high-speed response performance from the image display device.

In order to achieve a display that enables high-speed response, an active matrix method may be employed (for example, see Patent Literature 1: WO 2018-116814). In the active matrix method, a transistor for driving a pixel may be to be miniaturized; however, it is difficult to achieve a display having high definition exceeding 1000 ppi even when the latest low temperature polycrystalline silicon (LTPS) process is used.

On the other hand, a liquid crystal display with a known passive matrix, which does not use a transistor for driving a pixel, and a display employing an organic semiconductor have a low response speed and may not be preferable for displaying a video source demanding high-speed response.

An achievement of an image display device that enables high definition and high-speed response and a method for manufacturing the image display device is desired.

SUMMARY

Embodiments of the present disclosure provide an image display device that reduces a transfer process of a light-emitting element and improves yield, and a method for manufacturing the image display device.

An image display device according to one embodiment of the present disclosure includes a substrate, a first wiring line formed on the substrate along a first direction, a first light-emitting element provided on the first wiring line and including a first light-emitting surface, a first light-transmitting electrode formed along a second direction intersecting the first direction and provided on the first light-emitting surface, a first anisotropic conductive member provided on the first wiring line, a first terminal electrically connected to the first wiring line via the first anisotropic conductive member, a second anisotropic conductive member provided on the first light-transmitting electrode, and a second terminal electrically connected to the first light-transmitting electrode via the second anisotropic conductive member. The first light-emitting element includes a first bottom surface in contact with the first wiring line, and the first light-emitting surface is provided on a surface of the first light-emitting element opposite to the first bottom surface.

An image display device according to another embodiment of the present disclosure includes a substrate, a first wiring line formed on the substrate along a first direction, a first semiconductor layer provided on the first wiring line, a first light-emitting layer provided on the first semiconductor layer, a second light-emitting layer provided, on the first semiconductor layer, away from the first light-emitting layer along the first direction, a second semiconductor layer being a semiconductor layer of a conductivity type different from a conductivity type of the first semiconductor layer, provided on the first light-emitting layer, and including a first light-emitting surface, a third semiconductor layer being a semiconductor layer of a conductivity type identical to a conductivity type of the second semiconductor layer, provided on the second light-emitting layer, and including a second light-emitting surface, a first light-transmitting electrode formed along a second direction intersecting the first direction and provided on the first light-emitting surface, a second light-transmitting electrode formed along the second direction and provided on the second light-emitting surface, a first anisotropic conductive member provided on the first wiring line, a first terminal electrically connected to the first wiring line via the first anisotropic conductive member, a second anisotropic conductive member provided on the first light-transmitting electrode and the second light-transmitting electrode, a second terminal electrically connected to the first light-transmitting electrode via the second anisotropic conductive member, and a third terminal electrically connected to the second light-transmitting electrode via the second anisotropic conductive member. The first light-emitting surface is provided on a surface of the second semiconductor layer opposite to a surface of the second semiconductor layer in contact with the first light-emitting layer. The second light-emitting surface is provided on a surface of the third semiconductor layer opposite to a surface of the third semiconductor layer in contact with the second light-emitting layer.

A method for manufacturing an image display device according to one embodiment of the present disclosure includes providing a second substrate in which a semiconductor layer including a light-emitting layer is formed on a first substrate, forming a first conductive layer on a first surface of a third substrate, bonding the semiconductor layer to the third substrate via the first conductive layer, removing the first substrate, forming a first wiring line along a first direction by processing the first conductive layer, forming a first light-emitting element including a first light-emitting surface and a second light-emitting element including a second light-emitting surface by processing the semiconductor layer, forming an insulating film covering the first surface, the first wiring line, the first light-emitting element, and the second light-emitting element, exposing the first light-emitting surface and the second light-emitting surface by removing a part of the insulating film, forming a first light-transmitting electrode provided along a second direction intersecting the first direction on the first light-emitting surface and forming a second light-transmitting electrode provided along the second direction on the second light-emitting surface, electrically connecting a first terminal and the first wiring line by a pressure applied between the first terminal and the first wiring line, by providing a first anisotropic conductive member between the first terminal and the first wiring line, and electrically connecting the first light-transmitting electrode and a second terminal via a second anisotropic conductive member and electrically connecting the second light-transmitting electrode and a third terminal via the second anisotropic conductive member. The first light-emitting element includes a first bottom surface connected to the first wiring line, and the first light-emitting surface is provided on a surface of the first light-emitting element opposite to the first bottom surface. The second light-emitting element includes a second bottom surface connected to the first wiring line, and the second light-emitting surface is provided on a surface of the second light-emitting element opposite to the second bottom surface.

A method for manufacturing an image display device according to another embodiment of the present disclosure includes providing a second substrate in which a semiconductor layer including a light-emitting layer is formed on a first substrate, forming a second conductive layer on the semiconductor layer, providing a third substrate including a first surface, bonding the semiconductor layer to the first surface via the second conductive layer, removing the first substrate, forming a first wiring line along a first direction by processing the second conductive layer, forming a first light-emitting element including a first light-emitting surface and a second light-emitting element including a second light-emitting surface by processing the semiconductor layer, forming an insulating film covering the first surface, the first wiring line, the first light-emitting element, and the second light-emitting element, exposing the first light-emitting surface and the second light-emitting surface by removing a part of the insulating film, forming a first light-transmitting electrode provided along a second direction intersecting the first direction on the first light-emitting surface and forming a second light-transmitting electrode provided along the second direction on the second light-emitting surface, electrically connecting a first terminal and the first wiring line by a pressure applied between the first terminal and the first wiring line, by providing a first anisotropic conductive member between the first terminal and the first wiring line, and electrically connecting the first light-transmitting electrode and a second terminal via a second anisotropic conductive member and electrically connecting the second light-transmitting electrode and a third terminal via the second anisotropic conductive member. The first light-emitting element includes a first bottom surface connected to the first wiring line, and the first light-emitting surface is provided on a surface of the first light-emitting element opposite to the first bottom surface. The second light-emitting element includes a second bottom surface connected to the first wiring line, and the second light-emitting surface is provided on a surface of the second light-emitting element opposite to the second bottom surface.

According to certain embodiments of the present disclosure, an image display device that enables high definition and high-speed response is implemented.

According to other embodiments of the present disclosure, a method for manufacturing an image display device that enables high definition and high-speed response is achieved.

BRIEF DESCRIPTION OF THE DRAWINGS

FIG. 36A is a schematic cross-sectional view illustrating a part of the image display device of the sixth embodiment.

FIG. 36B is a schematic cross-sectional view illustrating a part of the image display device of the sixth embodiment.

FIG. 36C is a schematic cross-sectional view illustrating a part of the image display device of the sixth embodiment.

DETAILED DESCRIPTION

Figure 1:
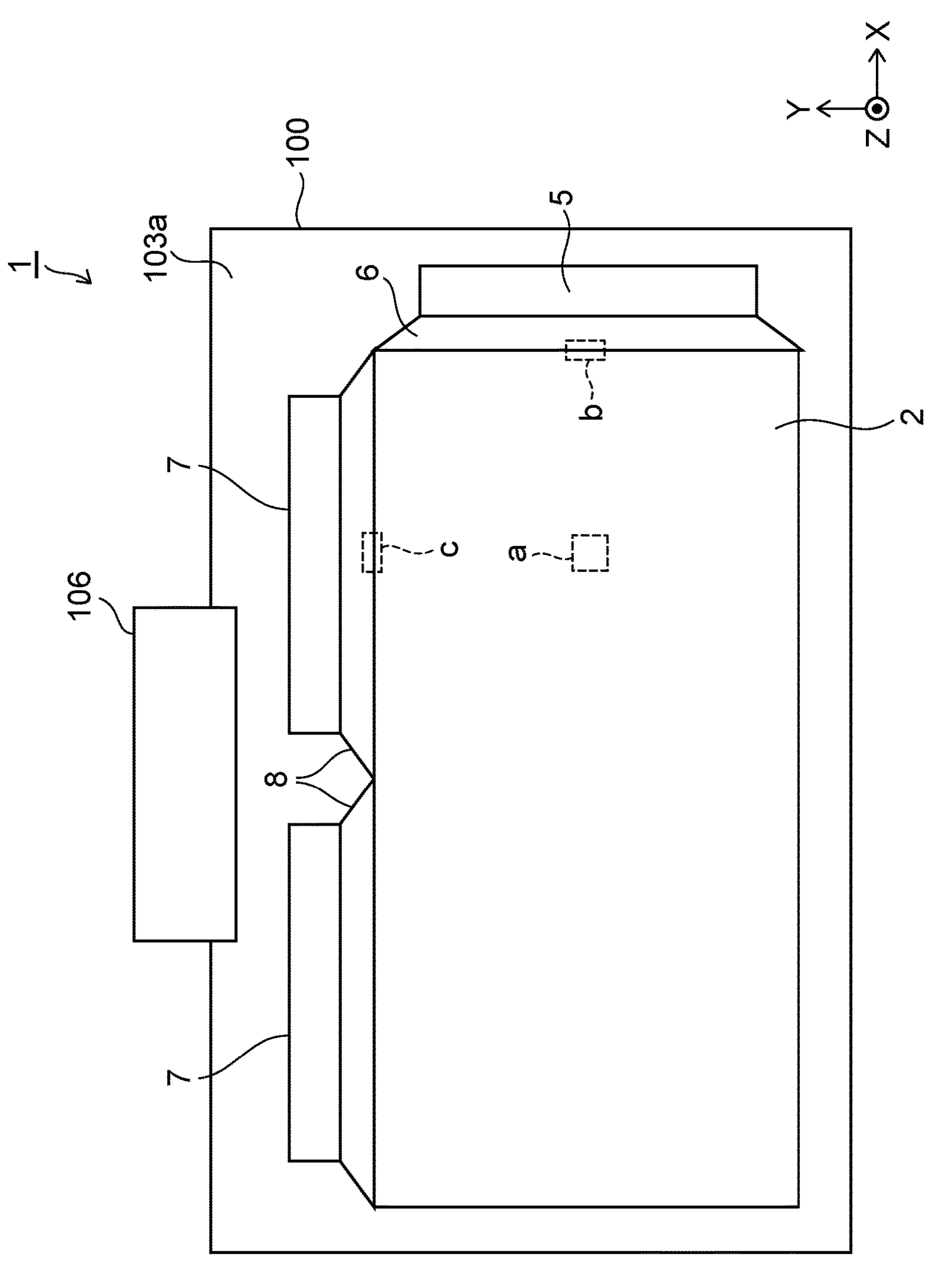
FIG. 1 is a schematic plan view illustrating an image display device according to a first embodiment.

Embodiments of the present disclosure will be described below with reference to the drawings.

The drawings are schematic or conceptual, and the relationships between thicknesses and widths of portions, the proportions of sizes between portions, and the like are not necessarily the same as the actual values thereof. Furthermore, the dimensions and the proportions may be illustrated differently between the drawings, even in a case in which the same portion is illustrated.

In the present description and the drawings, elements similar to those described above with respect to the drawings already mentioned are denoted using the same reference characters, and a detailed description thereof is omitted as appropriate.

First Embodiment

FIG. 1 is a schematic plan view illustrating an image display device according to the present embodiment.

As illustrated in FIG. 1, an image display device 1 of the present embodiment includes a display region 2, a row selection circuit 5, and current drive circuits 7. The display region 2, the row selection circuit 5, and the current drive circuits 7 are provided on a substrate 100. A row wiring region 6 and column wiring regions 8 are also provided on the substrate 100. The row wiring region 6 is provided between the display region 2 and the row selection circuit 5 and electrically connects the display region 2 and the row selection circuit 5. The column wiring region 8 is provided between the display region 2 and the current drive circuit 7 and electrically connects the display region 2 and the current drive circuit 7. In addition to the above-described components, the substrate 100 is provided with a connector 106 for connecting the row selection circuit 5 and the current drive circuit 7 to an external circuit and supplying power and selection signals for proper operation of these circuits.

Figure 2:
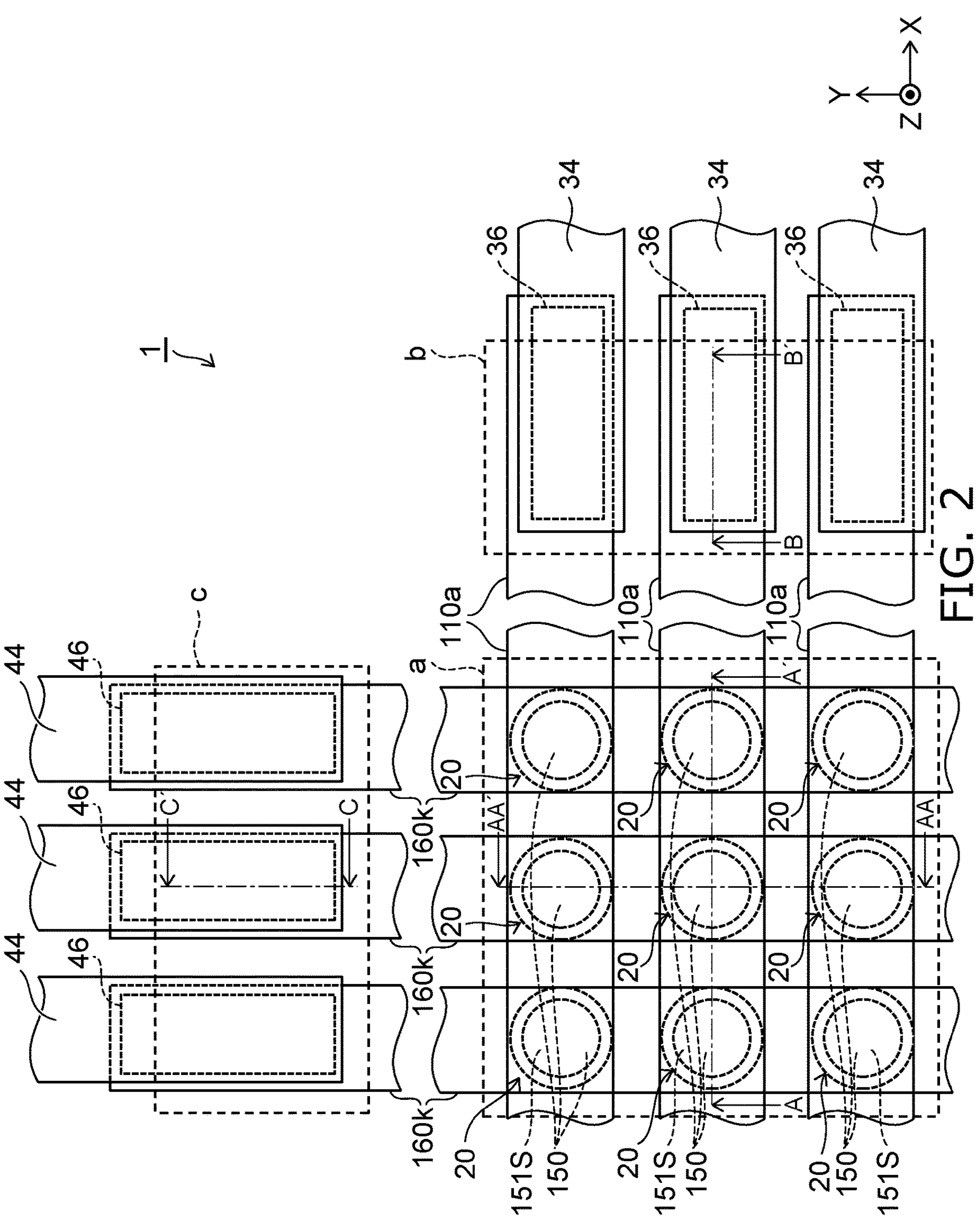
FIG. 2 is a schematic enlarged view illustrating a part of the image display device of the first embodiment.

In the following description, description is sometimes made using a three-dimensional coordinate system of XYZ. A first surface 103*a* of the substrate 100 on which the display region 2 is formed is a surface parallel to the XY plane. The display region 2 is formed on the first surface 103*a*. In this example, the display region 2 is a rectangle having sides substantially parallel to the X-axis and sides substantially parallel to the Y-axis. As illustrated in FIG. 2 described below, sub-pixels 20 are arranged along the X-axis and arranged along the Y-axis in the display region 2.

The row selection circuit 5, the row wiring region 6, the current drive circuits 7, and the column wiring regions 8 are also formed on the first surface 103*a*. The row selection circuit 5 is provided along one side of the display region 2. The side of the display region 2 along which the row selection circuit 5 is provided is a side parallel to the Y-axis. The current drive circuits 7 are provided on another side of the display region 2. The side of the display region 2 along which the current drive circuits 7 are provided is a side parallel to the X-axis.

The row selection circuit 5 and the row wiring region 6 are semiconductor integrated circuits provided in a form of a tape carrier package (TCP), for example, and the current drive circuit 7 and the column wiring region 8 are also semiconductor integrated circuits provided in a form of TCP. The row selection circuit 5 and the current drive circuit 7 may be provided not only in a form of TCP but also in a form of a chip on board (COB) or the like.

As illustrated in FIG. 2 described below, each sub-pixel 20 includes a light-emitting element 150. The light-emitting element 150 includes a light-emitting surface 151S from which light is emitted in a direction along the Z-axis in the display region 2. The light emission direction of the light-emitting element 150 is a positive direction of the Z-axis. Hereinafter, the positive direction of the Z-axis may be referred to as "up" or "upward", and a negative direction of the Z-axis may be referred to as "down" or "downward". However, the direction along the Z-axis is not necessarily a direction in which gravity is applied. The length in the direction along the Z-axis may be referred to as a height.

FIG. 2 is a schematic enlarged view illustrating a part of the image display device of the present embodiment.

FIG. 2 illustrates enlarged views of portions a, b, and c illustrated in FIG. 1. The portion a is a part of the display region 2 in FIG. 1. The portion b is a part of a region extending over the display region 2 and the row wiring region 6 in FIG. 1. The portion c is a part of a region extending over the display region 2 and the column wiring region 8 in FIG. 1.

As illustrated in FIG. 2, the image display device 1 includes the sub-pixels 20, wiring lines 110*a*, the light-emitting elements 150, light-transmitting electrodes 160*k*, first terminals 34, and second terminals 44.

The wiring line 110*a* is provided along the X-axis direction (first direction). A plurality of wiring lines 110*a* are provided. The plurality of wiring lines (first wiring lines or second wiring lines) 110*a* are separated from each other in the Y-axis direction at substantially equal intervals so as to be substantially parallel to each other. One end portion of the wiring line 110*a* is connected to the first terminal 34 in the row wiring region 6 illustrated in FIG. 1. The wiring line 110*a* is electrically connected to the first terminal 34 in the connection region 36.

The light-emitting element 150 is provided on the wiring line 110*a*. A plurality of light-emitting elements 150 are provided, and the plurality of light-emitting elements (first light-emitting elements or second light-emitting elements) 150 are arranged on the wiring line 110*a* so as to be separate from each other at substantially equal intervals in the X-axis direction.

The light-transmitting electrode 160*k* is provided along the Y-axis direction (second direction). A plurality of light-transmitting electrodes 160*k* are provided. The plurality of light-transmitting electrodes (first light-transmitting electrodes or second light-transmitting electrodes) 160*k* are separated from each other in the X-axis direction at substantially equal intervals so as to be substantially parallel to each other. The light-transmitting electrode 160*k* is connected at one end portion thereof to the second terminal 44 in the column wiring region 8 illustrated in FIG. 1. The first light-transmitting electrode 160*k* is electrically connected to the second terminal 44 in a connection region 46.

The wiring line 110*a* and the light-transmitting electrode 160*k* are provided so as to be substantially orthogonal to each other. The light-emitting element 150 is provided at an intersection of the wiring line 110*a* and the light-transmitting electrode 160*k*. Thus, the light-emitting elements 150 are arranged at substantially equal intervals along the X-axis direction and at substantially equal intervals along the Y-axis direction. The interval between the light-emitting elements 150 in the X-axis direction is substantially the same as the interval between the light-emitting elements 150 in the Y-axis direction. That is, in this example, the light-emitting elements 150 are disposed in a matrix at equal intervals.

The arrangement of the light-emitting elements 150 is not limited to that described above and may be, for example, a staggered arrangement. The wiring line 110*a* and the light-transmitting electrode 160*k* are not limited to being provided orthogonal to each other in accordance with the arrangement of the light-emitting elements 150 and are not limited to being provided linearly. In addition, the light-emitting elements 150 are not limited to being disposed in a matrix at equal intervals, and a ratio of the interval in the X-axis direction to the interval in the Y-axis direction may be, for example, about 1:3. An appropriate arrangement of the light-emitting elements 150 can be freely set.

An interval between the light-emitting elements 150 in the X-axis direction is referred to as a pitch in the X-axis direction, and an interval between the light-emitting elements 150 in the Y-axis direction is referred to as a pitch in the Y-axis direction. In an example of each of the embodiments described below, because the pitch of the light-emitting elements in the X-axis direction and the pitch of the light-emitting elements in the Y-axis direction are set to be substantially equal to each other, the interval between the light-emitting elements 150 may be simply referred to as a pitch. For example, the pitch in the X-axis direction is defined as a length between the centers of the lengths in the X-axis direction of the light-emitting elements adjacent to each other in the X-axis direction, and the pitch in the Y-axis direction is defined as a length between the centers of the lengths in the Y-axis direction of the light-emitting elements adjacent to each other in the Y-axis direction.

FIGS. 3A, 3B, 4A, and 4B are schematic cross-sectional views illustrating a part of the image display device of the present embodiment.

Figures 3A, 3B:
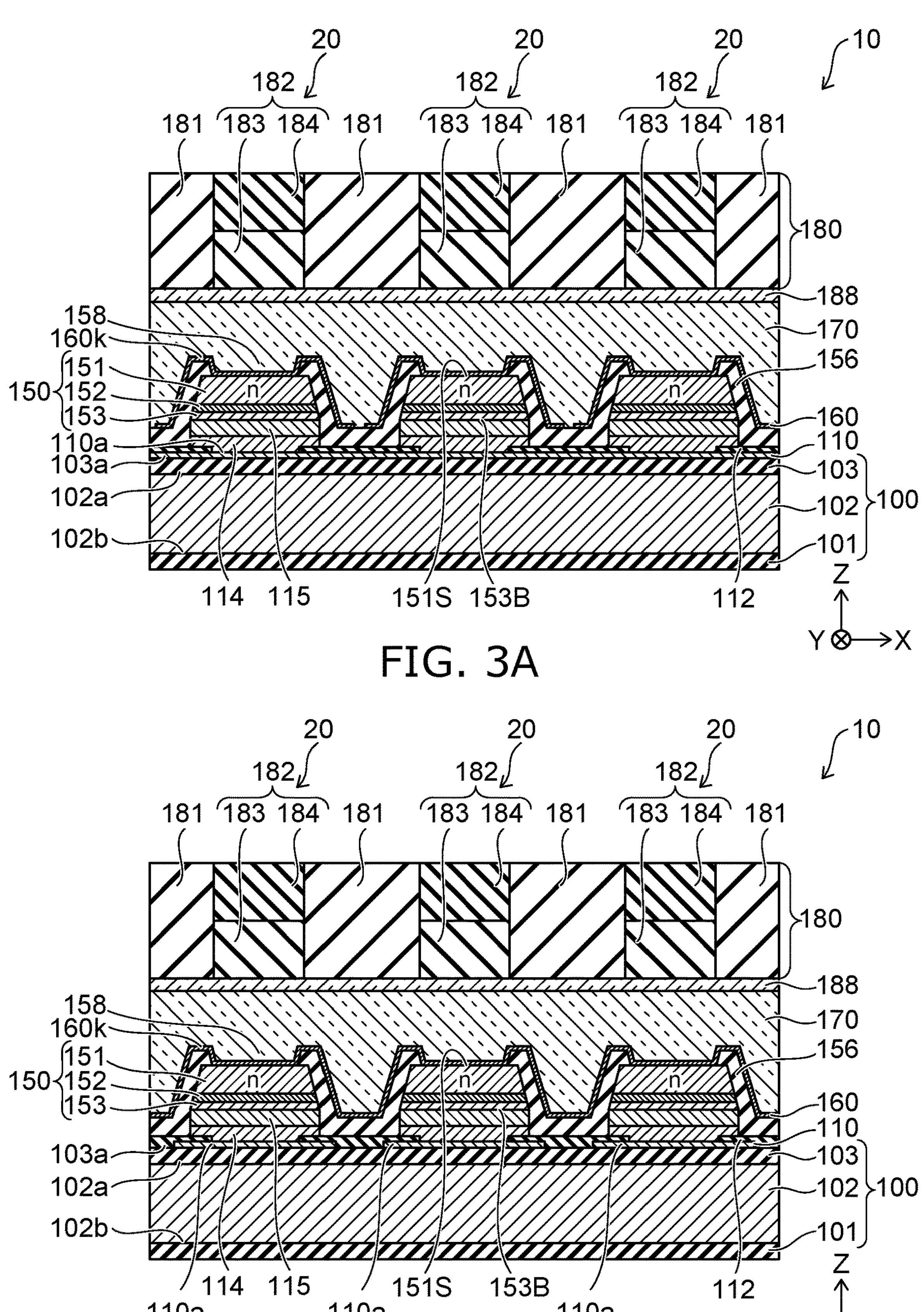
FIG. 3A is a schematic cross-sectional view illustrating a part of the image display device of the first embodiment.
FIG. 3B is a schematic cross-sectional view illustrating a part of the image display device of the first embodiment.

FIG. 3A is a cross-sectional view taken along line A-A' of FIG. 2.

FIG. 3B is a cross-sectional view taken along line AA-AA' of FIG. 2.

Figures 4A, 4B:
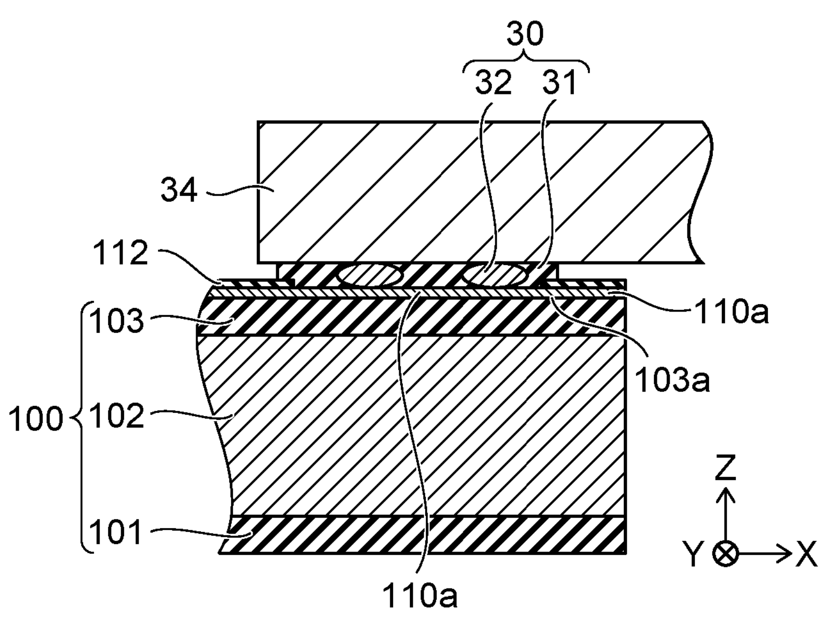
FIG. 4A is a schematic cross-sectional view illustrating a part of the image display device of the first embodiment.
FIG. 4B is a schematic cross-sectional view illustrating a part of the image display device of the first embodiment.

FIG. 4A is a cross-sectional view taken along line B-B' of FIG. 2.

FIG. 4B is a cross-sectional view taken along line C-C' of FIG. 2.

In the example described below, in each sub-pixel 20 of the image display device 1, a color filter 180 is provided on the light-emitting element 150. In the image display device 1 of the present embodiment, one pixel 10 includes three sub-pixels 20. The color filter 180 may be a single-color optical filter or may not be provided with an optical filter depending on the number of colors of an image to be displayed. When a monochromatic optical filter is provided or when an optical filter is not provided, one pixel includes one sub-pixel 20.

As illustrated in FIGS. 3A and 3B, a pixel 10 includes three sub-pixels 20. The three sub-pixels 20 respectively have different color conversion portions 182, and the color conversion portions 182 are disposed so as to output, for example, red, green, and blue, respectively. In this example, the color conversion portions that output red, green, and blue are disposed in ascending order of the X coordinate. The configuration of each sub-pixel 20 is the same except for the color output by the color conversion portion 182. The configuration of the color filter 180 including the color conversion portion 182 will be described below.

The sub-pixel 20 includes the substrate 100. The substrate 100 includes a Si substrate 102 and oxide films 101 and 103. The oxide film 103 is formed over one surface 102*a* of the Si substrate 102. The oxide film 101 is formed over the other surface 102*b* of the Si substrate 102. The first surface 103*a* of the substrate 100 is a surface of the oxide film 103.

The sub-pixel 20 include the wiring line 110*a*, the light-emitting element 150, and the light-transmitting electrode 160*k*.

A wiring layer 110 is provided on the first surface 103*a*. The wiring layer 110 includes a plurality of wiring lines 110*a* provided on the first surface 103*a*. The plurality of wiring lines 110*a* are formed along the X-axis on the first surface 103*a*. The plurality of wiring lines 110*a* are separated from each other in the Y-axis direction so as to be substantially parallel to each other. The interval between the plurality of wiring lines 110*a* is equal to the pitch of the light-emitting elements 150 in the Y-axis direction. Adjacent wiring lines 110*a* among the plurality of wiring lines 110*a* are separated from each other by an insulating layer 112.

In cross-sectional views after FIG. 3A, unless otherwise specified, a reference character representing a wiring layer is displayed beside a wiring line constituting the wiring layer.

Bonding metals (metal layers) 114 and 115 are provided on the wiring line 110*a*. The bonding metals 114 and 115 are layered in this order from the wiring line 110*a*. The bonding metals 114 and 115 are disposed so as to be equal to the pitch of the light-emitting elements 150 in the X-axis direction.

The bonding metal 115 is provided for ohmic connection with the light-emitting element 150 and reduces the connection resistance with the wiring line 110*a*. The light-emitting element 150 and the wiring line 110*a* can be connected to each other with a lower resistance value by providing the bonding metals 114 and 115 with appropriate thicknesses.

The bonding metals 114 and 115 are preferably formed of a metal material having high light reflectivity such as Ag. The bonding metals 114 and 115 are provided below the bottom surface 153B of the light-emitting element 150. For that reason, the bonding metals 114 and 115 reflect downward scattered light or the like from the light-emitting element 150 to the light-emitting surface 151S and can improve the substantial light emission efficiency of the light-emitting element 150, by having the light reflectivity.

The light-emitting element (first light-emitting element or second light-emitting element) 150 is provided on the bonding metal 115. The light-emitting element 150 includes the bottom surface (first bottom surface or second bottom surface) 153B and the light-emitting surface (first light-emitting surface or second light-emitting surface) 151S. The light-emitting element 150 is a truncated cone-shaped element including the bottom surface 153B in contact with the bonding metal 115 and the light-emitting surface 151S on a side opposite to the bottom surface 153B. In the XY plan view, an outer circumference of the bottom surface 153B substantially coincides with outer circumferences of the bonding metals 114 and 115. The bonding metals 114 and 115 are formed in a columnar shape substantially coinciding with the outer circumference of the bottom surface. The shape of the light-emitting element 150 is not limited to a truncated cone and may be a cylinder, a truncated pyramid, or a prism. In the case of the truncated cone or the cylinder, the outer circumferential shape is not limited to a circle but may be an ellipse. In the case of a pyramid or the prism, the outer circumferential shape is not limited to a square but may be a polygon such as a hexagon or an octagon. In the case of the pyramid or the prism, the corner portion may be rounded.

The light-emitting element 150 includes a p-type semiconductor layer 153, a light-emitting layer 152, and an n-type semiconductor layer 151. The p-type semiconductor layer 153, the light-emitting layer 152, and the n-type semiconductor layer 151 are layered in this order from the bottom surface 153B toward the light-emitting surface 151S. The p-type semiconductor layer 153 includes the bottom surface 153B, and the bonding metal 115 is electrically connected to the p-type semiconductor layer 153. Thus, the p-type semiconductor layer 153 is electrically connected to the wiring line 110*a* via the bonding metals 114 and 115. A plurality of light-emitting elements 150 are provided along the X-axis direction on one wiring line 110*a*, and the p-type semiconductor layers 153 of the plurality of light-emitting elements 150 are electrically connected to each other.

For the light-emitting element 150, for example, a gallium nitride-based compound semiconductor including a light-emitting layer such as $In_XAl_YGa_{1-X-Y}N$ ($0 \leq X$, $0 \leq Y$, $X+Y<1$) is preferably used. Hereinafter, the gallium nitride-based compound semiconductor described above may be simply referred to as gallium nitride (GaN). The light-emitting element 150 according to one embodiment of the present invention is a so-called light-emitting diode. The wavelength of the light emitted by the light-emitting element 150 is in a range from the near ultraviolet region to the visible light region and is, for example, about 467 nm±30 nm. The wavelength of the light emitted by the light-emitting element 150 may correspond to blue-violet emission of about 410 nm±30 nm. The wavelength of the light emitted by the light-emitting element 150 is not limited to the values described above and may be an appropriate value.

The light-emitting elements 150 are provided on the X-axis with a pitch on the X-axis via the bonding metals 114 and 115 on the wiring line 110*a*. The p-type semiconductor layers 153 of the light-emitting elements 150 provided on the same wiring line 110*a* are electrically connected to each other.

The insulating film 156 covers the insulating layer 112, the bonding metals 114 and 115, and the light-emitting element 150. In this example, a part of the insulating film 156 is removed above the light-emitting element 150, and the insulating film 156 covers a portion other than the removed portion above the light-emitting element 150. The insulating film 156 protects the light-emitting element 150 from an external environment and separates the adjacent light-emitting elements 150 from each other. The light-emitting surface 151S emits light from an opening 158 formed by removing the insulating film 156 through the light-transmitting electrode 160*k*. The shape of the light-emitting surface 151S in the XY plan view may be a circle similar to the shape of the n-type semiconductor layer 151 in the XY plan view or may be another shape.

A light-transmitting wiring layer 160 includes a plurality of light-transmitting electrodes 160*k*. The plurality of light-transmitting electrodes 160*k* are each provided along the Y-axis. The plurality of light-transmitting electrodes 160*k* are separated from each other in the X-axis direction so as to be substantially parallel to each other. The light-transmitting electrodes 160*k* are provided over the light-emitting surface 151S. The light-emitting elements 150 are arranged at a constant pitch in the X-axis direction and the Y-axis direction. For that reason, a distance between the centers of the adjacent light-transmitting electrodes 160*k* in the X-axis direction is equal to the pitch of the light-emitting elements 150 in the X-axis direction.

Because the n-type semiconductor layer 151 includes the light-emitting surface 151S, the light-transmitting electrode 160*k* is electrically connected to the n-type semiconductor layer 151. With this configuration, the n-type semiconductor layers 151 of the plurality of arranged light-emitting elements 150 are electrically connected to each other along the Y-axis direction.

A surface resin layer 170 is provided on the insulating film 156 and the light-transmitting electrode 160*k*. The surface resin layer 170 covers upper region of the light-emitting surface 151S. The surface resin layer 170 is a transparent resin and provides a planarized surface for protecting the insulating film 156 and the light-transmitting electrode 160*k* and for adhering the color filter 180.

The sub-pixel 20 includes a color filter (wavelength conversion member) 180. The color filter 180 is provided on the surface resin layer 170 via a transparent thin film adhesive layer 188. The transparent thin film adhesive layer 188 is provided to adhere the surface resin layer 170 and the color filter 180.

The color filter 180 includes a light-blocking portion 181 and the color conversion portion 182. The color conversion portion 182 is provided immediately above the light-emitting surface 151S of the light-emitting element 150 depending on the shape of the light-emitting surface 151S. In the color filter 180, a portion other than the color conversion portion 182 is the light-blocking portion 181. The light-blocking portion 181 is a so-called black matrix, can reduce blur caused by the color mixing of light emitted from the adjacent color conversion portion 182 and the like, and thus display a sharp image.

The color conversion portion 182 includes one layer or two or more layers. FIGS. 3A and 3B illustrate a case in which the color conversion portion 182 includes two layers. Whether the color conversion portion 182 includes one layer or two layers is determined by the color, that is, the wavelength, of the light emitted by the sub-pixel 20. In a case in which the light emission color of the sub-pixel 20 is red, the color conversion portion 182 preferably includes two layers of a color conversion layer 183 and a filter layer 184 through which red light passes. In a case in which the light emission color of the sub-pixel 20 is green, the color conversion portion 182 preferably includes two layers of the color conversion layer 183 and the filter layer 184 through which green light passes. In a case in which the light emission color of the sub-pixel 20 is blue, one layer is preferred.

In a case in which the color conversion portion 182 has two layers, the first layer is the color conversion layer 183 and the second layer is the filter layer 184. The color conversion layer 183, which is a first layer, is provided closer to the light-emitting element 150. The filter layer 184 is layered on the color conversion layer 183.

The color conversion layer 183 converts the wavelength of light emitted by the light-emitting element 150 into a desired wavelength. In a case in which the sub-pixel 20 emits red light, light of 467 nm±30 nm, which is the wavelength of light emitted by the light-emitting element 150, is converted into light having a wavelength of about 630 nm±20 nm, for example. In a case in which the sub-pixel 20 emits green light, light of 467 nm±30 nm, which is the wavelength of light emitted by the light-emitting element 150, is converted into light having a wavelength of about 532 nm±20 nm, for example.

The filter layer 184 blocks the wavelength component of the blue light emission remaining without being color-converted by the color conversion layer 183.

In a case in which the color of the light emitted from the sub-pixel 20 is blue, the light may be output through the color conversion layer 183 or may be output as it is without passing through the color conversion layer 183. In a case in which the wavelength of light emitted from the light-emitting element 150 is about 467 nm±30 nm, the light may be output without passing through the color conversion layer 183. In a case in which the wavelength of light emitted from the light-emitting element 150 is 410 nm±30 nm, it is preferable to provide the color conversion layer 183 having one layer in order to convert the wavelength of the light to be output into about 467 nm≤30 nm.

Even in the case of the sub-pixel 20 emitting blue color, the sub-pixel 20 may include the filter layer 184. By providing the filter layer 184 through which blue light is transmitted to the sub-pixel 20 emitting blue color, minute reflection of external light other than the blue light generated at a front surface of the light-emitting element 150 is suppressed.

As illustrated in FIG. 4A, the wiring line 110*a* is provided on the first surface 103*a* of the substrate 100. The insulating layer 112 is provided on the wiring line 110*a*. A part of the insulating layer 112 on the wiring line 110*a* is removed, and an anisotropic conductive member (first anisotropic conductive member) 30 is provided at a position where the insulating layer 112 is removed. The anisotropic conductive member 30 is an anisotropic conductive paste or an anisotropic conductive film.

In the present description, the anisotropic conductive member includes an anisotropic conductive paste (ACP) and an anisotropic conductive film (ACF). In the present embodiment and other embodiments to be described below, when the anisotropic conductive member is referred, ACP or the ACF can be used without distinction. In the description of a manufacturing method that will be described below, when ACP is used, it may be described as "an anisotropic conductive member is applied", and when ACF is used, it may be described as "an anisotropic conductive member is attached".

The anisotropic conductive member 30 includes a binder 31 and anisotropic conductive particles 32. The binder 31 functions as an adhesive that fixes the wiring line 110*a* and the first terminal 34 that face each other. The anisotropic conductive particles 32 are uniformly dispersed in the binder 31 and electrically connect the wiring line 110*a* and the first terminal 34, to which a pressure is applied. The anisotropic conductive particles 32 electrically connect the wiring line 110*a* and the first terminal 34 provided in the Z-axis direction of the wiring line 110*a* but do not electrically connect conductors in other directions. For example, in the wiring lines 110*a*, one wiring line 110*a* is provided adjacent to another wiring line 110*a* in parallel, and even if the anisotropic conductive particles 32 are present between these two wiring lines 110*a*, these two wiring lines 110*a* are not electrically connected to each other.

As illustrated in FIG. 4B, the second terminal 44 is provided on the substrate 100 via the insulating film 156, the light-transmitting electrode 160*k*, and an anisotropic conductive member 40. The second terminal 44 is electrically connected to the light-transmitting electrode 160*k* via the anisotropic conductive member (second anisotropic conductive member) 40.

The anisotropic conductive member 40 includes a binder 41 and anisotropic conductive particles 42. The binder 41 functions as an adhesive that fixes the light-transmitting electrode 160*k* and the second terminal 44 that face each other. The anisotropic conductive particles 42 are uniformly dispersed in the binder 41, and electrically connect the light-transmitting electrode 160*k* and the second terminal 44 that face each other. The anisotropic conductive particles 42 also exhibit the same function as the anisotropic conductive particles 32. The anisotropic conductive particles 42 electrically connect the light-transmitting electrode 160*k* and the second terminal 44 provided in the Z-axis direction of the light-transmitting electrode 160*k* but do not electrically connect conductors in other directions.

In the row wiring region 6 illustrated in FIG. 1, an end portion of the wiring line extending from the row selection circuit 5 serves as the first terminal 34 and is electrically connected to the wiring line 110*a* provided in the display region 2. Thus, in the light-emitting elements 150 arranged on the wiring line 110*a*, the p-type semiconductor layers 153 are connected to each other and are electrically connected to the row selection circuit 5 illustrated in FIG. 1 via the first terminal 34.

In the column wiring region 8 illustrated in FIG. 1, an end portion of the wiring line extending from the current drive circuit 7 serves as the second terminal 44 and is electrically connected to the light-transmitting electrode 160*k* provided in the display region 2. Thus, in the light-emitting elements 150 arranged in the Y-axis direction, the n-type semiconductor layers 151 are connected to each other by the light-transmitting electrode 160*k* and are electrically connected to the current drive circuit 7 illustrated in FIG. 1 via the second terminal 44.

The connector 106 illustrated in FIG. 1 is electrically connected to the row selection circuit 5 and the current drive circuit 7 via a wiring line (not illustrated) formed on the first surface 103*a*. The row selection circuit 5 and the current drive circuit 7 are supplied with power and various signals including a row selection signal and a brightness signal from the connector.

Figure 5:
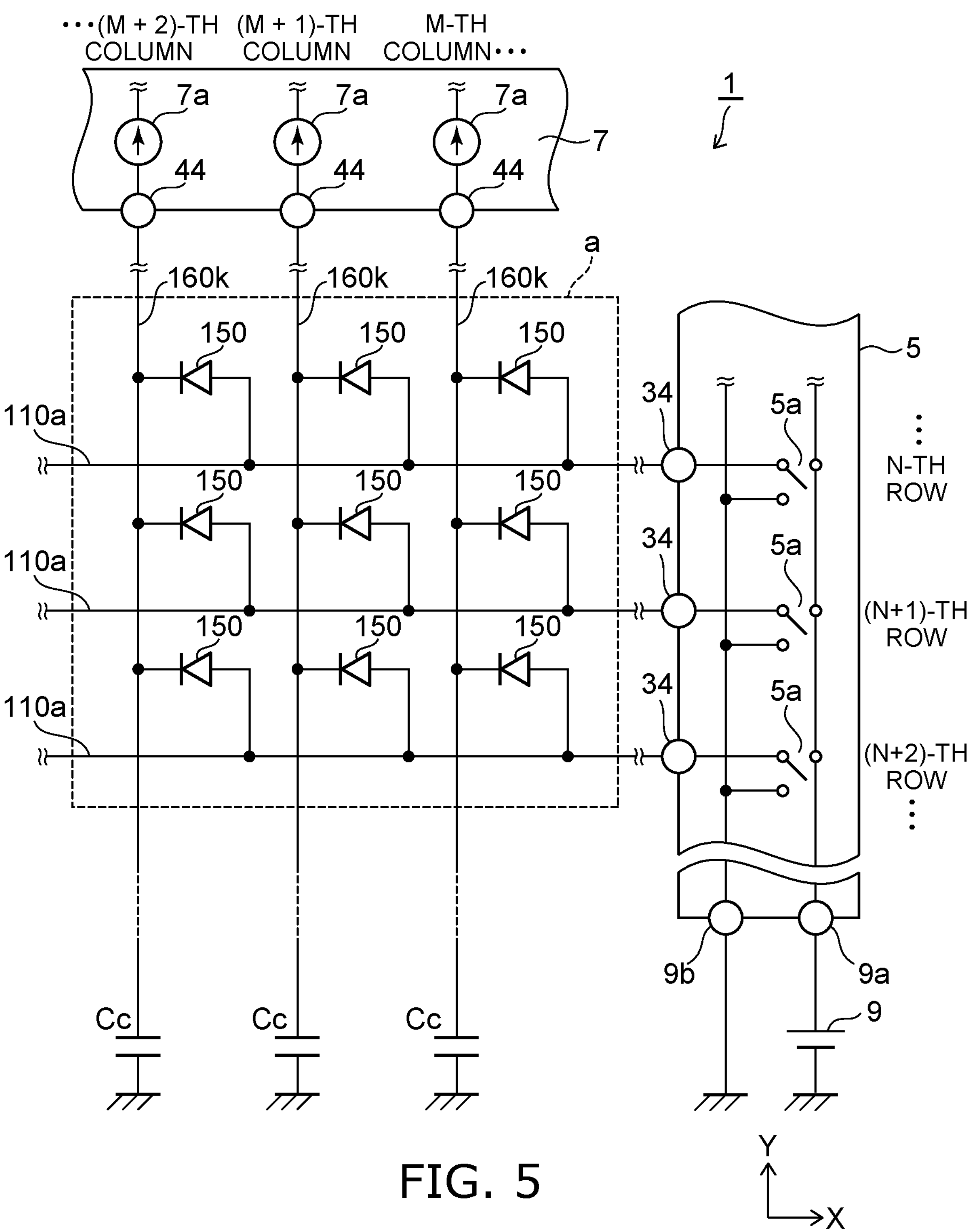
FIG. 5 is a schematic block diagram illustrating the image display device of the first embodiment.

FIG. 5 is a schematic block diagram illustrating the image display device according to the present embodiment.

FIG. 5 illustrates a part of a circuit configuration of the image display device 1 and schematically illustrates the circuit configuration of a portion corresponding to the portion a in FIG. 1. FIG. 5 also illustrates a connection relationship between the row selection circuit 5 and circuit elements of the portion a and a connection relationship between the current drive circuit 7 and the circuit elements of the portion a.

The wiring lines 110*a* are provided along the row direction, and the light-transmitting electrodes 160*k* are provided along the column direction. In FIGS. 1 and 2, the row direction is the X-axis direction, and the column direction is the Y-axis direction. In the description of FIG. 5, three wiring lines 110*a* are referred to as an N-th row, an (N+1)-th row, and an (N+2)-th row from top to bottom, and three light-transmitting electrodes 160*k* are referred to as an M-th column, an (M+1)-th column, and an (M+2)-th column from right to left. When viewed from the row selection circuit 5, the light-transmitting electrode 160*k* of the M-th column is disposed at the closest position, and the light-transmitting electrode 160*k* of the (M+2)-th column is disposed at the farthest position. When viewed from the current drive circuit 7, the wiring line 110*a* of the N-th row is disposed at the closest position, and the wiring line 110*a* of the (N+2)-th row is disposed at the farthest position.

ADC power supply 9 is connected to the row selection circuit 5 via a power supply terminal 9*a* and a ground terminal 9*b*. A voltage sufficiently higher than that of the ground terminal 9*b* is applied to the power supply terminal 9*a* by the DC power supply 9. The row selection circuit 5 includes row selection switches 5*a* corresponding to the number of the wiring lines 110*a*, and each of the row selection switches 5*a* is connected to the corresponding one of wiring lines 110*a* via the corresponding one of first terminals 34. The row selection switches 5*a* are each connected to the ground terminal 9*b* in an initial state and are each connected to the power supply terminal 9*a* in accordance with a row selection signal supplied from a control circuit (not illustrated).

The current drive circuit 7 includes current sources 7*a* corresponding to the number of the light-transmitting electrodes 160*k*, and each of the current sources 7*a* is connected to the corresponding one of light-transmitting electrodes 160*k* via the corresponding one of terminals 44. The current source 7*a* outputs a current having a set current value in accordance with a brightness signal supplied from a control circuit (not illustrated).

The light-emitting element 150 is formed at an intersection of the wiring line 110*a* and the light-transmitting electrode 160*k*, and the light-emitting element 150 is represented by a circuit symbol of a diode in FIG. 5. When the voltage value of the wiring line 110*a* is higher than the voltage value of the light-transmitting electrode 160*k* by exceeding an amount corresponding to a forward voltage drop of the light-emitting element 150, the light-emitting element 150 passes a current.

For example, when the row selection switch 5*a* of the N-th row is connected to the power supply terminal 9*a*, a current flows through the light-emitting elements 150 of each column of the N-th row. At this time, because the row selection switches 5*a* of rows other than the N-th row are connected to the ground terminal 9*b*, the currents of the light-emitting elements 150 of rows other than the N-th are cut off.

Because the light-emitting elements 150 are disposed on a two dimensional plane, the wiring line 110*a* connected to the row selection circuit 5 has a resistance depending on the length of the wiring line 110*a*. Thus, the voltage that can be applied to the light-emitting elements 150 in the column located away from the row selection circuit 5 causes a voltage drop due to resistance depending on the length of the wiring line 110*a*. In order to overcome the voltage drop due to the wiring line 110*a*, it is conceivable to increase the voltage value output by the DC power supply 9, but this increases the power loss of the image display device 1. For that reason, it is preferable to suppress the resistance of the wiring line 110*a* as much as possible.

Figure 6:
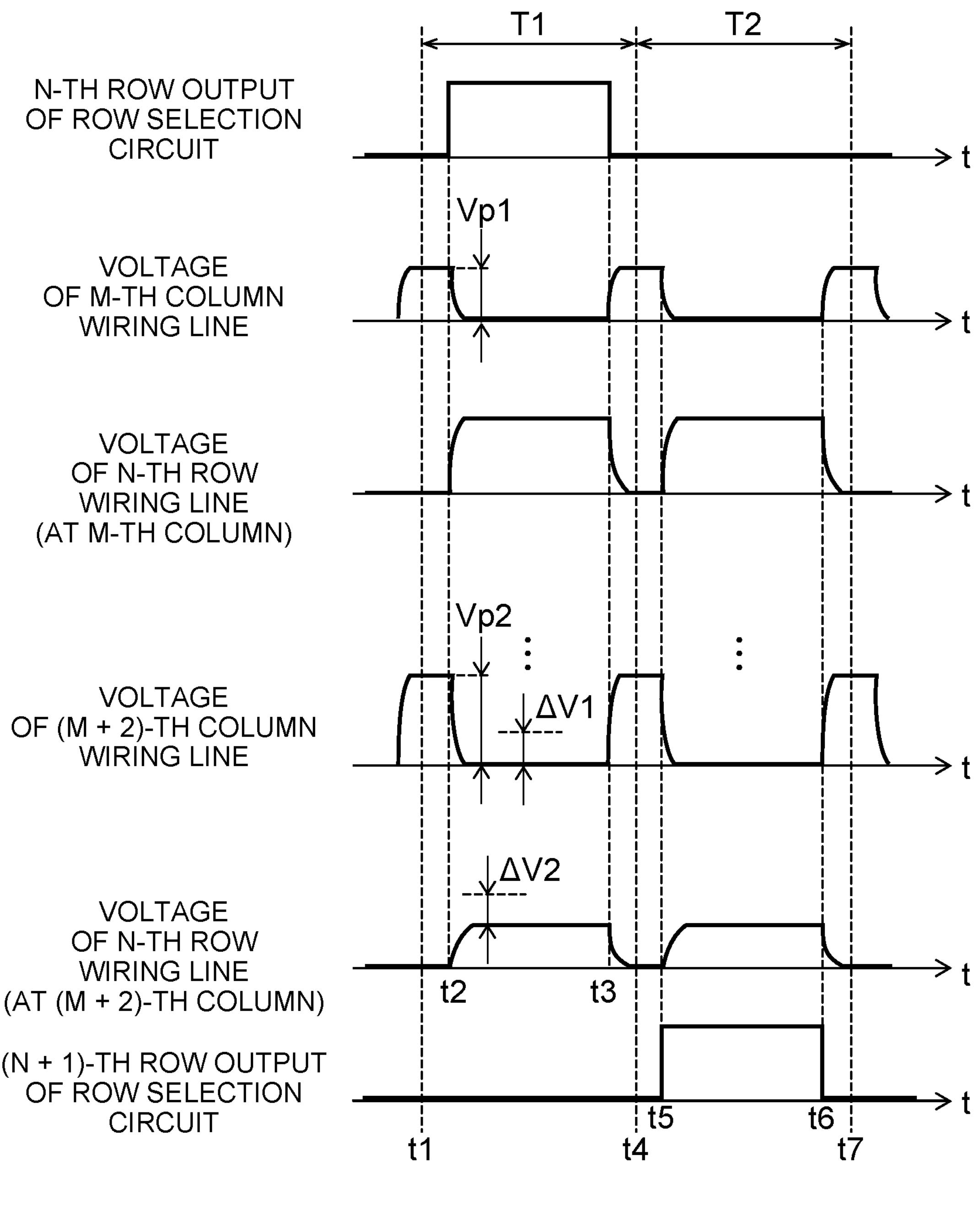
FIG. 6 is an example of a schematic operation waveform diagram for illustrating an operation of the image display device of the first embodiment.

FIG. 6 is an example of a schematic operation waveform diagram for illustrating an operation of the image display device of the present embodiment. FIG. 6 illustrates temporal changes in signals and voltage values at six locations in the circuit of FIG. 5.

The uppermost diagram in FIG. 6 illustrates a temporal change in the output signal of the first terminal 34 of the N-th row of the row selection circuit 5.

The second diagram in FIG. 6 illustrates a temporal change in the voltage value of the light-transmitting electrode 160*k* of the M-th column.

The third diagram in FIG. 6 illustrates a temporal change in the voltage value of the wiring line 110*a* of the N-th row at the point in the M-th column.

The fourth diagram in FIG. 6 illustrates a temporal change in the voltage value of the light-transmitting electrode 160*k* of the (M+2)-th column.

The fifth diagram in FIG. 6 illustrates a temporal change in the voltage value of the wiring line 110*a* of the N-th row at the point in the (M+2)-th column.

The lowermost diagram in FIG. 6 illustrates a temporal change in the output signal of the first terminal 34 of the (N+1)-th row of the row selection circuit 5.

In FIG. 6, the wiring line 110*a* of the N-th row is selected in the period T1, and the wiring line 110*a* of the (N+1)-th row is selected in the period T2.

As illustrated in FIG. 6, when the period T1 for selecting the N-th row is started at time t1, the row selection switch 5*a* of the N-th row is connected to the power supply terminal 9*a* at time t2 with a slight delay, and the voltage of the DC power supply 9 is output from the first terminal 34 of the N-th row.

From time t1 to time t2, all the light-emitting elements 150 of columns including the M-th column to the (M+2)-th column are set in a reverse bias state by the current source 7*a*. During this period, a parasitic capacitance Cc formed between the light-transmitting electrode 160*k* and the ground is pre-charged. In this example, the pre-charge period is provided before and after the switching timing of the row selection, and the period from time t3 to time t5 is also set as the pre-charge period. The pre-charge period is similarly set before time t2 and after time t6. Furthermore, the voltage between the light-transmitting electrode 160*k* of the M-th column and the ground at the time of pre-charge is Vp1, and the voltage between the light-transmitting electrode 160*k* of the (M+2)-th column and the ground is Vp2.

In this example, Vp2 having a value higher than Vp1 is applied to the parasitic capacitance Cc as a voltage at the time of pre-charging.

At time t2, when the row selection switch 5*a* of the N-th row is switched to the power supply terminal 9*a*, the light-emitting elements 150 whose anodes are connected to the N-th row pass currents set by the current sources 7*a* connected to their respective cathodes and emit light at a brightness corresponding to the current.

At time t3, when the selection of the N-th row by the row selection circuit 5 is completed, the light-emitting element 150 that has been in the forward bias state is again set in the reverse bias state, and the pre-charge of the parasitic capacitance Cc is started.

At time t4, the selection period of the (N+1)-th row is started. After the pre-charge period, at time t5, the row selection circuit 5 outputs the voltage of the DC power supply 9 from the first terminal 34 of the (N+1)-th row. As in the case of the period T1, the (N+1)-th row is selected until time t6, and the voltage of the wiring line 110*a* connected to the (N+1)-th row is increased. When the voltage of the wiring line 110*a* reaches a value corresponding to the voltage of the light-transmitting electrode 160*k* and the forward voltage drop of the light-emitting element 150, currents flow through the light-emitting elements 150 connected to the (N+1)-th row, and the light-emitting elements 150 emit light at a brightness corresponding to the current set by the current source 7*a*.

Here, a voltage drop occurs along the routing direction of the wiring line 110*a* due to a resistance generated depending on a wiring line length of the wiring line 110*a*. For that reason, the voltage drop occurs in accordance with the current value set by the current source 7*a* and the resistance depending on the wiring line length of the wiring line 110*a*. In this example, waveforms of two columns of the M-th column and the (M+2)-th column in the portion a are illustrated, and the voltage that can be applied to the anode decreases as the light-emitting element 150 is provided in a column farther away from the row selection circuit 5 and further outside the portion a.

Similarly, for the light-transmitting electrode 160*k*, a voltage drop occurs due to a resistance depending on the wiring line length along the routing direction of the light-transmitting electrode 160*k*.

In the period from time t2 to time t3, the voltage drop of the light-transmitting electrode 160*k* of the (M+2)-th column is lower than the voltage drop of the light-transmitting electrode 160*k* of the M-th column by ΔV1. In this period, the wiring line 110*a* of the N-th row at a point in the (M+2)-th column is lower than the voltage of the wiring line of the N-th row at a point in the M-th column by ΔV2. ΔV2 indicates a voltage drop that occurs as the wiring line 110*a* becomes farther from the row selection circuit.

It is also illustrated that the voltage Vp2 of the "voltage of (M+2)-th column wiring line" in FIG. 5 at the time of pre-charging is to be set sufficiently higher than the voltage drop ΔV1 due to the resistance of the light-transmitting electrode 160*k*. If the voltage drop ΔV1 can be made sufficiently low, the voltage at the time of pre-charge can also be made low, and power consumption can be suppressed.

Also in a period T2 including time t4 to time t7, each row is selected in the same manner as described above, and a voltage drop depending on the separation distance from the row selection circuit 5 occurs in the wiring lines 110*a* and the light-transmitting electrodes 160*k* of the selected row. Thus, by reducing the resistance of the wiring line 110*a* in the routing direction, it is possible to sufficiently increase the voltage that can be applied to the light-emitting element 150 in the column provided at a position away from the row selection circuit 5.

A method for manufacturing the image display device 1 of the present embodiment will now be described.

Figure 7A:
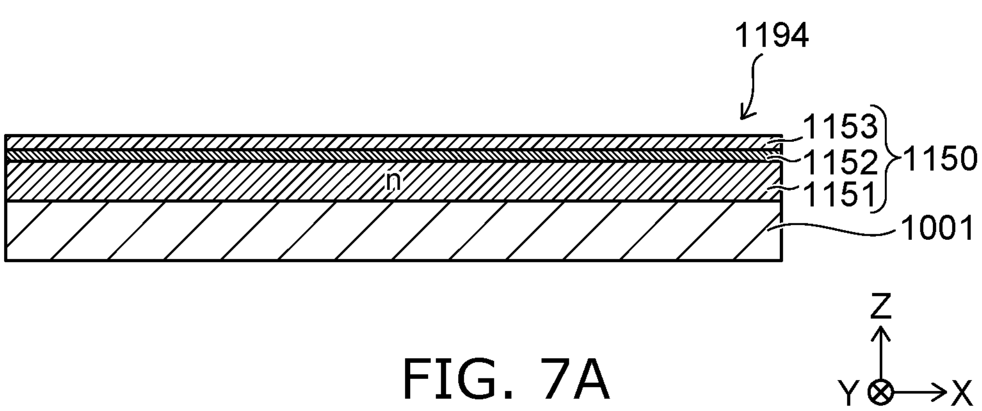
FIG. 7A is a schematic cross-sectional view illustrating a part of a method for manufacturing the image display device of the first embodiment.
Figure 7B:
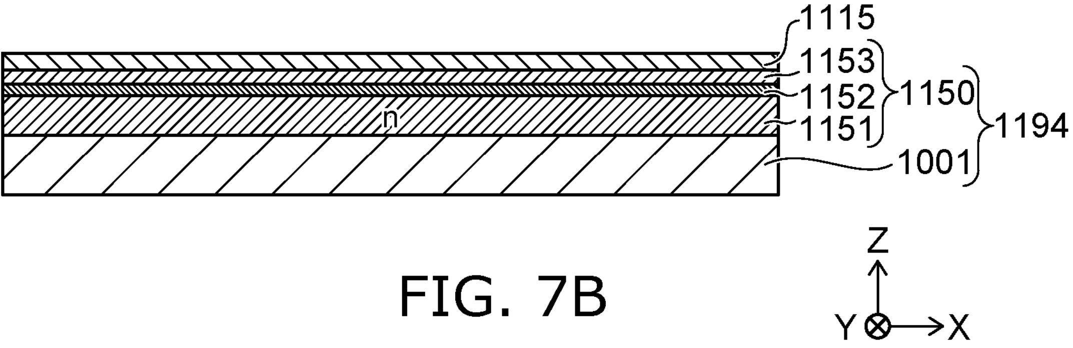
FIG. 7B is a schematic cross-sectional view illustrating a part of the method for manufacturing the image display device of the first embodiment.

FIGS. 7A to 7B are schematic cross-sectional views illustrating a part of the method for manufacturing the image display device of the present embodiment.

As illustrated in FIG. 7A, in the method for manufacturing the image display device 1 of the present embodiment, a semiconductor growth substrate (second substrate) 1194 is provided. The semiconductor growth substrate 1194 includes a crystal growth substrate 1001 and a semiconductor layer 1150. The crystal growth substrate (first substrate) 1001 is, for example, a Si substrate or a sapphire substrate. Preferably, the Si substrate is used as the crystal growth substrate 1001. Furthermore, by using a low-temperature crystal growth process such as a low-temperature sputtering method, a more inexpensive glass substrate or the like can be used as the crystal growth substrate 1001.

The semiconductor layer 1150 is formed on the crystal growth substrate 1001. The semiconductor layer 1150 includes the n-type semiconductor layer 1151, the light-emitting layer 1152, and the p-type semiconductor layer 1153. The n-type semiconductor layer 1151, the light-emitting layer 1152, and the p-type semiconductor layer 1153 are layered in this order from the crystal growth substrate 1001. The semiconductor layer 1150 includes, for example, GaN, and more specifically includes $In_XAl_YGa_{1-X-Y}N$ ($0 \le X$, $0 \le Y$, $X+Y<1$) or the like.

For formation of the semiconductor layer 1150, a chemical vapor deposition (CVD) method, for example, is used, and metal organic chemical vapor deposition (MOCVD) method is preferably used. According to the low-temperature sputtering method, the semiconductor layer 1150 can be epitaxially grown even at a process temperature of 700° C. or less. In the low-temperature sputtering method, a glass substrate and an apparatus each having low heat resistance can be used, so that the manufacturing cost can be reduced.

In this example, the n-type semiconductor layer 1151 is first formed on the crystal growth substrate 1001. In the early stage of crystal growth, a crystal defect may occur due to inconsistency of the lattice constant of the crystal, and a crystal with the crystal defect exhibits an n-type. For that reason, when the semiconductor layer 1150 is formed by first forming the n-type semiconductor layer 1151 on the crystal growth substrate 1001 as in this example, a large margin can be secured in the production process, so that there is an advantage that the yield can be easily improved.

Although not illustrated in the drawing, when the semiconductor layer 1150 is formed on the crystal growth substrate 1001, the semiconductor layer 1150 may be formed via a buffer layer. A nitride such as AlN is used for the buffer layer. By crystal growth of the semiconductor layer 1150 on the crystal growth substrate 1001 with the buffer layer interposed therebetween, mismatch at the interface between the GaN crystal and the crystal growth substrate 1001 can be mitigated. For that reason, it is expected that the quality of the semiconductor crystal of the semiconductor layer 1150 is improved. On the other hand, in the present embodiment, because the p-type semiconductor layer 1153 is joined to the first surface 103*a* illustrated in FIG. 10A to be described below, a step of removing the buffer layer is added before joining. The same applies to other embodiments described below.

As illustrated in FIG. 7B, a metal layer 1115 is formed on the p-type semiconductor layer 1153. The metal layer 1115 is formed of, for example, Al, an alloy of Al, a layered film of Al and Ti, or the like. Preferably, a metal material having high light reflectivity such as Ag is provided on a metal layer such as Al.

Figure 8A:
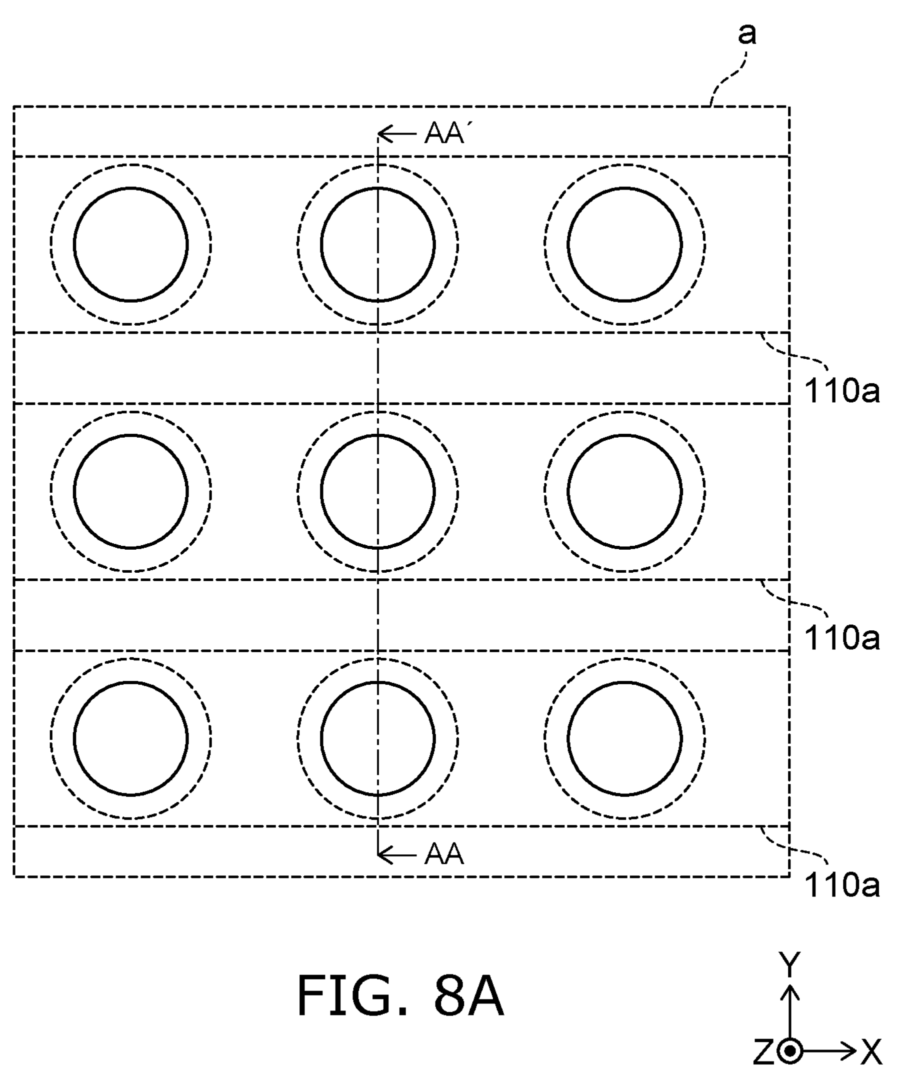
FIG. 8A is a schematic plan view illustrating a part of the method for manufacturing the image display device of the first embodiment.

FIG. 8A is a schematic plan view illustrating a part of the method for manufacturing the image display device of the present embodiment.

Figure 8B:
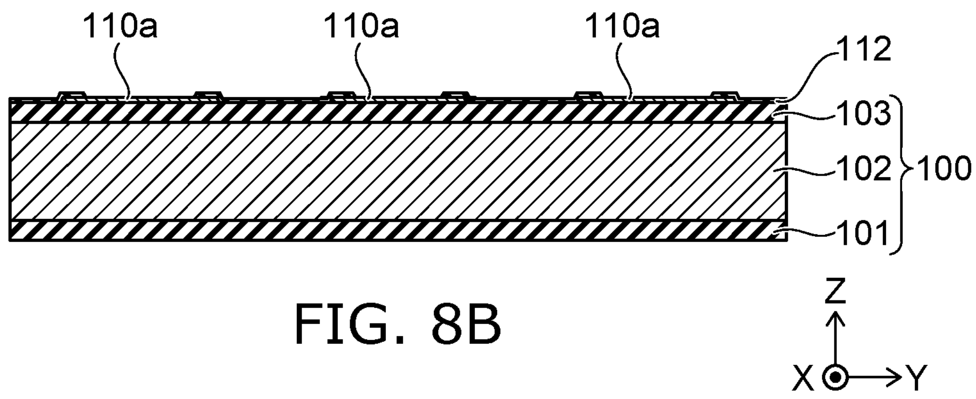
FIG. 8B is a schematic cross-sectional view illustrating a part of the method for manufacturing the image display device of the first embodiment.

FIG. 8B is a schematic cross-sectional view illustrating a part of the method for manufacturing the image display device of the present embodiment.

FIG. 8A is an enlarged plan view of the portion a of FIG. 1, and FIG. 8B is a cross-sectional view taken along line AA-AA' of FIG. 8A.

As illustrated in FIGS. 8A and 8B, a substrate (third substrate) 100 is provided. The substrate 100 includes the Si substrate 102 having oxide films 101 and 103 formed on both surfaces of the Si substrate 102. Alternatively, the substrate 100 may be an insulating substrate such as glass. The plurality of wiring lines 110*a* are formed on the first surface 103*a* so as to be substantially parallel to each other along the X-axis direction (first direction). The interval of the wiring lines 110*a* in the Y-axis direction is set to be equal to the pitch of the light-emitting elements 150. In the formation of the wiring lines 110*a*, a layered film of Ti and Al is formed by sputtering or the like, and then is formed into the plurality of wiring lines 110*a* by etching or the like. The insulating layer 112 is formed on the formed wiring lines 110*a*. The formed insulating layer 112 is removed at a portion where the light-emitting element is formed to expose the wiring line 110*a*. In this example, because the shape of the light-emitting element in the XY plan view is circular, the insulating layer 112 is removed in a circular shape.

Figure 9A:
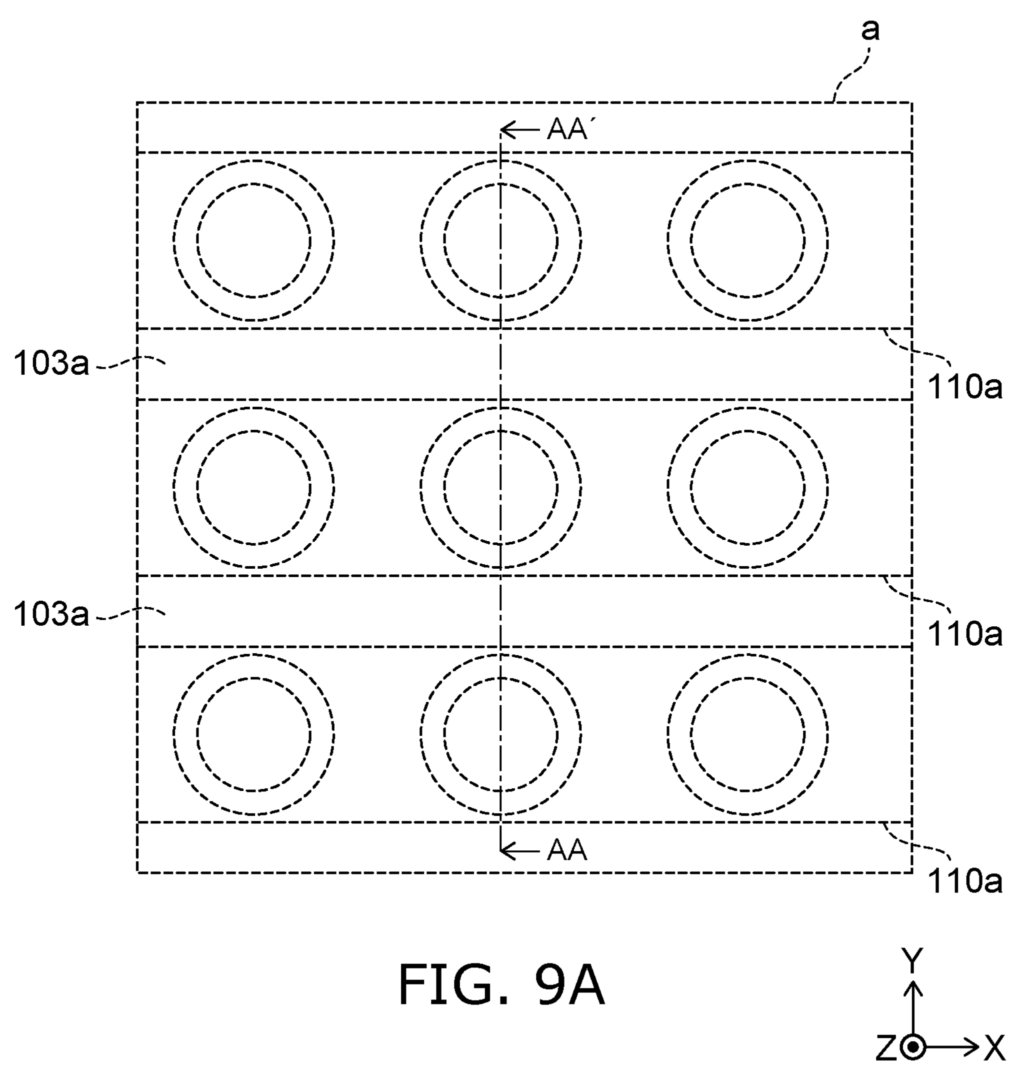
FIG. 9A is a schematic plan view illustrating a part of the method for manufacturing the image display device of the first embodiment.

FIG. 9A is a schematic plan view illustrating a part of the method for manufacturing the image display device of the present embodiment.

Figure 9B:
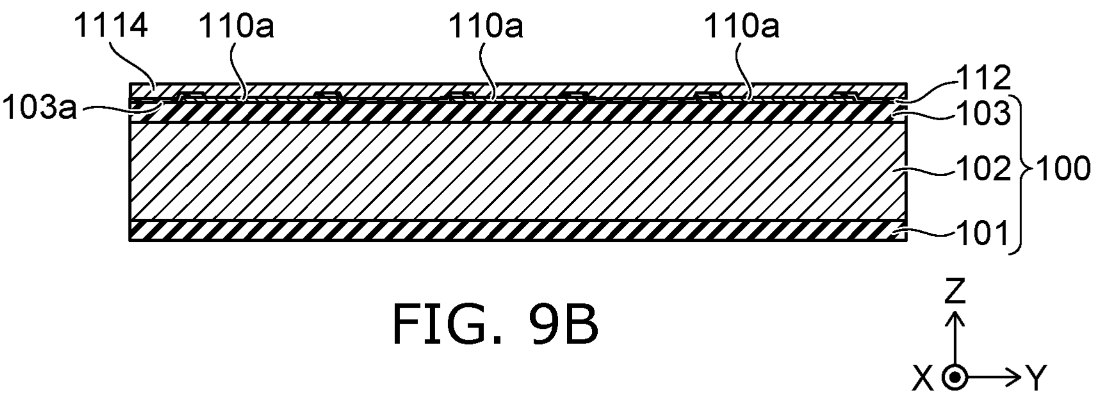
FIG. 9B is a schematic cross-sectional view illustrating a part of the method for manufacturing the image display device of the first embodiment.

FIG. 9B is a schematic cross-sectional view illustrating a part of the method for manufacturing the image display device of the present embodiment.

FIG. 9A is an enlarged plan view of the portion a of FIG. 1, and FIG. 9B is a cross-sectional view taken along line AA-AA' of FIG. 9A.

As illustrated in FIGS. 9A and 9B, a metal layer 1114 is formed on the wiring lines 110*a* and the insulating layer 112. The metal layer 1114 is, for example, a layered film of Ti, Pt, and Au and is formed by sputtering or the like. After forming the layered film of Ti, Pt, and Au, the surface of the layered film is planarized by chemical mechanical planarization (CMP) or the like.

Figure 10A:
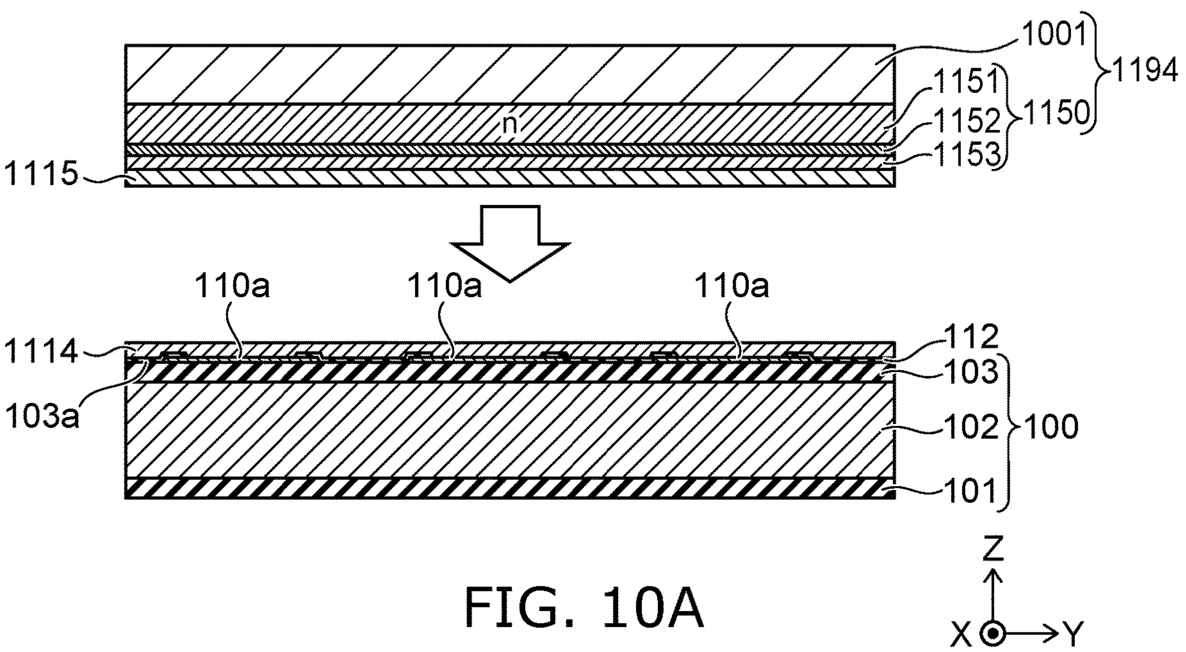
FIG. 10A is a schematic cross-sectional view illustrating a part of the method for manufacturing the image display device of the first embodiment.
Figure 10B:
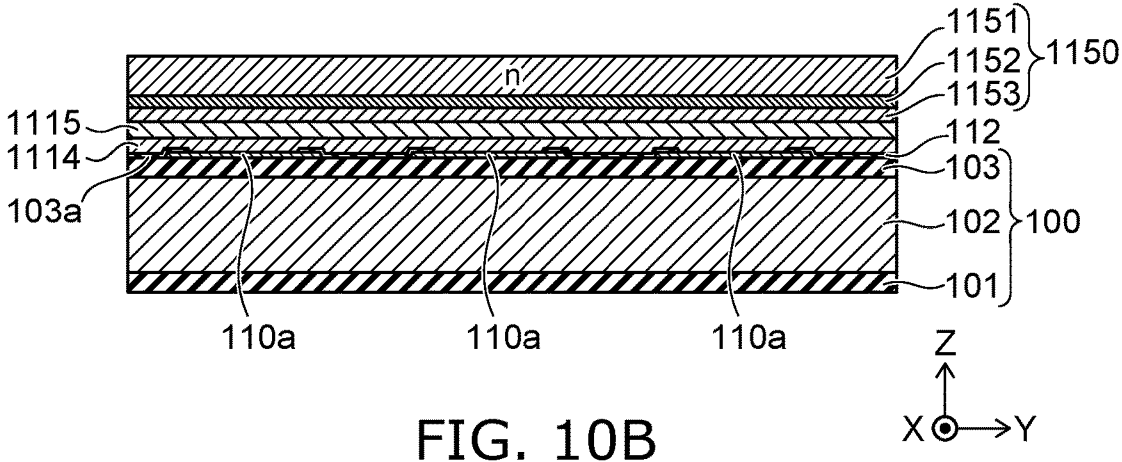
FIG. 10B is a schematic cross-sectional view illustrating a part of the method for manufacturing the image display device of the first embodiment.

FIGS. 10A and 10B are schematic cross-sectional views illustrating a part of the method for manufacturing the image display device of the present embodiment.

FIGS. 10A and 10B are cross-sectional views corresponding to the cross section taken along line AA-AA' of FIG. 9A.

As illustrated in FIG. 10A, the metal layer (second conductive layer) 1115 formed on the semiconductor growth substrate 1194 is disposed to face the metal layer (first conductive layer) 1114. By bonding the metal layers 1114 and 1115 to each other, the two substrates are joined to each other.

In the substrate joining step, the substrates are joined to each other by, for example, heating and thermocompression-bonding the substrates. Before joining, joining surfaces of the substrates may be further planarized by CMP or the like, and then the joining surfaces may be cleaned by plasma treatment in a vacuum to bring the substrates into close contact with each other.

As illustrated in FIG. 10B, after the two substrates are joined together, the crystal growth substrate 1001 is removed by wet etching, laser lift-off, or the like.

The purpose of the metal layer 1114 is to provide a planarized surface for wafer bonding by providing the metal layer 1114 on the first surface 103*a*, the wiring lines 110*a* and the insulating layer 112. On the other hand, the formation of the metal layer 1115 can be omitted. By omitting the step of forming the metal layer 1115, the number of steps can be reduced.

Figure 11A:
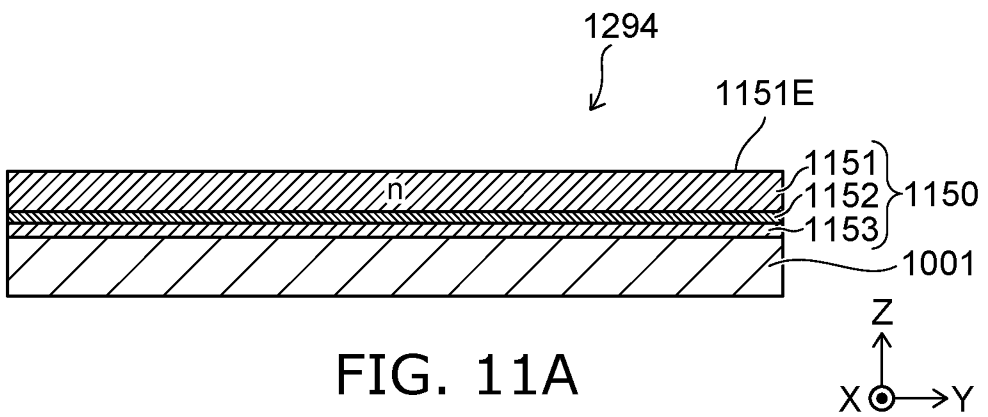
FIG. 11A is a schematic cross-sectional view illustrating a part of the method for manufacturing the image display device of the first embodiment.
Figure 11B:
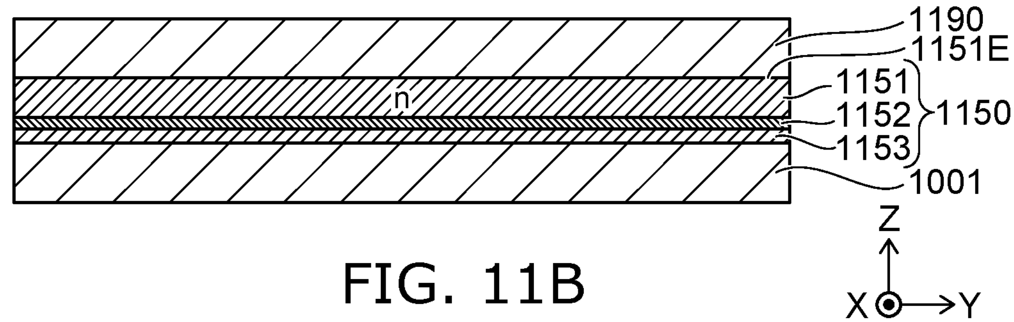
FIG. 11B is a schematic cross-sectional view illustrating a part of the method for manufacturing the image display device of the first embodiment.
Figure 11C:
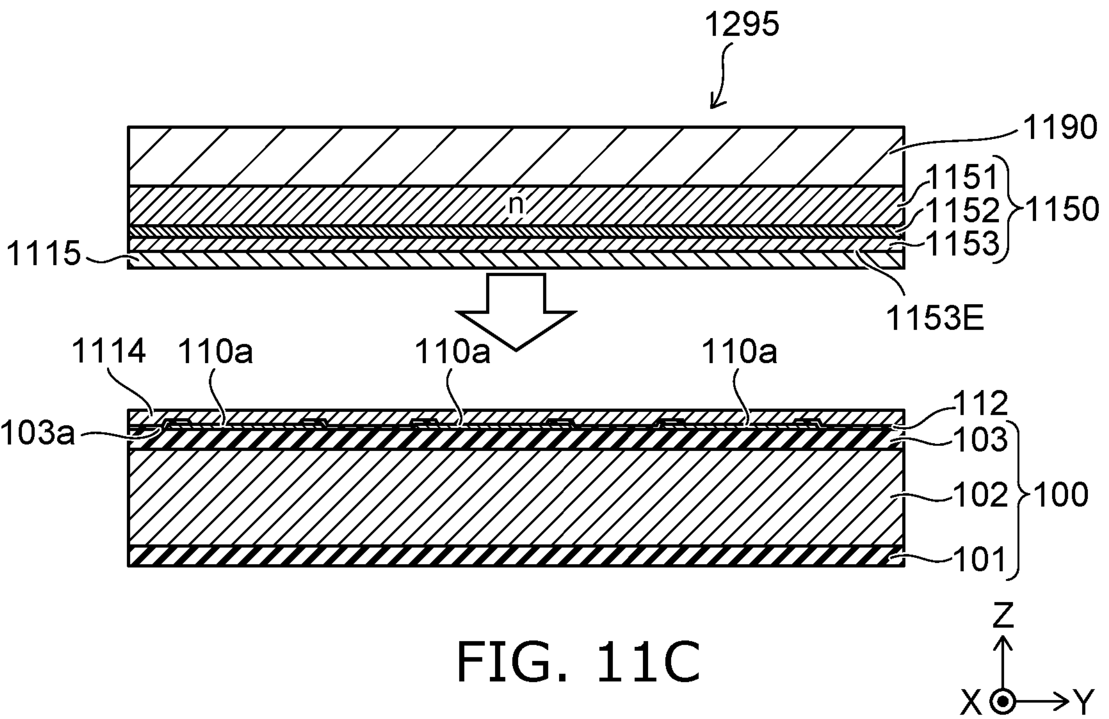
FIG. 11C is a schematic cross-sectional view illustrating a part of the method for manufacturing the image display device of the first embodiment.

FIGS. 11A to 11C are schematic cross-sectional views illustrating a part of the method for manufacturing the image display device of the present embodiment.

FIG. 11C is a cross-sectional view corresponding to the cross section taken along line AA-AA' in FIG. 9A.

FIGS. 11A to 11C illustrate an example of a case in which the semiconductor layer 1150 is formed by first forming the p-type semiconductor layer 1153 on the crystal growth substrate 1001. Instead of the above-described steps illustrated in FIGS. 7A and 7B, steps illustrated in FIGS. 11A to 11C can be applied.

As illustrated in FIG. 11A, a semiconductor growth substrate 1294 is provided. The semiconductor growth substrate 1294 includes the crystal growth substrate 1001 and the semiconductor layer 1150. The semiconductor layer 1150 is formed on the crystal growth substrate 1001. In the semiconductor layer 1150, the p-type semiconductor layer 1153, the light-emitting layer 1152, and the n-type semiconductor layer 1151 are layered in this order from the crystal growth substrate 1001.

As illustrated in FIG. 11B, the support substrate 1190 is bonded to an exposed surface 1151E of the n-type semiconductor layer 1151 illustrated in FIG. 11A. The support substrate 1190 is formed of, for example, quartz glass or Si. Thereafter, the crystal growth substrate 1001 is removed by wet etching or laser lift-off.

As illustrated in FIG. 11C, in a substrate 1295, the metal layer 1115 is formed on an exposed surface 1153E of the p-type semiconductor layer 1153. The semiconductor layer 1150 is joined to the substrate 100 via the metal layers 1115 and 1114. To be specific, the exposed surface 1153E of the p-type semiconductor layer 1153 exposed by removing the crystal growth substrate 1001 is disposed to face the metal layer 1114 via the metal layer 1115, and the p-type semiconductor layer 1153 is bonded to the metal layer 1114 via the metal layer 1115. As in the other embodiments described above, the p-type semiconductor layer 1153 may be directly bonded to the metal layer 1114 without forming the metal layer 1115 on the exposed surface 1153E.

The steps up to the formation of the semiconductor growth substrate 1294 and the step of performing a treatment after the formation of the substrate 1295 may be performed in the same plant or in different plants. For example, the substrate 1295 may be manufactured in a first plant, and the substrate 1295 may be carried into a second plant different from the first plant to perform the joining step.

The method for joining the semiconductor layer 1150 to the substrate 100 is not limited to the above-described method, and the following method may be employed. That is, after the semiconductor layer 1150 is formed on the crystal growth substrate 1001, the semiconductor layer 1150 is housed in a container and, for example, is stored after being attached with the support substrate 1190 in the container. After the storage, the semiconductor layer 1150 is taken out from the container and joined to the substrate 100 on which the metal layer 1114 is formed. The semiconductor layer 1150 is stored in a container without being mounted on the support substrate 1190. After the storage, the semiconductor layer 1150 is taken out from the container and directly joined to the substrate 100 on which the metal layer 1114 is formed.

Joining the semiconductor layer 1150 to the substrate 100 includes joining one semiconductor layer 1150 to one substrate 100 and joining a plurality of semiconductor layers 1150 to one substrate 100. When the one semiconductor layer 1150 is joined to the one substrate 100, the size of the substrate 100 can be, for example, a rectangular shape or a square shape with a range from several 10 mm square to about 150 mm square. In this case, the semiconductor layer 1150 formed on the substrate 1295 can have a size depending on the size of the substrate 100.

When the plurality of semiconductor layers 1150 are joined to one substrate 100, the substrate 100 can be, for example, a substantially rectangular glass substrate having a size of 1500 mm×1800 mm. Each of the semiconductor layers 1150 formed on the substrates 1295 has a rectangular or square shape with a range from several 10 mm square to 150 mm square and may have a size of, for example, a range from about 4 inches to 6 inches in terms of wafer size. The size of the substrate 100 is appropriately selected depending on the size or the like of the image display device.

Figure 12:
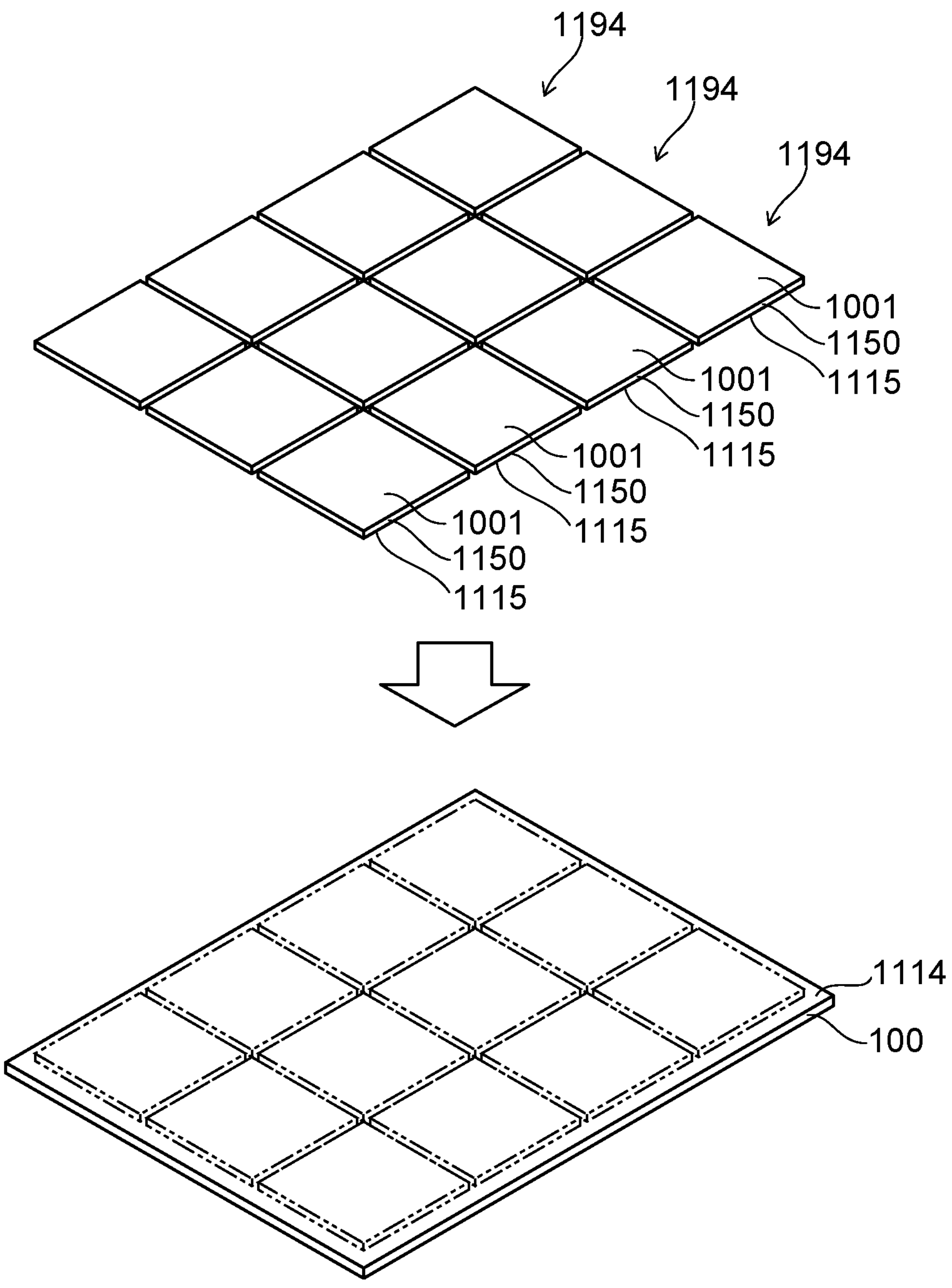
FIG. 12 is a schematic perspective view illustrating a part of the method for manufacturing the image display device of the first embodiment.

FIG. 12 is a perspective view illustrating a manufacturing method of the image display device of the present embodiment.

FIG. 12 schematically illustrates an example in which the plurality of semiconductor layers 1150 are joined to one substrate 100.

The drawing above an arrow in FIG. 12 illustrates that a plurality of semiconductor growth substrates 1194 are disposed in a lattice pattern. The drawing below the arrow in FIG. 12 illustrates that the substrate 100 is disposed on which the metal layer 1114 is formed. FIG. 12 shows by an arrow that a plurality of semiconductor growth substrates 1194 arranged in a lattice pattern are bonded to the substrate 100 at the position of the two-dot chain lines.

Because the quality of the semiconductor crystal decreases at the end portion of the semiconductor layer 1150 and in the vicinity thereof, it is necessary to take care that the light-emitting element 150 is not formed at the end portion of the semiconductor layer 1150 and in the vicinity thereof.

As illustrated in FIG. 12, the end portion of the semiconductor layer 1150 is formed so as to substantially coincide with the end portion of the crystal growth substrate 1001. For that reason, the plurality of semiconductor growth substrates 1194 face the substrate 100 in a lattice pattern as illustrated by the solid lines in FIG. 12, for example, so as not to create a gap between the adjacent semiconductor growth substrates 1194 as much as possible. As indicated by the two-dot chain lines in FIG. 12, the semiconductor layers 1150 are joined onto the metal layer 1114 of the substrate 100.

In a case in which the plurality of semiconductor layers 1150 are joined to one substrate 100, the substrate 100 to which the plurality of semiconductor layers 1150 are joined is divided in a subsequent step, so that image display devices having the number and size depending on the number of divisions can be obtained. Because it is preferable that the end portion of the semiconductor layer 1150 in which the quality of the semiconductor crystal is deteriorated becomes the end portion of the display region, the division unit is preferably set so as to coincide with the shape of the semiconductor growth substrate 1194.

Figure 13A:
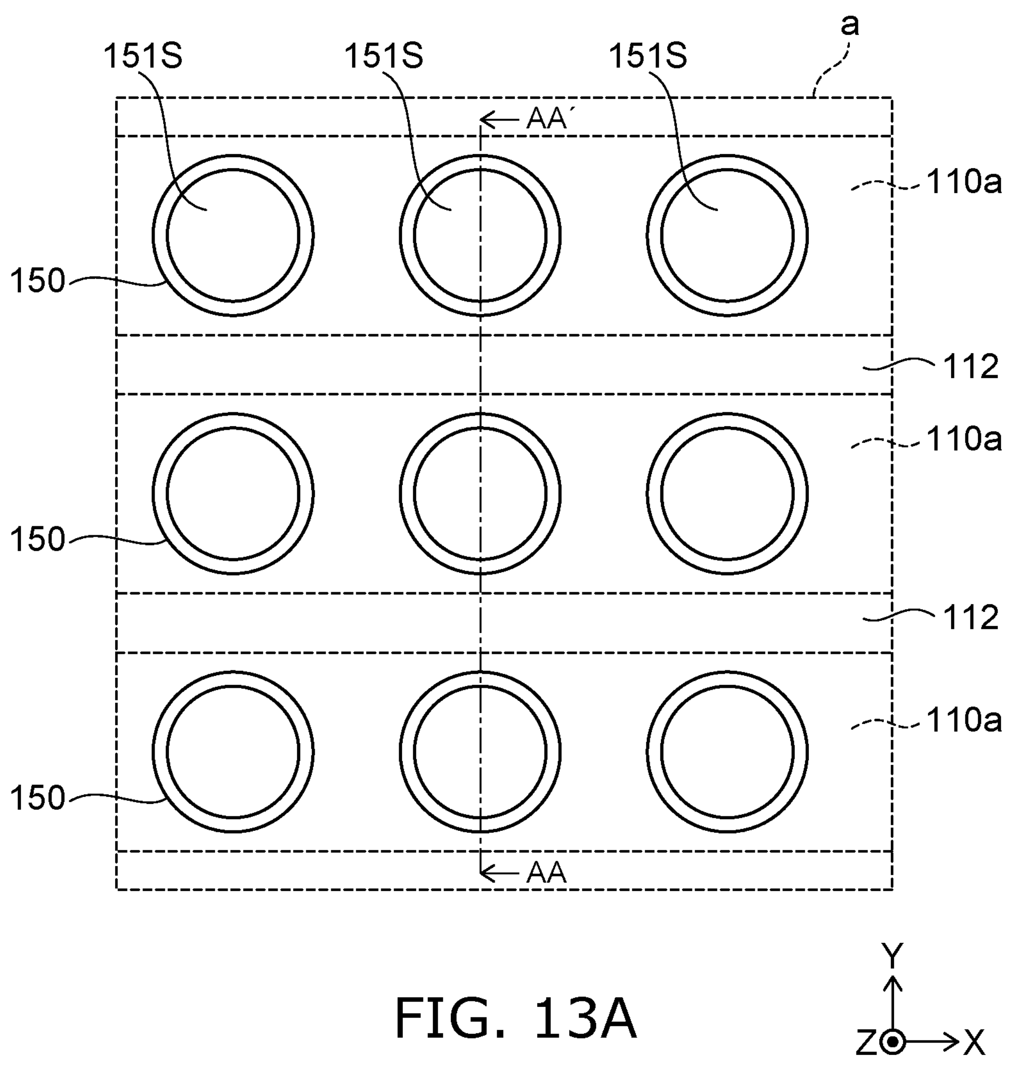
FIG. 13A is a schematic plan view illustrating a part of the method for manufacturing the image display device of the first embodiment.

FIG. 13A is a schematic plan view illustrating a part of the method for manufacturing the image display device of the present embodiment.

Figure 13B:
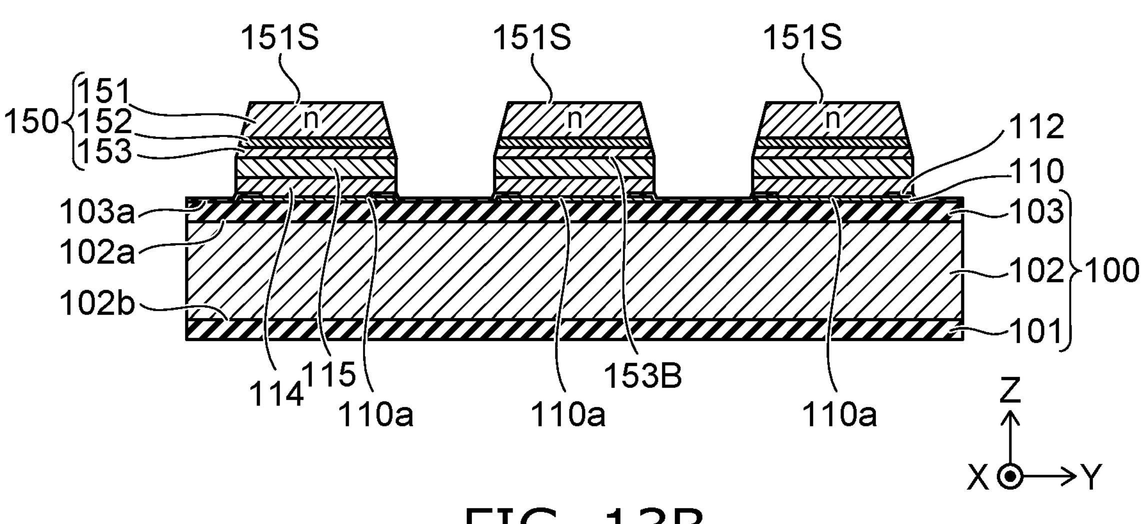
FIG. 13B is a schematic cross-sectional view illustrating a part of the method for manufacturing the image display device of the first embodiment.

FIG. 13B is a schematic cross-sectional view illustrating a part of the method for manufacturing the image display device of the present embodiment.

FIG. 13A is an enlarged plan view of the portion a of FIG. 1, and FIG. 13B is a cross-sectional view taken along line AA-AA' of FIG. 13A.

As illustrated in FIGS. 13A and 13B, the semiconductor layer 1150 illustrated in FIG. 10B is etched to be form into the light-emitting elements 150. In this example, the light-emitting element 150 is processed into a truncated cone shape. By forming the light-emitting element 150 in a truncated cone shape, the insulating film 156 can be sufficiently brought into close contact with the lateral surface of the light-emitting element 150 when the insulating film 156 is formed on the light-emitting element 150 as illustrated in FIGS. 14A and 14B to be described below.

In order to form the light-emitting element 150 into a truncated cone shape, for example, a higher etching rate is selected closer to the light-emitting surface 151S. The etching rate is set to increase substantially linearly from the bottom surface 153B toward the light-emitting surface 151S. To be more specific, for example, the resist mask pattern at the time of dry etching is devised at the time of exposure so that the resist mask pattern becomes gradually thinner toward its end portion. With this configuration, the resist gradually recedes from a thin portion during dry etching, and the amount of etching can be increased from the bottom surface 153B toward the light-emitting surface 151S. In this manner, the light-emitting element 150 having a truncated cone shape can be formed.

The metal layer 1115 illustrated in FIG. 10B is etched to be processed into the bonding metal 115. The metal layer 1114 illustrated in FIG. 10B is etched to be processed into the bonding metal 114. Preferably, the metal layers 1114 and 1115 are continuously etched by using the same mask, so that the bonding metals 114 and 115 having the same outer circumferential shape in the XY plan view are formed.

Figure 14A:
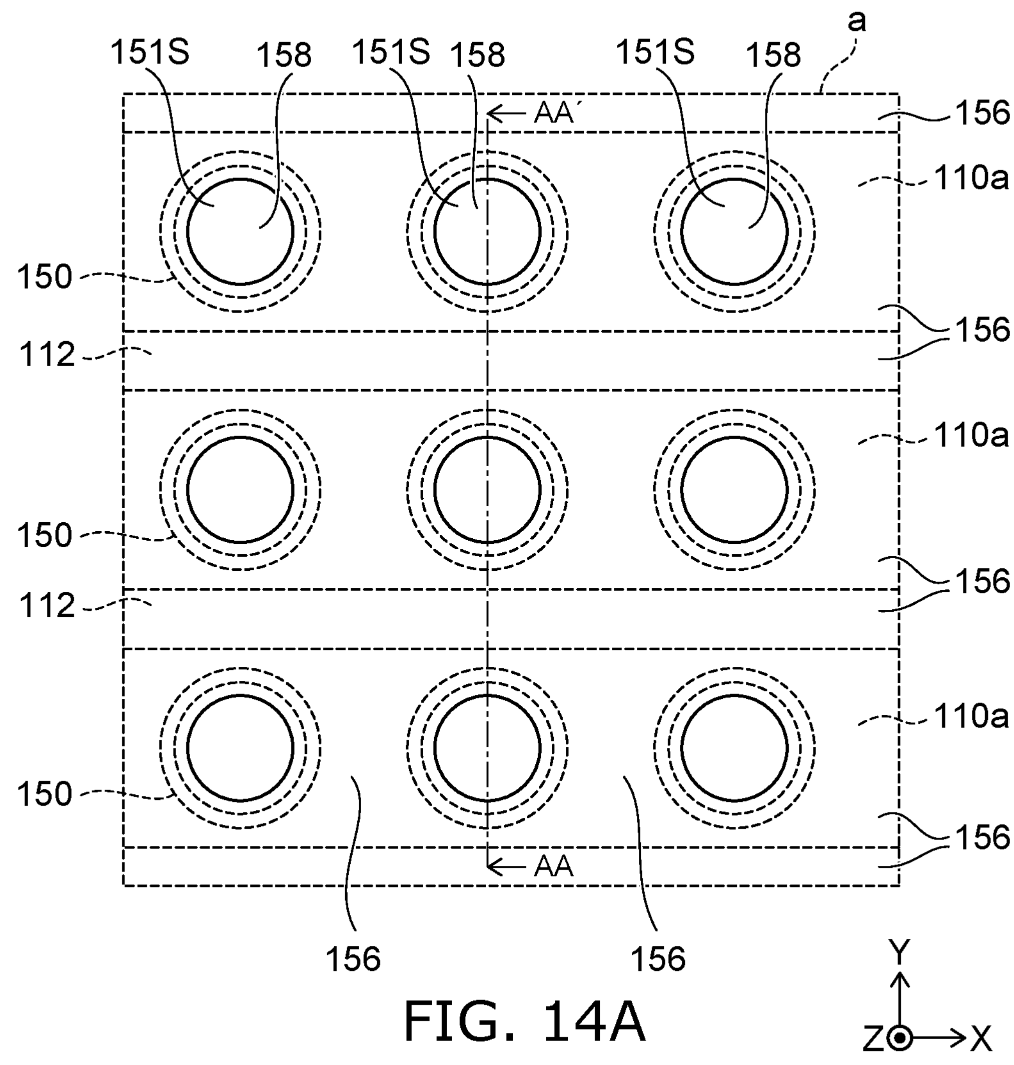
FIG. 14A is a schematic plan view illustrating a part of the method for manufacturing the image display device of the first embodiment.
Figure 14B:
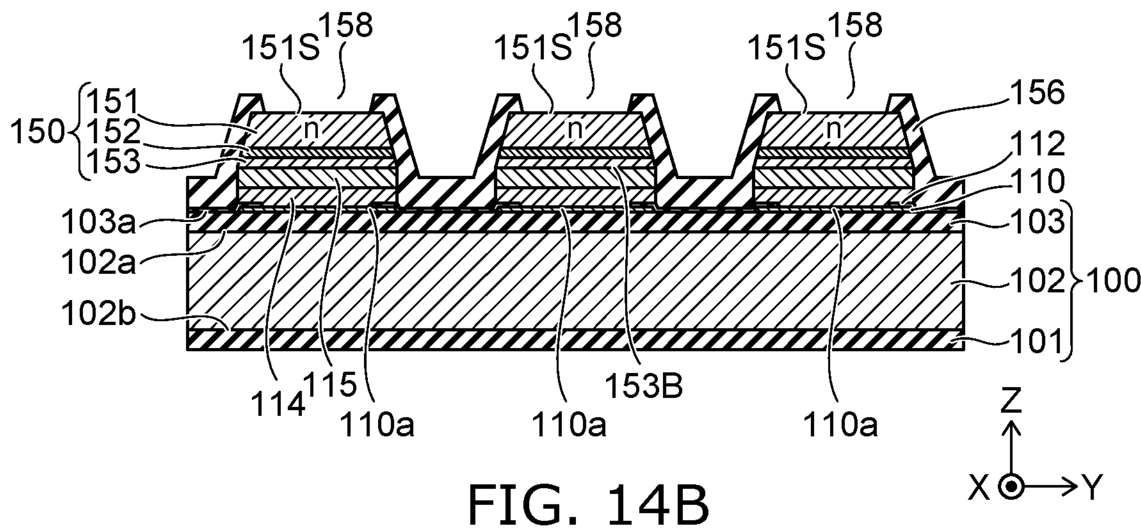
FIG. 14B is a schematic cross-sectional view illustrating a part of the method for manufacturing the image display device of the first embodiment.

FIG. 14A is a schematic plan view illustrating a part of the method for manufacturing the image display device of the present embodiment.

FIG. 14B is a schematic cross-sectional view illustrating a part of the method for manufacturing the image display device of the present embodiment.

FIG. 14A is an enlarged plan view of the portion a of FIG. 1, and FIG. 14B is a cross-sectional view taken along line AA-AA' of FIG. 14A.

As illustrated in FIGS. 14A and 14B, the insulating film 156 is formed on the insulating layer 112 and the light-emitting elements 150 so as to cover the insulating layer 112 and the light-emitting elements 150. When the insulating film 156 is formed of $SiO_2$ or the like, it is formed by, for example, CVD, sputtering or the like. A portion of the insulating film 156 is removed to expose the light-emitting surface 151S. In this example, the opening 158 through which the light-emitting surface 151S is exposed has a circular shape in the XY plan view.

Figure 15A:
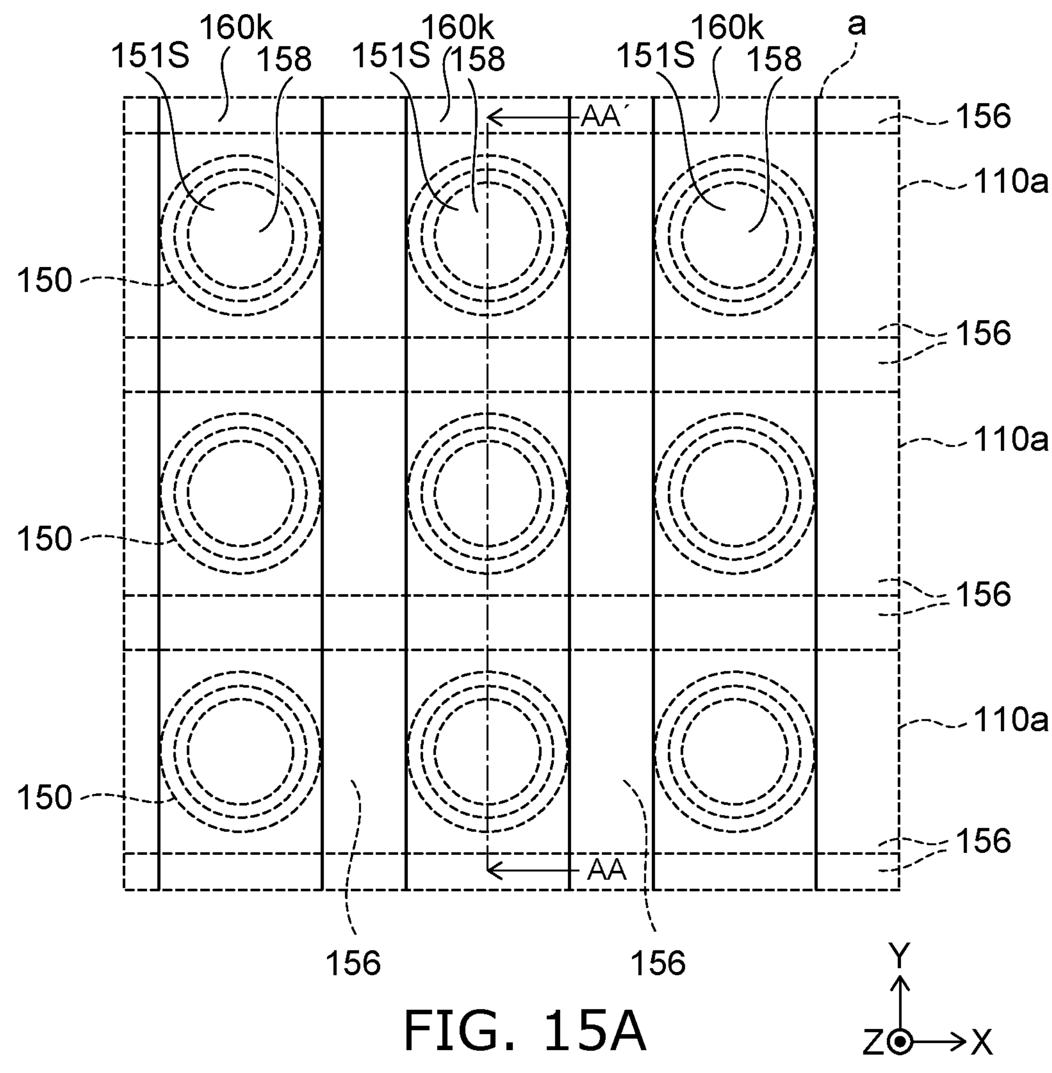
FIG. 15A is a schematic plan view illustrating a part of the method for manufacturing the image display device of the first embodiment.

FIG. 15A is a schematic plan view illustrating a part of the method for manufacturing the image display device of the present embodiment.

Figure 15B:
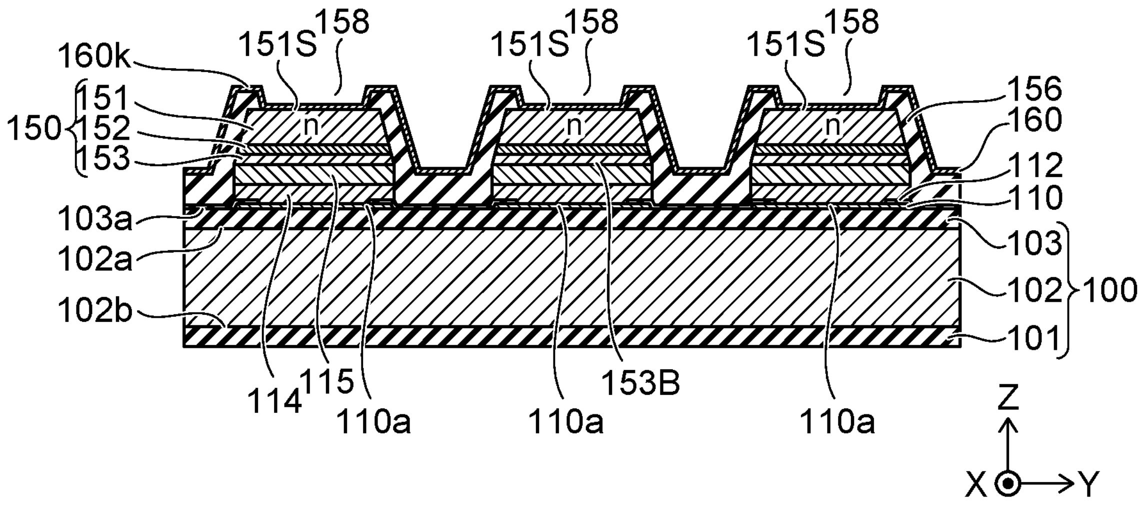
FIG. 15B is a schematic cross-sectional view illustrating a part of the method for manufacturing the image display device of the first embodiment.

FIG. 15B is a schematic cross-sectional view illustrating a part of the method for manufacturing the image display device of the present embodiment.

FIG. 15A is an enlarged plan view of the portion a of FIG. 1, and FIG. 15B is a cross-sectional view taken along line AA-AA' of FIG. 15A.

As illustrated in FIGS. 15A and 15B, the light-transmitting electrodes 160*k* are formed along the Y-axis direction (second direction) over the insulating film 156 and the light-emitting surfaces 151S. To be more specific, for example, a light-transmitting conductive film such as ITO or ZnO is formed so as to cover the insulating film 156 and the light-emitting surfaces 151S. A mask is formed on the conductive film, and the light-transmitting electrode 160*k* is formed so as to connect the light-emitting surfaces 151S of the light-emitting elements 150 arranged along the Y-axis direction to each other. Before forming the light-transmitting electrode 160*k*, the surface of the opening 158 through which the light-emitting surface 151S is exposed may be roughened to improve light extraction from the light-emitting element 150.

FIGS. 16A, 16B, 17A, and 17B are schematic cross-sectional views illustrating a part of the method for manufacturing the image display device of the present embodiment.

Figure 16A:
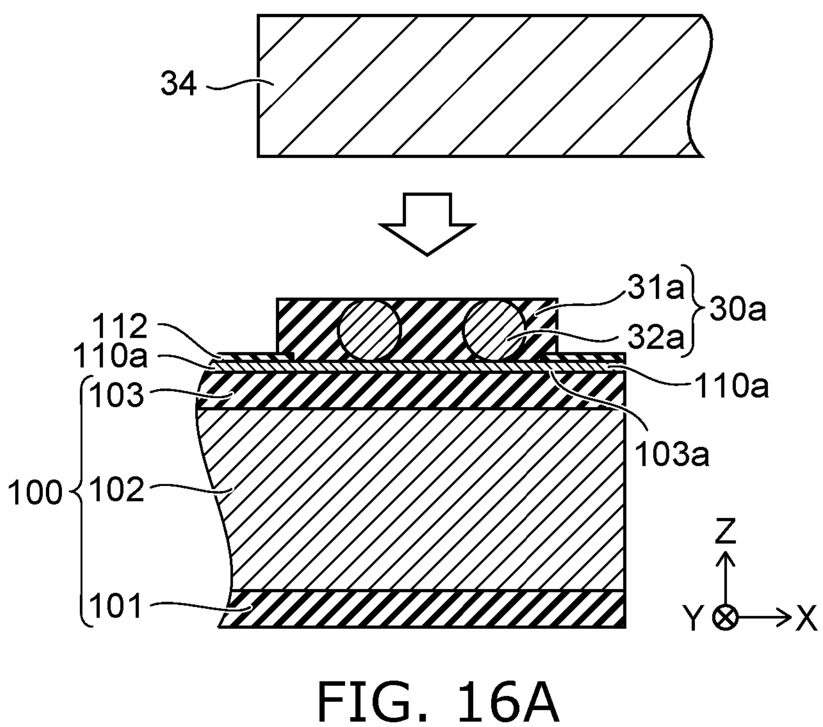
FIG. 16A is a schematic cross-sectional view illustrating a part of the method for manufacturing the image display device of the first embodiment.
Figure 16B:
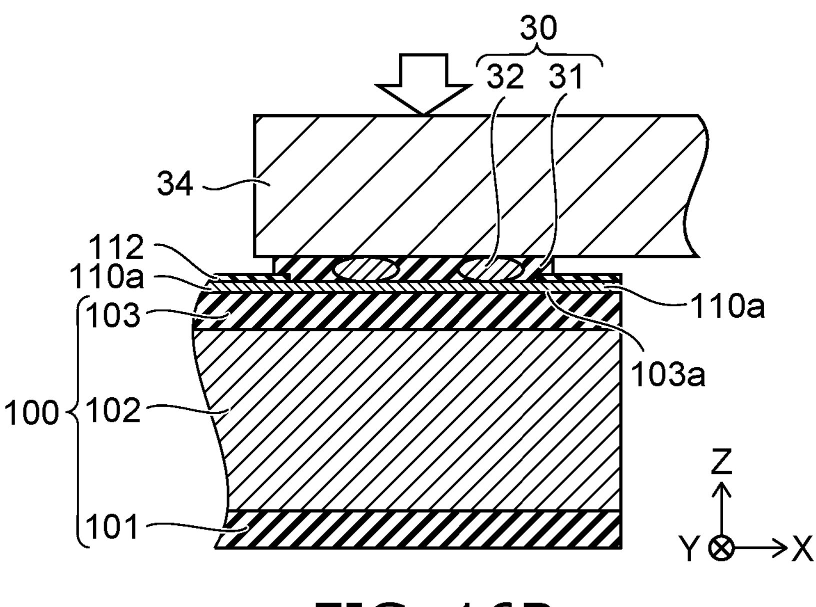
FIG. 16B is a schematic cross-sectional view illustrating a part of the method for manufacturing the image display device of the first embodiment.

FIGS. 16A and 16B are cross-sectional views taken along line B-B' of the portion b of FIG. 2 and illustrate a step of electrically connecting the wiring line 110*a* and the first terminal 34.

Figure 17A:
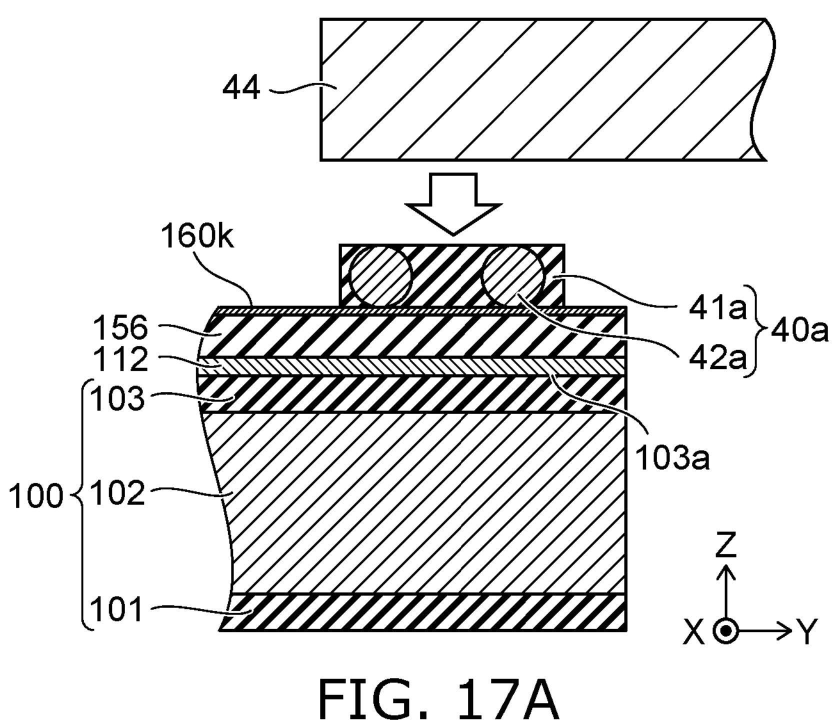
FIG. 17A is a schematic cross-sectional view illustrating a part of the method for manufacturing the image display device of the first embodiment.
Figure 17B:
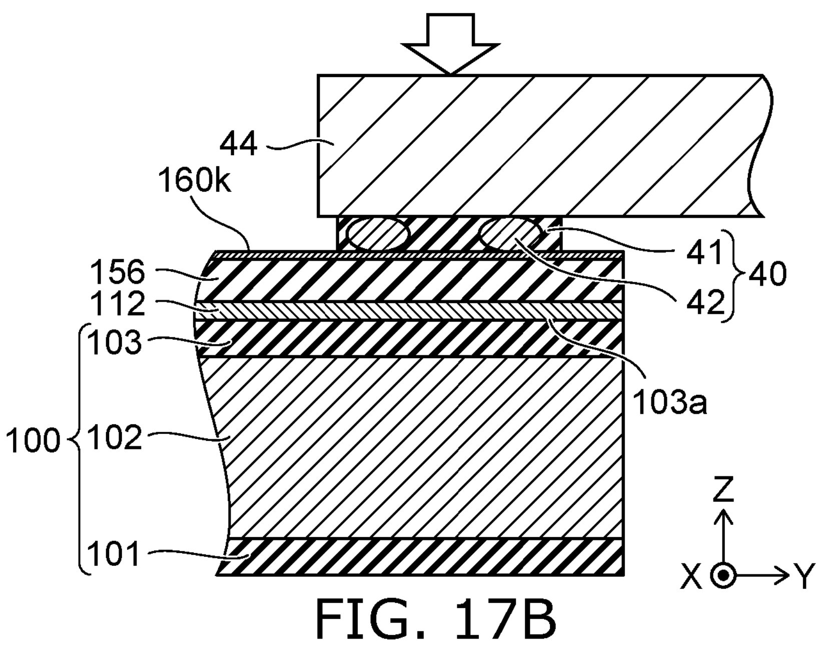
FIG. 17B is a schematic cross-sectional view illustrating a part of the method for manufacturing the image display device of the first embodiment.

FIGS. 17A and 17B are cross-sectional views taken along line C-C' of the portion c of FIG. 2 and illustrate a step of electrically connecting the light-transmitting electrode 160*k* and the second terminal 44.

The first terminal 34 is an end portion of an output wiring line of the row selection circuit 5, and the second terminal 44 is an end portion of an output wiring line of the current drive circuit 7.

As illustrated in FIG. 16A, the wiring line 110*a* is covered with the insulating layer 112, and a portion of the insulating layer 112 is removed to expose the wiring line 110*a*. A region where the wiring line 110*a* is exposed is the connection region 36 illustrated in FIG. 2.

The anisotropic conductive member 30*a* is formed in a region including the connection region 36 illustrated in FIG. 2. In the step of forming the anisotropic conductive member 30*a*, the anisotropic conductive member 30*a* is applied to a region including the connection region 36 or attached to the region including the connection region 36. For example, the region in which the anisotropic conductive member 30*a* is formed is a region continuously including the connection regions 36 aligned in the Y-axis direction in FIG. 2. That is, the anisotropic conductive member 30*a* is also provided in a region between the adjacent connection regions 36.

The first terminal 34 faces the wiring line 110*a* in the connection region 36 via the anisotropic conductive member 30*a* and is placed on the anisotropic conductive member 30*a* as indicated by an arrow in FIG. 16A. The anisotropic conductive member 30*a* includes a binder 31*a* and anisotropic conductive particles 32*a*. The binder 31*a* and the anisotropic conductive particles 32*a* are in an initial state because they are not pressurized and heated. In the initial state, the binder 31*a* is in a state of having fluidity and viscosity and is in a state of not exhibiting adhesive force. The anisotropic conductive particles 32*a* are not conductive in any direction in the initial state.

As illustrated in FIG. 16B, a pressure is applied between the first terminal 34 and the substrate 100. The direction of the applied pressure is a direction along the Z-axis as indicated by an arrow in FIG. 16B. The first terminal 34, the substrate 100, and the anisotropic conductive member 30 are heated to a predetermined temperature while a pressure is applied in the direction of the arrow. In the anisotropic conductive member 30, the anisotropic conductive particles 32 compressed in the pressure application direction form a conductive path in the pressure application direction. The binder 31 cured by heating fixes the wiring line 110*a* and the first terminal 34 in an electrically connected state.

As illustrated in FIG. 17A, the light-transmitting electrode 160*k* is formed on the insulating film 156. The anisotropic conductive member 40*a* is formed on the light-transmitting electrode 160*k*. The region where the anisotropic conductive member 40*a* is formed is a region including the connection region 46 illustrated in FIG. 2. To be more specific, the region in which the anisotropic conductive member 40*a* is formed is a region continuously including the connection regions 46 aligned in the X-axis direction in FIG. 2. That is, the anisotropic conductive member 40*a* is also provided in the connection region 46 and the region between the adjacent connection regions 46. In the step of forming the anisotropic conductive member 40*a*, the anisotropic conductive member 40*a* is applied to a region including the connection region 46 or attached to the region including the connection region 46.

The second terminal 44 faces the light-transmitting electrode 160*k* in the connection region 46 illustrated in FIG. 2 via the anisotropic conductive members 40*a* and is placed on the anisotropic conductive member 40*a* as illustrated by an arrow in FIG. 17A. The anisotropic conductive member 40*a* includes a binder 41*a* and anisotropic conductive particles 42*a*. The binder 41*a* and the anisotropic conductive particles 42*a* are in an initial state because they are not pressurized and heated. In the initial state, the binder 41*a* is in a state of having fluidity and viscosity and is in a state of not exhibiting adhesive force. The anisotropic conductive particles 42*a* are not conductive in any direction in the initial state.

As illustrated in FIG. 17B, a pressure is applied between the second terminal 44 and the substrate 100. The direction of the applied pressure is a direction along the Z-axis as indicated by an arrow in FIG. 17B. The second terminal 44, the substrate 100, and the anisotropic conductive member 40*a* illustrated in FIG. 17A are heated to a predetermined temperature while being pressurized. In the anisotropic conductive member 40 illustrated in FIG. 17B, the anisotropic conductive particles 42 compressed in the pressure application direction form a conductive path in the pressure application direction. The binder 41 cured by heating fixes the light-transmitting electrode 160*k* and the second terminal 44 in an electrically connected state.

The step of electrically connecting the wiring line 110*a* and the first terminal 34 may be performed simultaneously with the step of electrically connecting the light-transmitting electrode 160*k* and the second terminal 44, or they may be performed sequentially.

Figure 18:
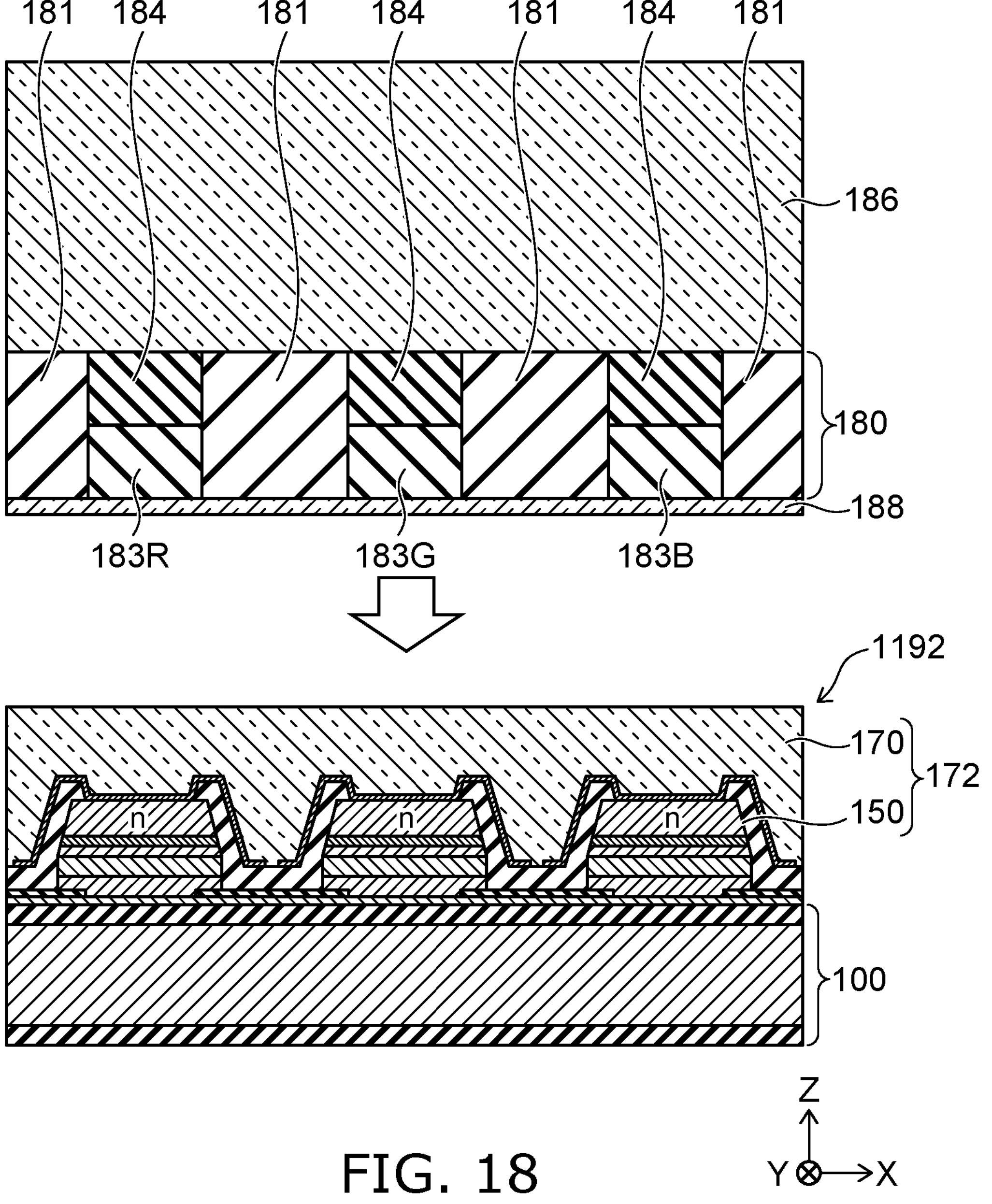
FIG. 18 is a schematic cross-sectional view illustrating a part of the method for manufacturing the image display device of the first embodiment.

FIG. 18 is a schematic cross-sectional view illustrating a part of the method for manufacturing the image display device of the present embodiment.

In the description related to FIG. 18, a structure including the wiring line 110*a*, the insulating layer 112, the light-emitting element 150, the insulating film 156, the light-transmitting electrode 160*k*, and the surface resin layer 170 is referred to as a light-emitting circuit portion 172. In the description related to FIGS. 19A to 19D, a structure including the substrate 100 and the light-emitting circuit portion 172 is referred to as a structure 1192.

As illustrated in FIG. 18, the color filter (wavelength conversion member) 180 is formed on the structure 1192 on which the plurality of light-emitting elements 150 are formed. One surface of the color filter 180 is adhered to the structure 1192. The other surface of the color filter 180 is adhered to the glass substrate 186. The one surface of the color filter 180 is provided with the transparent thin film adhesive layer 188 and is adhered to the exposed surface of the surface resin layer 170 of the structure 1192 with the transparent thin film adhesive layer 188 interposed therebetween.

In the color filter 180, in this example, color conversion portions are arranged in a positive direction of the X-axis in the order of red, green, and blue. A color conversion layer 183R of a red color is provided in a first layer for red, a color conversion layer 183G of a green color is provided in the first layer for green, and the filter layer 184 is provided in a second layer for both. For blue, a single layer of a color conversion layer 183B may be provided, or the filter layer 184 may be provided. While the light-blocking portion 181 is provided between color conversion portions, the frequency characteristics of the filter layer 184, needless to say, can be changed for each color of the color conversion portion.

The color filter 180 is adhered to the structure 1192 with each of the positions of the color conversion layers 183R, 183G, and 183B of respective colors aligned to the position of the corresponding one of light-emitting elements 150.

FIGS. 19A to 19D are schematic cross-sectional views illustrating a variation of the manufacturing method of the image display device of the present embodiment.

FIGS. 19A to 19D illustrate a method of forming a color filter by an ink jet method.

Figures 19A, 19B, 19C, 19D:
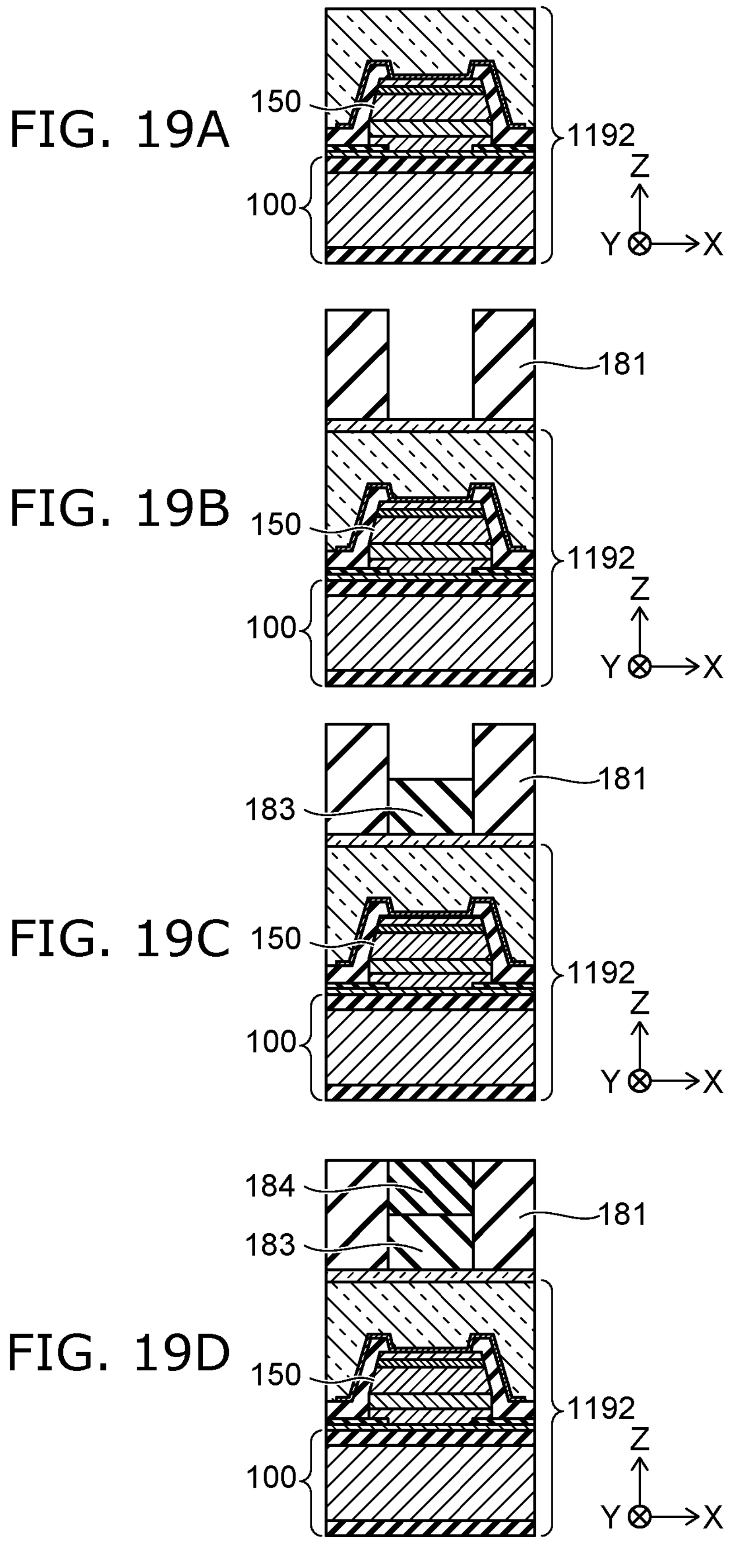
FIG. 19A is a schematic cross-sectional view illustrating a part of the method for manufacturing the image display device of the first embodiment.
FIG. 19B is a schematic cross-sectional view illustrating a part of the method for manufacturing the image display device of the first embodiment.
FIG. 19C is a schematic cross-sectional view illustrating a part of the method for manufacturing the image display device of the first embodiment.
FIG. 19D is a schematic cross-sectional view illustrating a part of the method for manufacturing the image display device of the first embodiment.

As illustrated in FIG. 19A, the structure 1192 in which components such as a light-emitting element 150 are formed on the substrate 100 is provided.

As illustrated in FIG. 19B, the light-blocking portion 181 is formed on the structure 1192. The light-blocking portion 181 is formed by using, for example, screen printing or a photolithography technique.

As illustrated in FIG. 19C, a phosphor depending on the light emission color is ejected from an ink-jet nozzle to form the color conversion layer 183. The phosphor colors the region where the light-blocking portion 181 is not formed. As the phosphor, for example, a fluorescent coating that uses a typical phosphor material, a perovskite phosphor material, or a quantum dot phosphor material is used. Use of a perovskite phosphor material or a quantum dot phosphor material makes it possible to achieve each light emission color, high monochromaticity, and high color reproducibility and is thus preferred. After the drawing by the ink-jet nozzle, drying is performed at an appropriate temperature and for an appropriate time. A thickness of the coating film at the time of coloring is set thinner than a thickness of the light-blocking portion 181.

As already described, in a case in which the color conversion portion is not to be formed for a blue light-emitting sub-pixel, the color conversion layer 183 is not formed. Furthermore, for a blue light-emitting sub-pixel, in a case in which the color conversion portion need only be a single layer when the blue color conversion layer is formed, a thickness of the coating film of the blue phosphor is preferably about the same as the thickness of the light-blocking portion 181.

As illustrated in FIG. 19D, the coating for the filter layer 184 is ejected from the ink-jet nozzle. The coating is applied so as to overlap the coating film of the phosphor. The total thickness of the coating film of the phosphor and the coating is about the same as the thickness of the light-blocking portion 181.

Regardless of whether the color filter is a film type color filter or an ink jet type color filter, the color conversion layer 183 is desirably as thick as possible in order to improve the color conversion efficiency. On the other hand, when the color conversion layer 183 is too thick, the emission light of the color-converted light is approximated to Lambertian, whereas the emission angle of the blue light that is not color-converted is limited by the light-blocking portion 181. For that reason, there arises a problem that viewing angle dependence occurs in the display color of the display image. In order to match the light distribution of the sub-pixel in which the color conversion layer 183 is provided with the light distribution of the blue light which is not color-converted, it is desirable that the thickness of the color conversion layer 183 is about half of the opening size of the light-blocking portion 181.

For example, in the case of a high-definition image display device having about 1000 ppi, because the opening of the sub-pixel 20 is about 10 μm, the color conversion layer 183 is preferably about 5 μm thick. Here, when the color conversion material is made of spherical phosphor particles, the phosphor particles are preferably layered in a close-packed structure in order to suppress light leakage from the light-emitting element 150. For this purpose, at least three layers of particles are used. Thus, the particle diameter of the phosphor material constituting the color conversion layer 183 is preferably about 2 μm or less, and more preferably about 1 μm or less, for example.

Effects of the image display device 1 of the present embodiment will now be described. The image display device 1 of the present embodiment has a passive matrix structure in which the light-emitting element 150 is driven by the wiring line **110*a* and the light-transmitting electrode 160*k* provided so as to intersect with each other above and below the light-emitting element 150. For that reason, a circuit element such as a transistor is not used to drive the light-emitting element 150, so that a pixel interval which is a distance between the light-emitting elements 150** can be shortened.

For example, by setting the pixel interval to about 10 μm, it is possible to implement a very high definition panel of about 1000 ppi in an image display device having a size in a range from 3 inches to 4 inches. In recent years, the function and performance of goggles for virtual reality have been improved, and by implementing such a high-definition panel, it becomes possible to achieve a product with higher function and performance.

In the image display device 1 of the present embodiment, because an active element such as a transistor is not formed on the substrate by adopting the passive matrix structure, a low-cost solar-grade Si substrate can be used as the substrate 100. Alternatively, because a high-temperature process such as a TFT forming process is not used, a glass substrate can be used. Whichever substrate is used, the cost can be reduced as compared with a display having an active matrix structure.

In the image display device 1 of the present embodiment, the wiring line **110*a* driven by the row selection circuit 5 can be made of a metal material having high conductivity. For that reason, because the voltage drop in the wiring line 110*a* can be suppressed, the voltage value of the DC power supply for driving the light-emitting element 150 can be kept low, whereby reducing the power consumption of the image display device 1. If the power consumption of the image display device 1 is allowed to some extent, the panel size can be increased without increasing the voltage value of the DC power supply for driving the light-emitting element 150**.

In the image display device 1 of the present embodiment, the wiring line 110*a* is electrically connected to the first terminal 34 which is a wiring line from the row selection circuit 5 by the anisotropic conductive member 30 such as ACP or ACF. The light-transmitting electrode 160*k* can also be electrically connected to the second terminal 44, which is a wiring line from the current drive circuit 7, by the anisotropic conductive member 40. By using anisotropic conductive particles having a diameter of, for example, a range from about 1 μm to several μm or less as the anisotropic conductive particles, a wiring line having a pitch of a sub-pixel of about 10 μm can be connected with high accuracy.

In the image display device 1 of the present embodiment, the bonding metals 114 and 115 are provided between the bottom surface 153B of the light-emitting element 150 and the first wiring line 110*a*. Because a metal material having high light reflectivity can be used for the bonding metals 114 and 115, the bonding metals 114 and 115 reflect downward scattered light from the light-emitting element 150 to the light-emitting surface 151S and can improve the substantial light emission efficiency of the light-emitting element 150.

In the method for manufacturing the image display device 1 of the present embodiment, after the semiconductor layer 1150 is joined to the substrate 100, the light-emitting element 150 is formed by etching the semiconductor layer 1150. For that reason, because the singulated light-emitting elements are not transferred to the substrate 100 individually, the manufacturing step can be significantly shortened. For example, compared to a case in which the light-emitting elements are transferred onto the substrate the same number of times as the number of singulated light-emitting elements, because the number of times of transferring the light-emitting elements can be considered to be the number of times of joining the substrates in the manufacturing method of the present embodiment, the number of steps corresponding to the number of times of transferring the light-emitting elements is reduced to 1/(the number of light-emitting elements).

Furthermore, in the manufacturing method of the present embodiment, because the light-emitting elements are formed after the semiconductor layer 1150 is joined to the substrate 100 on which the wiring lines 110*a* are formed, alignment for connecting the light-emitting element depending on the positions of the wiring lines and electrodes is not performed. Thus, the joining step can be easily performed in a short time. Because the alignment is not performed at the time of joining, the light-emitting element 150 can be easily reduced in size, and a high-definition display can be achieved.

In the method for manufacturing the image display device 1 of the present embodiment, the light-emitting element 150, the row selection circuit 5, and the current drive circuit 7 on the substrate 100 are electrically connected to each other by an anisotropic conductive member having fine anisotropic conductive particles. For that reason, short-pitch connection can be performed accurately and easily. By using the connection method using the anisotropic conductive member, the electrical connection between the light-emitting element 150 and the row selection circuit 5 as well as the electrical connection between the light-emitting element 150 and the current drive circuit 7 can be performed at the same time, so that the number of manufacturing steps can be reduced.

Second Embodiment

Figure 20A:
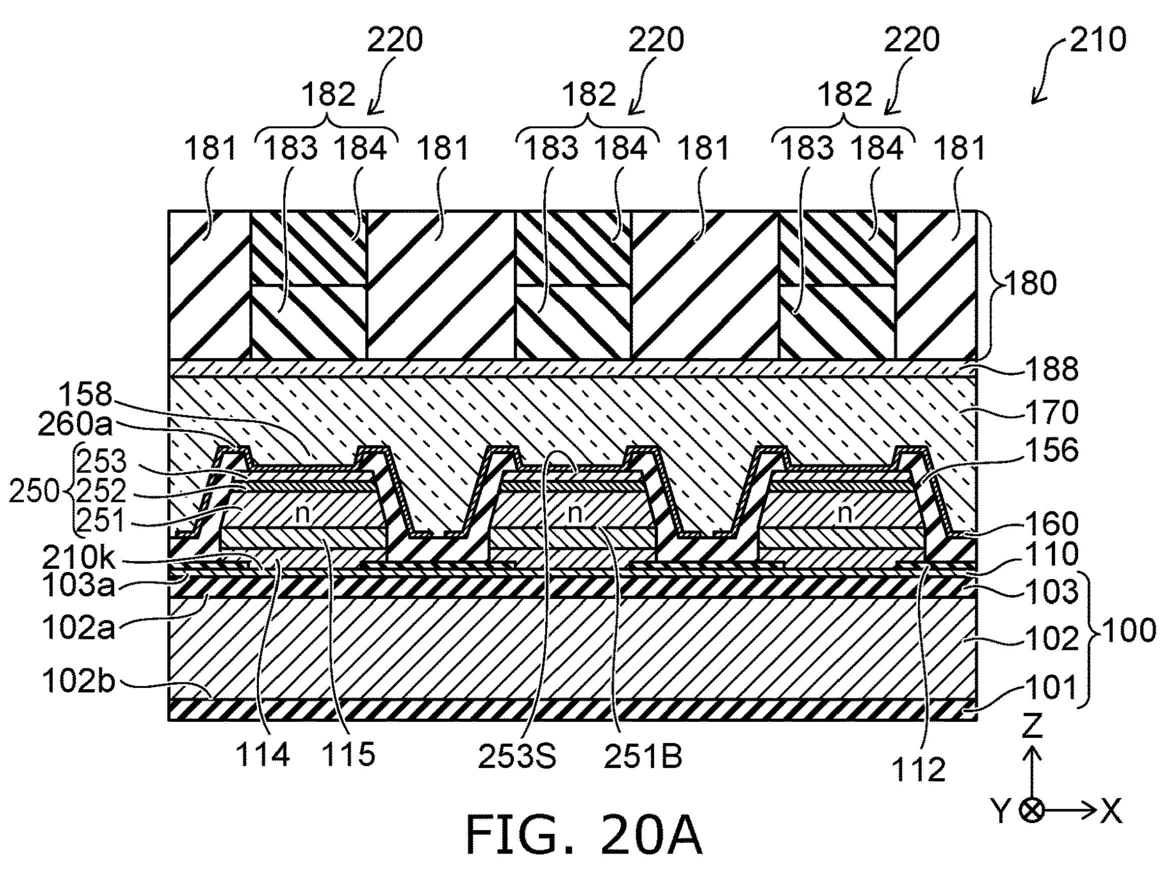
FIG. 20A is a schematic cross-sectional view illustrating a part of an image display device of a second embodiment.
Figure 20B:
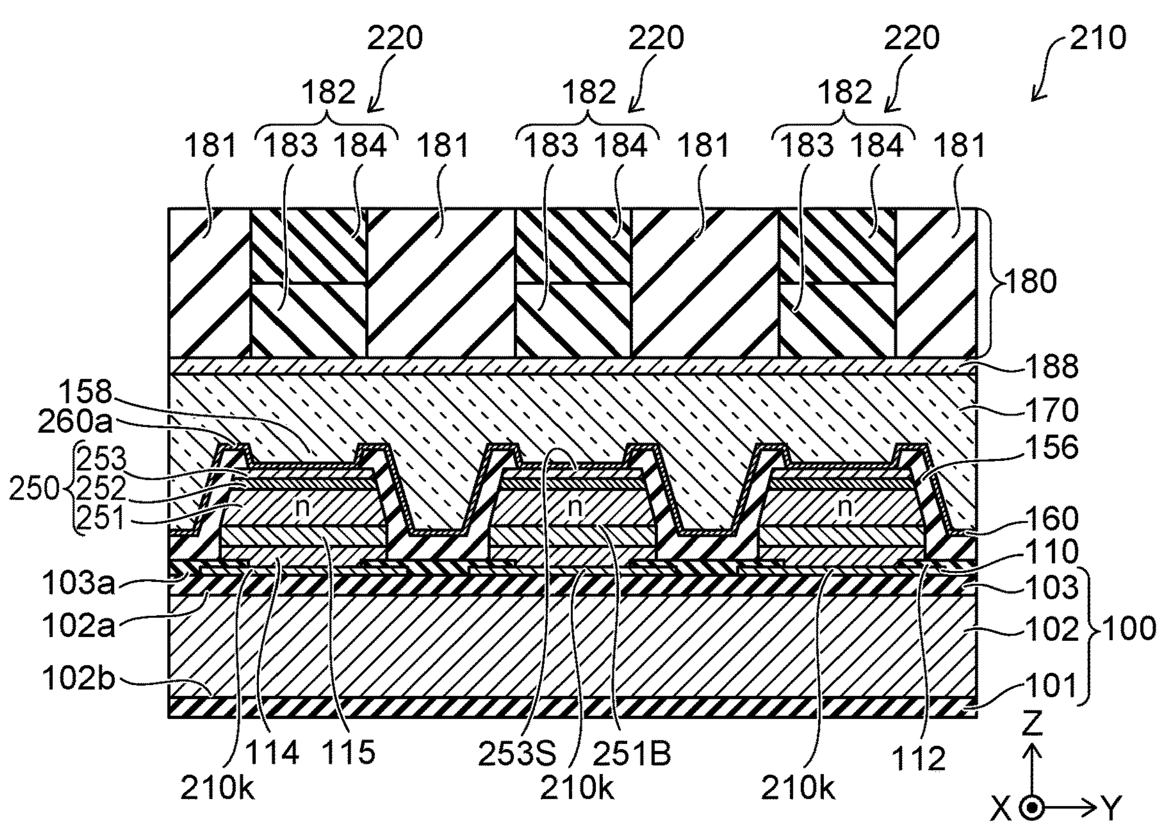
FIG. 20B is a schematic cross-sectional view illustrating a part of the image display device of the second embodiment.

Although the light-emitting surface of the light-emitting element is provided by the n-type semiconductor layer in the first embodiment described above, a light-emitting surface of a light-emitting element is provided by the p-type semiconductor layer in the present embodiment. The present embodiment is the same as the other embodiments described above except that the configuration of the light-emitting element is different, and the same components are denoted by the same reference characters, and detailed description thereof will be omitted as appropriate. FIGS. 20A and 20B are schematic cross-sectional views illustrating a part of an image display device of the present embodiment.

FIG. 20A is a cross-sectional view corresponding to the cross-section taken along line A-A' in FIG. 2. FIG. 20B is a cross-sectional view corresponding to the cross-section taken along line AA-AA' in FIG. 2.

As illustrated in FIGS. 20A and 20B, a pixel 210 includes three sub-pixels 220. The sub-pixels 220 each include a wiring line 210*k*, a light-emitting element 250, and a light-transmitting electrode 260*a*. The wiring line 210*k* is formed along the X-axis direction. The wiring layer 110 includes a plurality of wiring lines 210*k*. The plurality of wiring lines 210*k* are separated from each other in the Y-axis direction at substantially equal intervals so as to be substantially parallel to each other. The distance between the adjacent wiring lines 210*k* is set in accordance with the pitch of the light-emitting elements 250. The plurality of wiring lines 210*k* are connected to the row selection circuit 5 at the end portion of the display region 2 illustrated in FIG. 1.

The light-emitting element 250 is formed on the bonding metal 115. The n-type semiconductor layer 251, the light-emitting layer 252, and the p-type semiconductor layer 253 are layered in this order from the bonding metal 115.

The light-emitting element 250 includes a bottom surface 251B and a light-emitting surface 253S. The bottom surface 251B is a surface connected to the bonding metal 115. The light-emitting surface 253S is a surface opposite to the bottom surface 251B. Because the n-type semiconductor layer 251 includes the bottom surface 251B, the bonding metal 115 is electrically connected to the n-type semiconductor layer 251. The bonding metal 115 is ohmic-connected to the n-type semiconductor layer 251.

Because the bonding metals 114 and 115 are connected to the wiring line 210*k*, the n-type semiconductor layer 251 is electrically connected to the wiring line 210*k*. The configuration, material, and function of each of the bonding metals 114 and 115 are the same as those in the first embodiment, and a detailed description thereof will be omitted.

The light-transmitting electrodes 260*a* are provided along the Y-axis direction and over the light-emitting surfaces 253S. The light-transmitting wiring layer 160 includes a plurality of light-transmitting electrodes 260*a*. The plurality of light-transmitting electrodes 260*a* are separated from each other in the X-axis direction at substantially equal intervals so as to be parallel to each other. Because the p-type semiconductor layer 253 includes the light-emitting surface 253S, the light-transmitting electrode 260*a* is electrically connected to the p-type semiconductor layer 253. The plurality of light-transmitting electrodes 260*a* are electrically connected to the current drive circuit 7 at the end portion of the display region 2 illustrated in FIG. 1.

Figure 21:
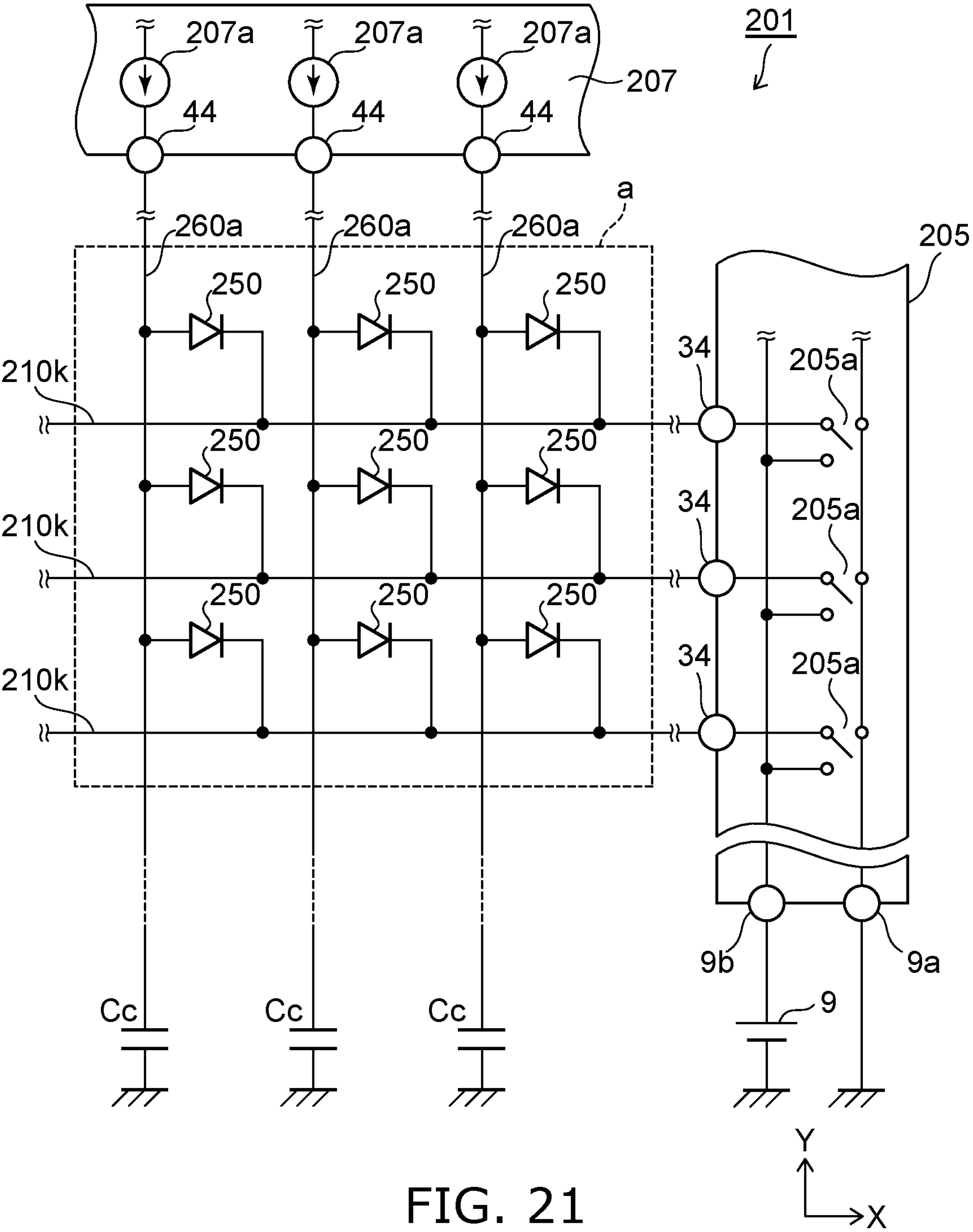
FIG. 21 is a schematic block diagram illustrating the image display device of the second embodiment.

FIG. 21 is a schematic block diagram illustrating the image display device of the present embodiment.

As illustrated in FIG. 21, in the image display device of the present embodiment, the configuration of the light-emitting element is different from that of the other embodiments described above, and the polarity of the light-emitting element is different. The circuit configuration is changed in accordance with the difference in the polarity of the light-emitting element.

As illustrated in FIG. 21, the wiring lines 210*k* are provided along the row direction. The wiring line 210*k* is connected to the row selection circuit 205 via the first terminal 34. The light-transmitting electrodes 260*a* are provided along the column direction. The light-transmitting electrode 260*a* is connected to the current drive circuit 207 via the second terminal 44.

The row selection circuit 205 includes row selection switches 205*a*, and the wiring line 210*k* is connected to the row selection switch 205*a* via the first terminal 34. A row selection switch 205*a* outputs the voltage of the power supply terminal 9*a* from the first terminal 34 when a row of that row selection switch 205*a* is selected. A row selection switch 205*a* outputs the voltage of the power supply terminal 9*a* from the first terminal 34 when a row of that row selection switch 205*a* is not selected. The power supply terminal 9*a* is connected to the DC power supply 9 that supplies a DC voltage sufficiently higher than the voltage value of the power supply terminal 9*a* to the ground terminal 9*b* when the voltage of the ground terminal 9*b* is used as a reference.

The current drive circuit 207 includes a current source 207*a*, and the light-transmitting electrode 260*a* is connected to the current source 207*a* via the second terminal 44. The current source 207*a* operates to drain a current from the second terminal 44.

The anode of the light-emitting element 250 is connected to the current source 207*a* via the second terminal 44, and the cathode of the light-emitting element 250 is connected to the row selection switch 205*a* via the first terminal 34. When the row selection switch 205*a* is selected by an external control signal, the voltage of the power supply terminal 9*b* is output from the first terminal 34. Because the voltage value of the power supply terminal 9*b* is sufficiently lower than the voltage value of the ground terminal 9*a*, a current flows through the light-emitting element 250 connected to the wiring line 210*k* in the selected row. The current flows through a path including the current source 207*a*, the second terminal 44, the anode of the light-emitting element 250, the cathode of the light-emitting element 250, the first terminal 34, and the row selection switch 205*a*.

A method for manufacturing the image display device of the present embodiment will now be described.

Figure 22A:
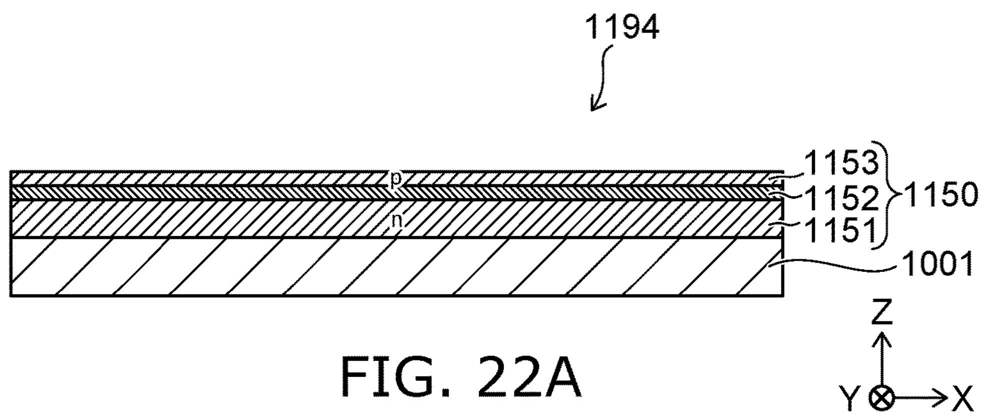
FIG. 22A is a schematic cross-sectional view illustrating a part of a method for manufacturing the image display device of the second embodiment.
Figure 22B:
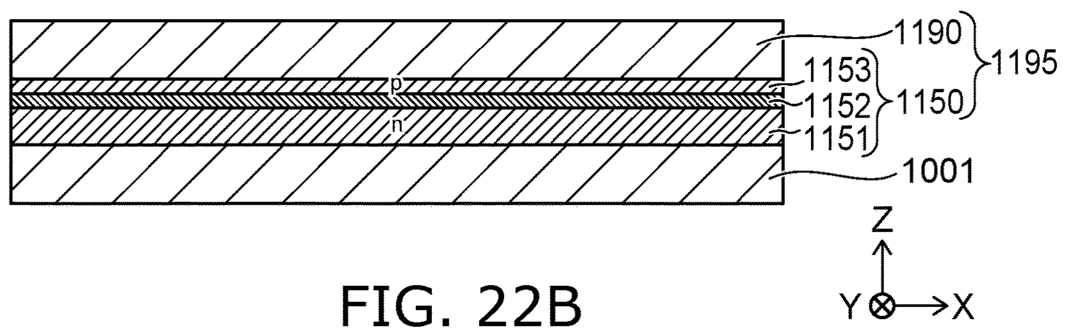
FIG. 22B is a schematic cross-sectional view illustrating a part of the method for manufacturing the image display device of the second embodiment.
Figure 22C:
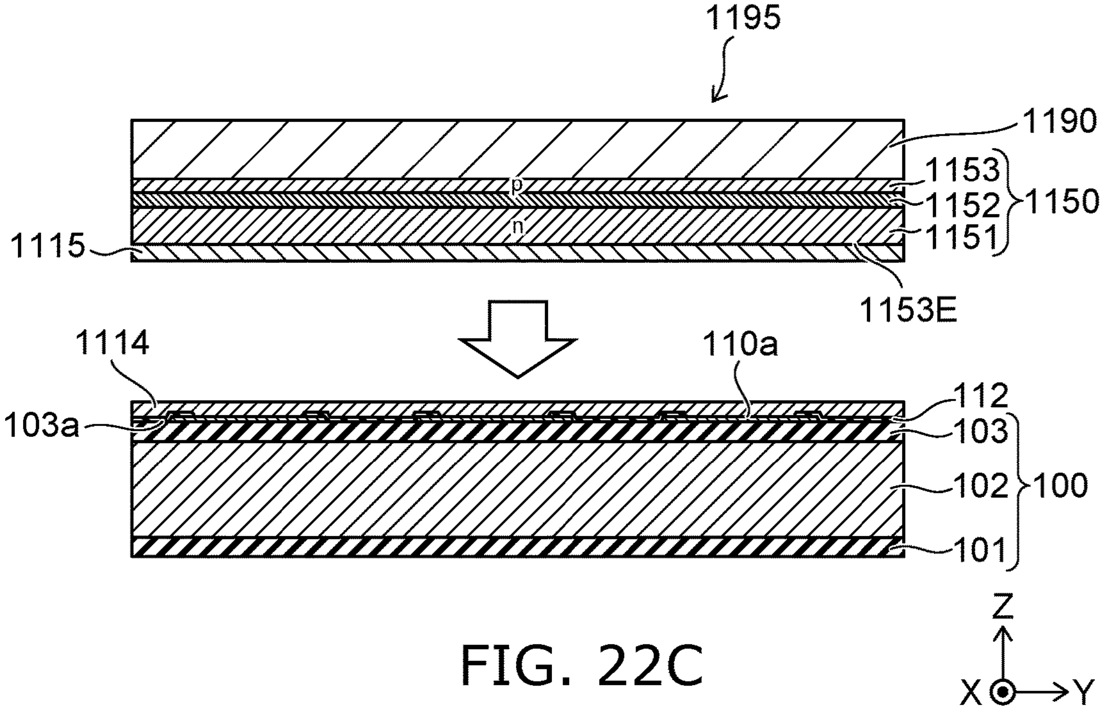
FIG. 22C is a schematic cross-sectional view illustrating a part of the method for manufacturing the image display device of the second embodiment.

FIGS. 22A to 22C are schematic cross-sectional views illustrating a part of the method for manufacturing the image display device of the present embodiment.

As illustrated in FIG. 22A, a semiconductor growth substrate 1194 is provided. The semiconductor growth substrate 1194 is the same as that described in relation to FIG. 7A for the other embodiments described above.

As illustrated in FIG. 22B, the support substrate 1190 is bonded to the p-type semiconductor layer 1153 of the semiconductor growth substrate 1194. Thereafter, the crystal growth substrate 1001 is removed to form the substrate 1195. To remove the crystal growth substrate 1001, wet etching or laser lift-off is used.

As illustrated in FIG. 22C, in the substrate 1195, the metal layer 1115 is formed on the exposed surface 1153E of the n-type semiconductor layer 1151. The semiconductor layer 1150 is joined to the substrate 100 via the metal layers 1115 and 1114. Thereafter, the support substrate 1190 is removed by wet etching or laser lift-off.

Figure 23A:
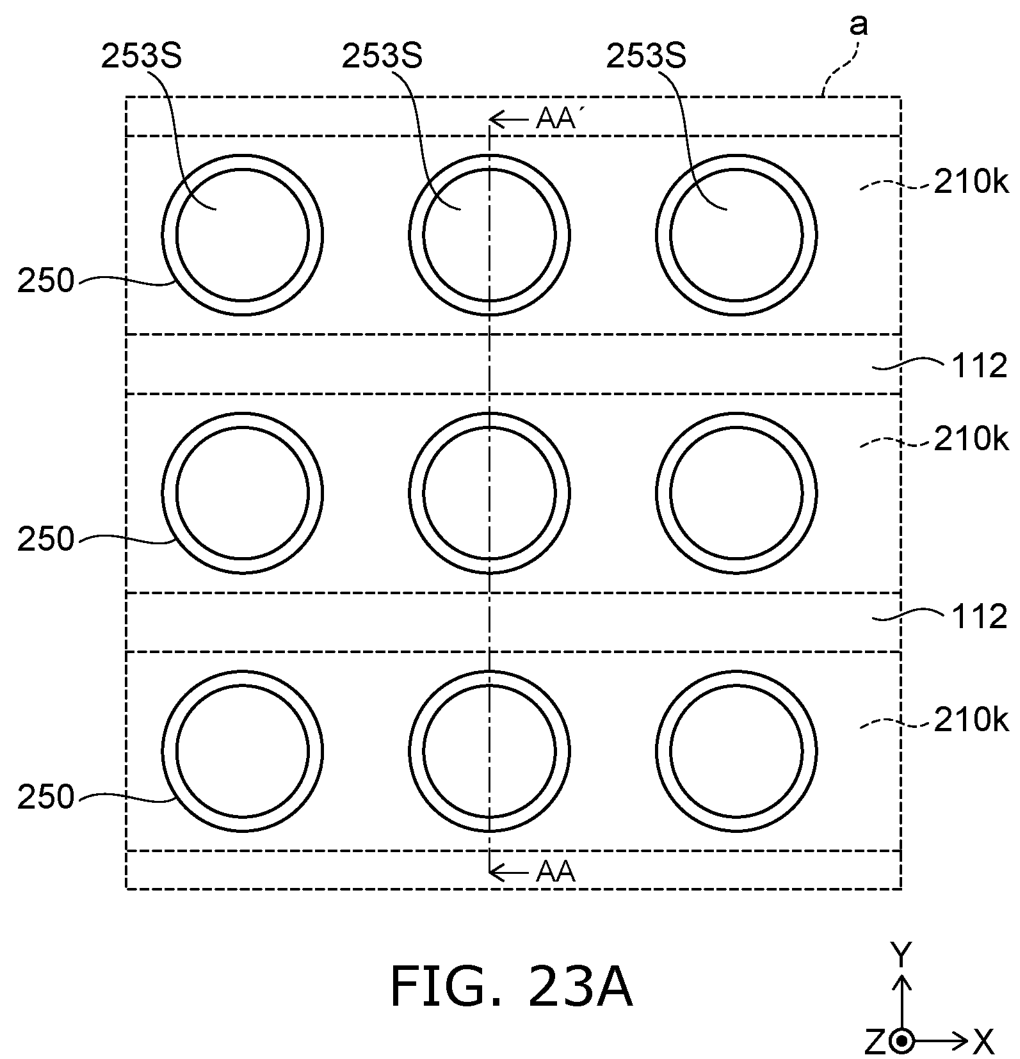
FIG. 23A is a schematic plan view illustrating a part of the method for manufacturing the image display device of the second embodiment.

FIG. 23A is a schematic plan view illustrating a part of the method for manufacturing the image display device of the present embodiment.

Figure 23B:
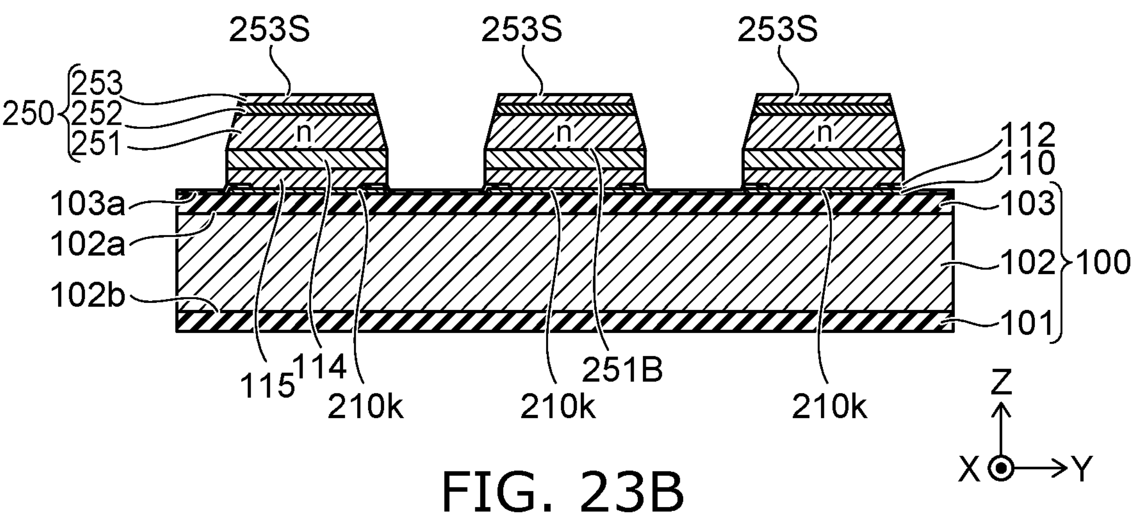
FIG. 23B is a schematic cross-sectional view illustrating a part of the method for manufacturing the image display device of the second embodiment.

FIG. 23B is a schematic cross-sectional view illustrating a part of the method for manufacturing the image display device of the present embodiment.

FIG. 23A is an enlarged plan view of a portion corresponding to the portion a in FIG. 1, and FIG. 23B is a cross-sectional view taken along line AA-AA' in FIG. 23A.

As illustrated in FIGS. 23A and 23B, the semiconductor layer 1150 illustrated in FIG. 22C is processed by etching to form the light-emitting elements 250. The light-emitting element 250 is formed into a truncated cone shape whose diameter decreases from the bottom surface 251B toward the light-emitting surface 253S by adjusting the etching rate in the same manner as the light-emitting element 150 in the other embodiments described above. The metal layers 1114 and 1115 illustrated in FIG. 22C are processed by etching to form the bonding metals 114 and 115.

Figure 24A:
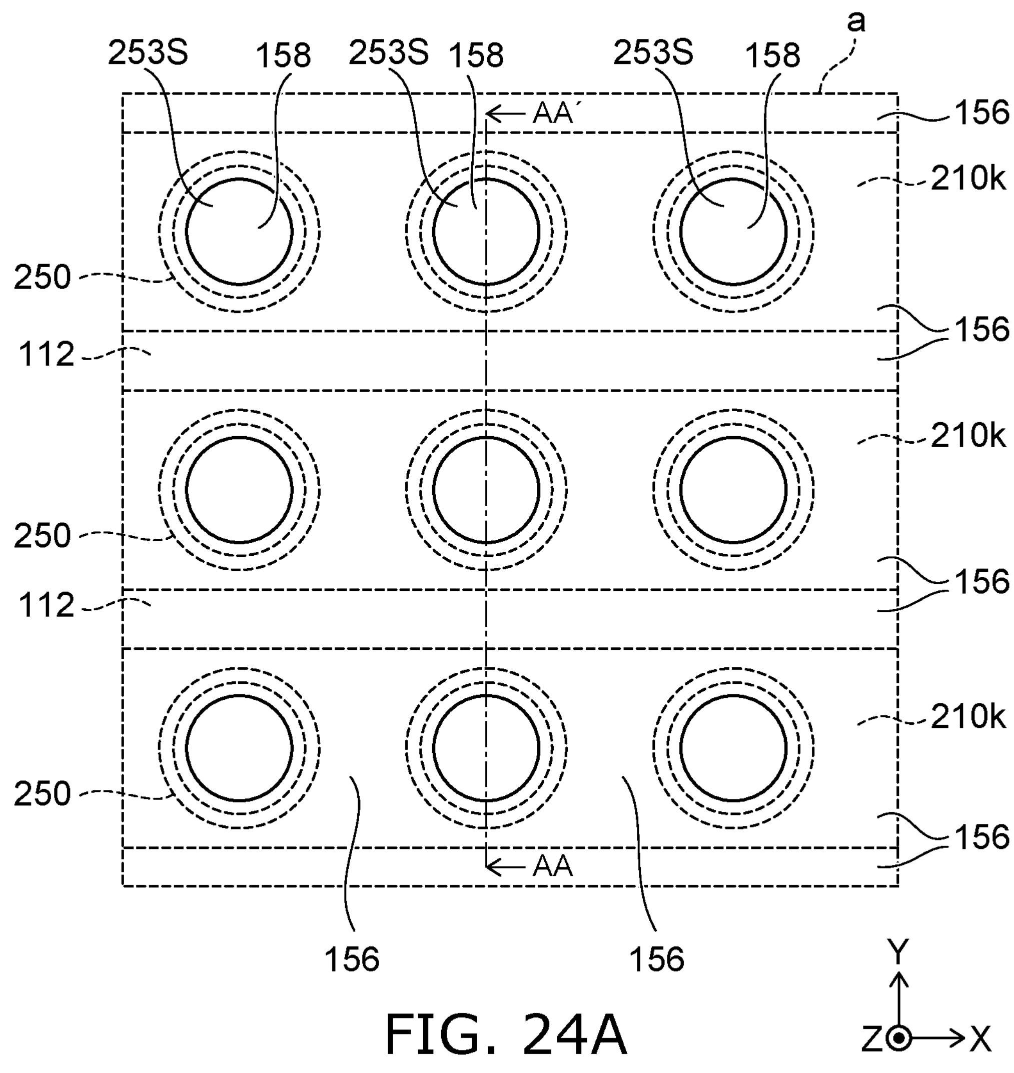
FIG. 24A is a schematic plan view illustrating a part of the method for manufacturing the image display device of the second embodiment.

FIG. 24A is a schematic plan view illustrating a part of the method for manufacturing the image display device of the present embodiment.

Figure 24B:
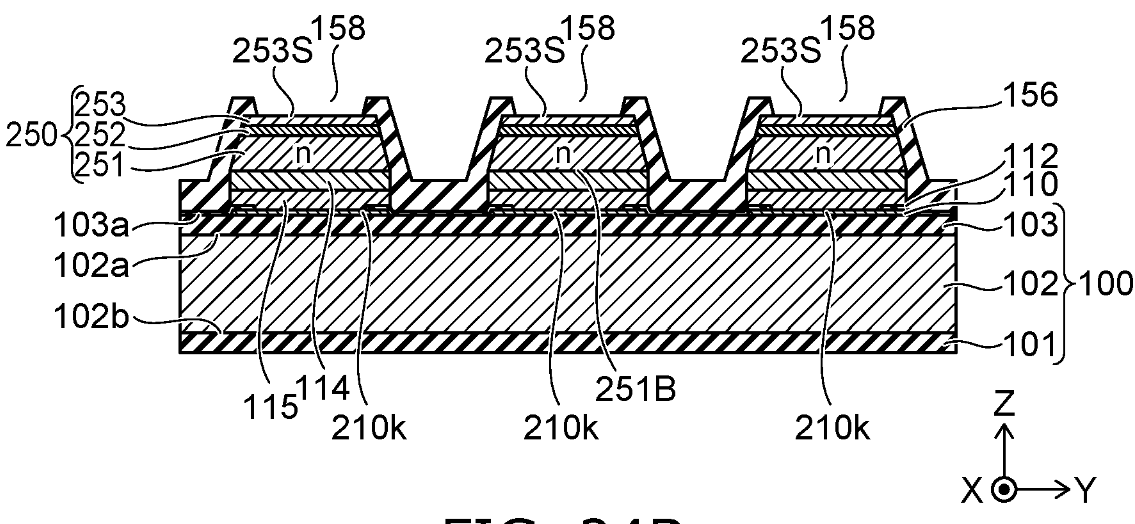
FIG. 24B is a schematic cross-sectional view illustrating a part of the method for manufacturing the image display device of the second embodiment.

FIG. 24B is a schematic cross-sectional view illustrating a part of the method for manufacturing the image display device of the present embodiment.

FIG. 24A is an enlarged plan view of a portion corresponding to the portion a in FIG. 1, and FIG. 24B is a cross-sectional view taken along line AA-AA' in FIG. 24A.

As illustrated in FIGS. 24A and 24B, the insulating film 156 is formed on the insulating layer 112, the bonding metals 114 and 115, and the light-emitting elements 250. When the insulating film 156 is made of $SiO_2$, the insulating film 156 is formed by CVD, sputtering, or the like. A portion of the insulating film 156 is removed to expose the light-emitting surface 253S. In this example, as in the other embodiments described above, the opening 158 through which the light-emitting surface 253S is exposed has a circular shape in the XY plan view.

Figure 25A:
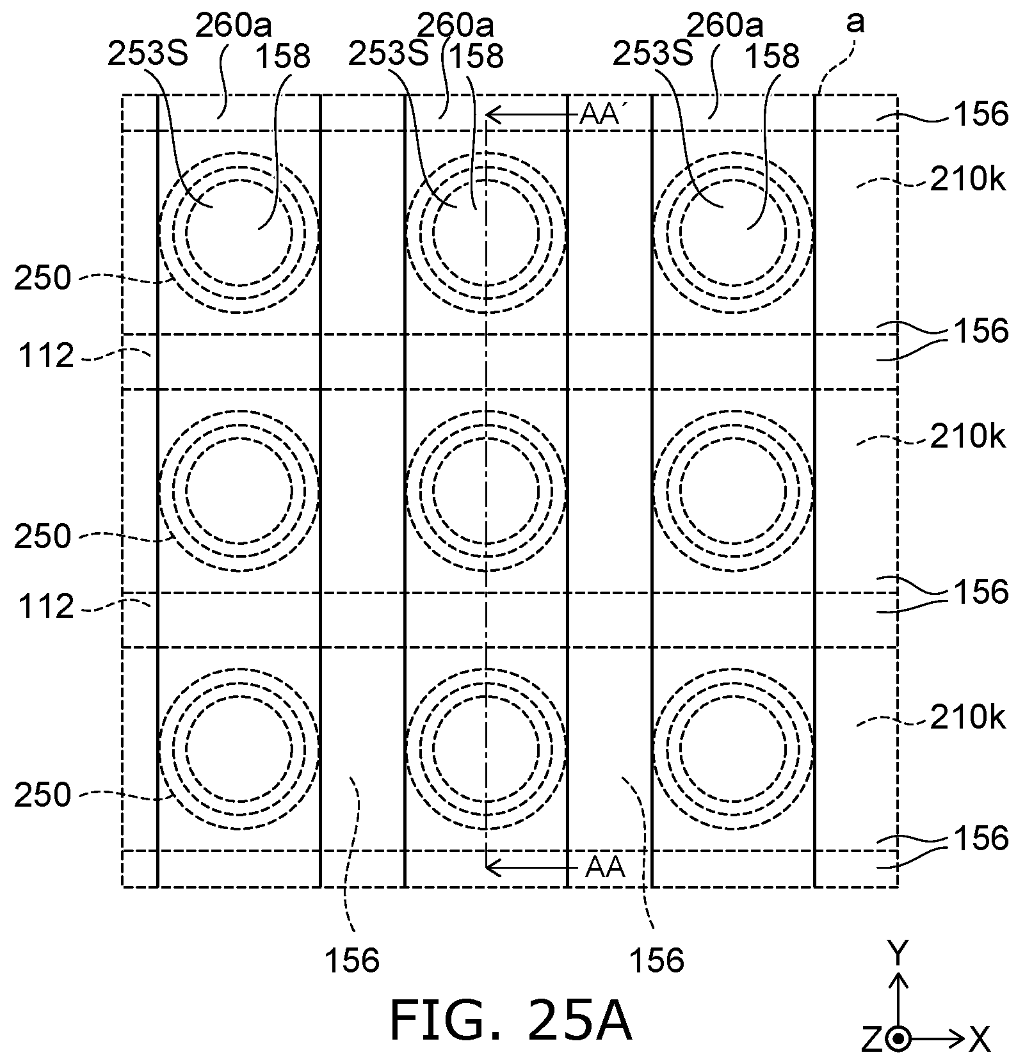
FIG. 25A is a schematic plan view illustrating a part of the method for manufacturing the image display device of the second embodiment.

FIG. 25A is a schematic plan view illustrating a part of the method for manufacturing the image display device of the present embodiment.

Figure 25B:
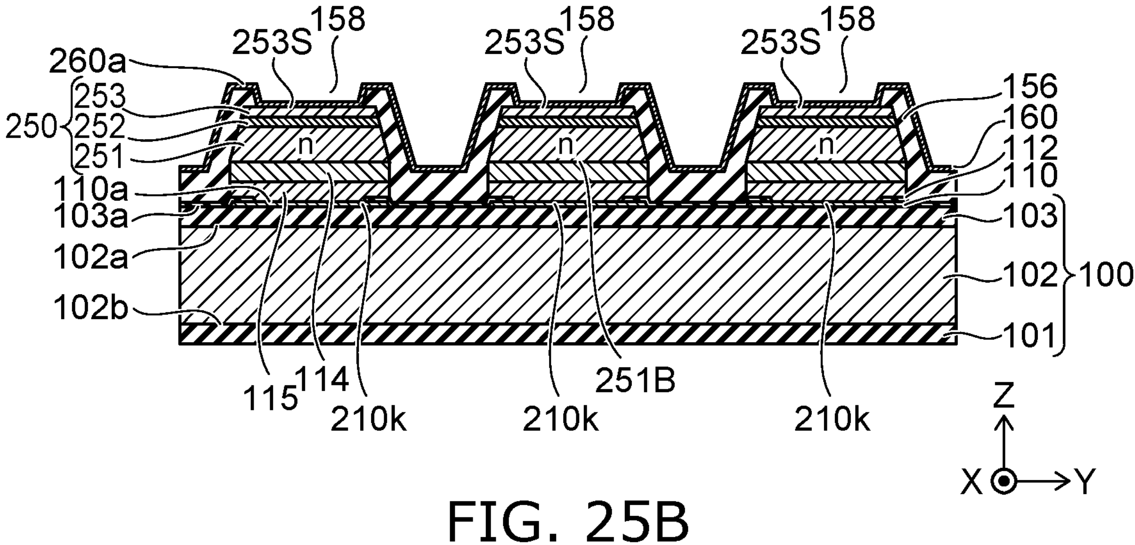
FIG. 25B is a schematic cross-sectional view illustrating a part of the method for manufacturing the image display device of the second embodiment.

FIG. 25B is a schematic cross-sectional view illustrating a part of the method for manufacturing the image display device of the present embodiment.

FIG. 25A is an enlarged plan view of a portion corresponding to the portion a in FIG. 1, and FIG. 25B is a cross-sectional view taken along line AA-AA' in FIG. 25A.

As illustrated in FIGS. 25A and 25B, the light-transmitting electrodes 260*a* are formed over the insulating film 156 and the light-emitting surfaces 253S. To be more specific, for example, a light-transmitting conductive film such as ITO is formed so as to cover the insulating film 156 and the light-emitting surfaces 253S. A mask along the Y-axis direction is formed on the conductive film, and the light-transmitting electrode 253S is formed so as to connect the light-emitting surfaces 260*a* of the light-emitting elements 250 arranged along the Y-axis direction to each other.

Effects of the image display device of the present embodiment will now be described. Because the image display device of the present embodiment has a passive matrix structure that does not use a circuit element such as a transistor as in the image display devices of the other embodiments described above, the pitch of the sub-pixels can be shortened. In addition, the p-type semiconductor layer 253 can be used as the light-emitting surface 253S and the n-type semiconductor layer 251 can be used as the bottom surface 251B. Because the resistance value of the n-type semiconductor layer 251 can be made smaller than that of the p-type semiconductor layer 253, the resistance value related to the light-emitting element 250 and the wiring line 210*k* can be suppressed to be small. Thus, there is an advantage that the resistance value of the wiring line 210*k* connected to the row selection circuit 205 illustrated in FIG. 21 can be suppressed.

In the method for manufacturing the image display device of the present embodiment, the p-type semiconductor layer 253 can be used as the light-emitting surface 253S by forming the semiconductor layer 1150 on the crystal growth substrate 1001 and then transferring it to the support substrate 1190. By adopting this manufacturing step, because the n-type semiconductor layer 1151 can be first formed on the crystal growth substrate 1001, the quality of the semiconductor crystal of the semiconductor layer 1150 can be improved and stabilized, and the manufacturing yield can be improved.

Third Embodiment

Figure 26:
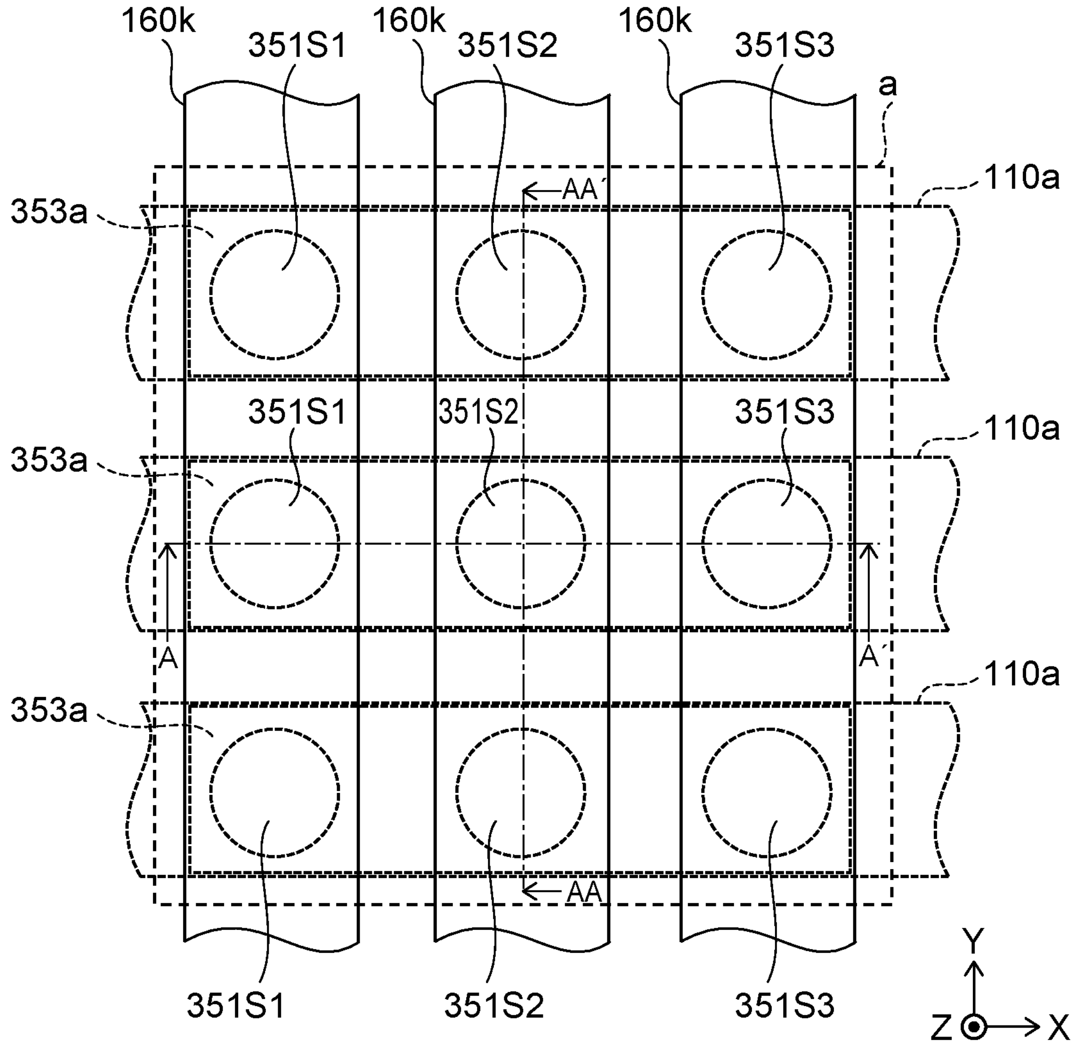
FIG. 26 is a schematic plan view illustrating a part of an image display device according to a third embodiment.

FIG. 26 is a schematic plan view illustrating a part of an image display device according to the present embodiment.

FIG. 26 is an enlarged view of a portion corresponding to the portion a of the display region 2 illustrated in FIG. 1.

As illustrated in FIG. 26, in the image display device of the present embodiment, a plurality of light-emitting surfaces 351S1 to 351S3 are provided on a p-type semiconductor layers 353*a* formed on the corresponding first wiring lines 110*a*, and in this respect, the image display device of the present embodiment is different from the cases of the other embodiments described above. The same components are denoted by the same reference characters, and detailed description thereof will be omitted as appropriate.

In this example, one p-type semiconductor layer 353*a* includes three light-emitting surfaces 351S1 to 351S3, but there is no limitation thereto, and two or more light-emitting surfaces can be provided on one p-type semiconductor layer 353*a*.

The p-type semiconductor layer 353*a* is provided on the wiring line 110*a*. Although not illustrated in FIG. 26, a plurality of p-type semiconductor layers 353*a* can be provided over one wiring line 110*a*. The plurality of p-type semiconductor layers 353*a* are provided in the X-axis direction and are disposed such that the interval between the light-emitting surfaces is a substantially constant pitch when the light-emitting surfaces are formed.

A plurality of wiring lines 110*a* are provided, and the plurality of wiring lines 110*a* are separated from each other in the Y-axis direction at substantially equal intervals and substantially parallel to each other. Thus, the plurality of p-type semiconductor layers 353*a* are separated from each other in the Y-axis direction at substantially equal intervals and substantially parallel to each other. The separation distance between the wiring lines 110*a* in the Y-axis direction and the separation distance between the p-type semiconductor layers 353*a* in the Y-axis direction are made substantially equal to the pitch of the light-emitting surfaces.

Figure 27A:
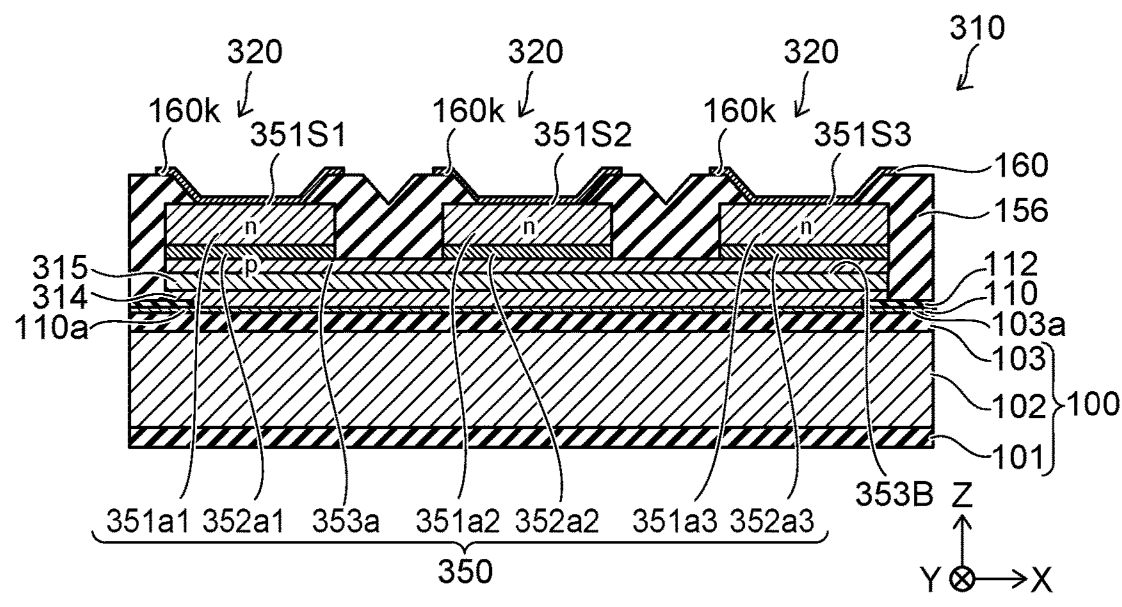
FIG. 27A is a schematic cross-sectional view illustrating a part of the image display device of the third embodiment.
Figure 27B:
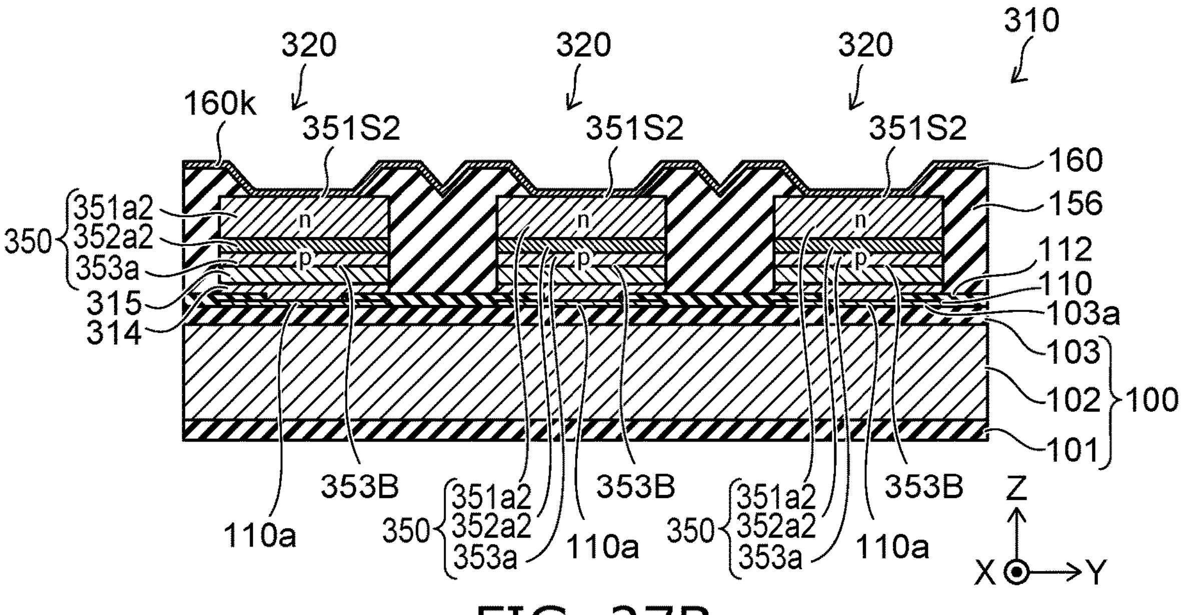
FIG. 27B is a schematic cross-sectional view illustrating a part of the image display device of the third embodiment.

FIGS. 27A and 27B are schematic cross-sectional views illustrating a part of the image display device of the present embodiment.

FIG. 27A is a cross-sectional view taken along line A-A' of FIG. 26.

FIG. 27B is a cross-sectional view taken along line AA-AA' in FIG. 26.

As illustrated in FIGS. 27A and 27B, a pixel 310 of the image display device includes three sub-pixels 320. In the following drawings illustrating the embodiment, the color filter is not illustrated in order to avoid complication of the description. In the color filter, as described in the above-described other embodiments, the surface resin layer 170 is formed on the insulating film 156 and the light-transmitting electrodes 160*k*, and the color filter is provided on the surface resin layer 170. Including the case of the other embodiments described above, it is also possible to provide a monochrome image display device without providing a color filter.

The sub-pixel 320 includes the substrate 100. The substrate 100 is the same as in the other embodiments described above and will not be described in detail.

The wiring layer 110 is provided on the first surface 103*a*, and the wiring layer 110 includes the plurality of wiring lines 110*a*. On the first surface 103*a*, the insulating layer 112 is provided between two adjacent wiring lines 110*a* provided in parallel in the Y-axis direction.

Bonding metals 314 and 315 are provided on the wiring line 110*a*. The bonding metals 314 and 315 are layered in this order from the first surface 103*a*. The bonding metals 314 and 315 are formed along the X-axis direction together with the first wiring line 110*a*. A plurality of bonding metals 314 and a plurality of bonding metals 315 are provided, and the plurality of bonding metals 314 are separated from each other in the Y-axis direction at substantially equal intervals and substantially parallel to each other, and the plurality of bonding metals 315 are separated from each other in the Y-axis direction at substantially equal intervals and substantially parallel to each other. The separation distance between the bonding metals 314 adjacent to each other in the Y-axis direction and the separation distance between the bonding metals 315 adjacent to each other in the Y-axis direction are set to be equal to the pitch of the light-emitting surfaces. The bonding metals 314 and 315 can be formed of the same material as the bonding metals 114 and 115 in the other embodiments described above and include the function same as or similar to that of the bonding metals 114 and 115.

The semiconductor layer 350 includes the p-type semiconductor layer 353*a*, a first light-emitting layer 352*a*1 to a third light-emitting layer 352*a*3, and a first n-type semiconductor layer 351*a*1 to a third n-type semiconductor layer 351*a*3. The first light-emitting layer 352*a*1 to the third light-emitting layer 352*a*3 are provided on the p-type semiconductor layer 350*a*. The first light-emitting layer 352*a*1 to the third light-emitting layer 352*a*3 are provided on the p-type semiconductor layer 353*a* so as to be separate and apart from each other. The first n-type semiconductor layer 351*a*1 is provided on the first light-emitting layer 352*a*1. The second n-type semiconductor layer 351*a*2 is provided on the second light-emitting layer 352*a*2. The third n-type semiconductor layer 351*a*3 is provided on the third light-emitting layer 352*a*3. The first n-type semiconductor layer 351*a*1 to the third n-type semiconductor layer 351*a*3 are provided on the first light-emitting layer 352*a*1 to the third light-emitting layer 352*a*3, respectively, so as to be separate and apart from each other.

The p-type semiconductor layer 353*a* is provided on the bonding metal 315 and along the bonding metal 315. That is, the plurality of p-type semiconductor layers 353*a* are separated from each other in the Y-axis direction so as to be substantially parallel to each other, together with the wiring lines 110*a* and the bonding metals 314 and 315. The bottom surface 353B is a part of the p-type semiconductor layer 353*a*, and the bottom surface 353B is in contact with the bonding metal 315. Thus, the p-type semiconductor layer 353*a* is electrically connected to the bonding metal 315.

The arrays of the first light-emitting layer **352*a*1 to the third light-emitting layer 352*a*3 are separated from each other in the Y-axis direction and substantially parallel to each other, together with the wiring lines 110*a*, the bonding metals 314 and 315, and the p-type semiconductor layers 353*a***.

The first n-type semiconductor layer **351*a*1 to the third n-type semiconductor layer 351*a*3 are provided on the first light-emitting layer 352*a*1 to the third light-emitting layer 352*a*3, respectively. For that reason, the arrays of the first n-type semiconductor layer 351*a*1 to the third n-type semiconductor layer 351*a*3 are also separated from each other in the Y-axis direction and substantially parallel to each other, together with the wiring lines 110*a*, the bonding metals 314 and 315, the p-type semiconductor layers 353*a*, and the arrays of the first light-emitting layer 352*a*1 to the third light-emitting layer 352*a*3**.

The first n-type semiconductor layer **351*a*1 includes the first light-emitting surface 351S1. The first light-emitting surface 351S1 is a surface opposite to a surface of the first n-type semiconductor layer 351*a*1 in contact with the first light-emitting layer 352*a*1. The second n-type semiconductor layer 351*a*2 includes the second light-emitting surface 351S2. The second light-emitting surface 351S2 is a surface opposite to a surface of the second n-type semiconductor layer 351*a*2 in contact with the second light-emitting layer 352*a*2. The third n-type semiconductor layer 351*a*3 includes the third light-emitting surface 351S3. The third light-emitting surface 351S3 is a surface opposite to a surface of the third n-type semiconductor layer 351*a*3 in contact with the third light-emitting layer 352*a*3. Thus, the first light-emitting surface 351S1 to the third light-emitting surface 351S3 are arranged at substantially equal intervals along the X-axis direction. The plurality of arrays of the first light-emitting surface 351S1 to the third light-emitting surface 351S3** are separated from each other in the Y-axis direction and substantially parallel to each other.

The insulating film 156 is provided to cover the insulating layer 112, the bonding metals 314 and 315, the p-type semiconductor layers **353*a*, the first light-emitting layer 352*a*1 to the third light-emitting layer 352*a*3, and the first n-type semiconductor layer 351*a*1 to the third n-type semiconductor layer 351*a*3. Portions of insulating film 156 are removed to expose the first light-emitting surface 351S1 to the third light-emitting surface 351S3**.

The light-transmitting wiring layer 160 is provided on the insulating film 156 and the first light-emitting surface 351S1 to the third light-emitting surface 351S3. The light-transmitting wiring layer 160 includes a plurality of light-transmitting electrodes **160*k*. The light-transmitting wiring layer 160 is provided over the arrays of the first light-emitting surface 351S1 to the third light-emitting surface 351S3. The plurality of light-transmitting electrodes 160*k* are separated from each other in the X-axis direction at substantially equal intervals and parallel to each other. The separation distance between adjacent light-transmitting electrodes 160*k*** in the X-axis direction is substantially equal to the pitch of the light-emitting surfaces.

A method for manufacturing the image display device of the present embodiment will now FIGS. 28A, and 28B, and 29A to 29C are schematic cross-sectional views illustrating a part of the method for manufacturing the image display device of the present embodiment.

Figure 29A:
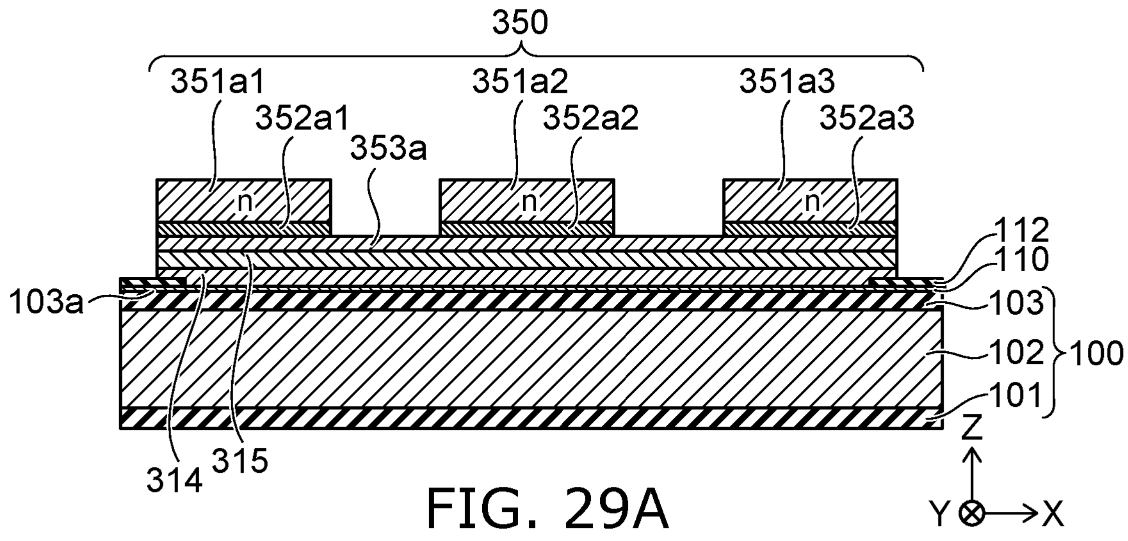
FIG. 29A is a schematic cross-sectional view illustrating a part of the method for manufacturing the image display device of the third embodiment.
Figure 29B:
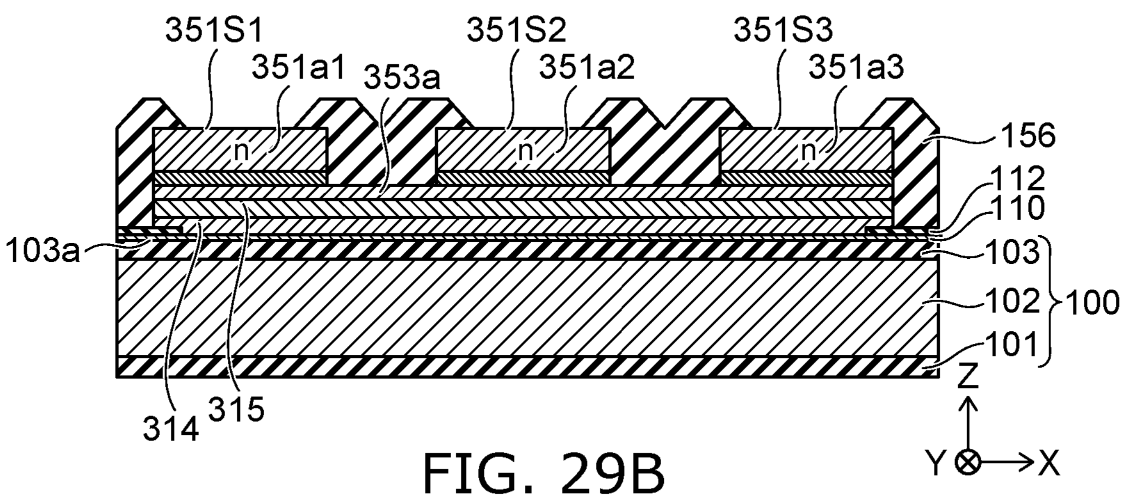
FIG. 29B is a schematic cross-sectional view illustrating a part of the method for manufacturing the image display device of the third embodiment.
Figure 29C:
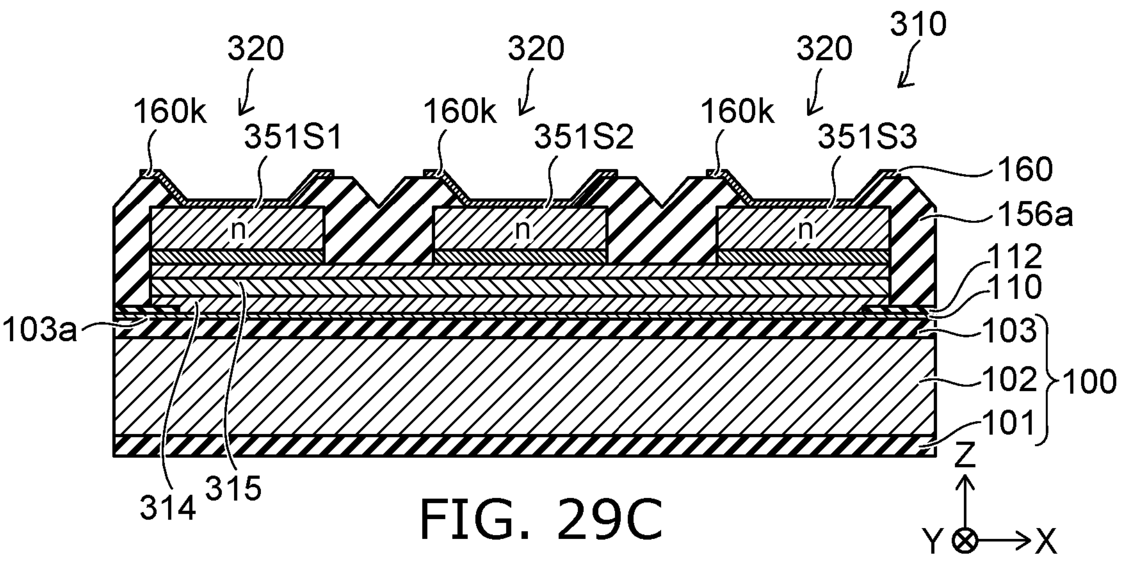
FIG. 29C is a schematic cross-sectional view illustrating a part of the method for manufacturing the image display device of the third embodiment.

FIGS. 29A to 29C are cross-sectional views corresponding to the cross section taken along line A-A' in FIG. 26.

Figure 28A:
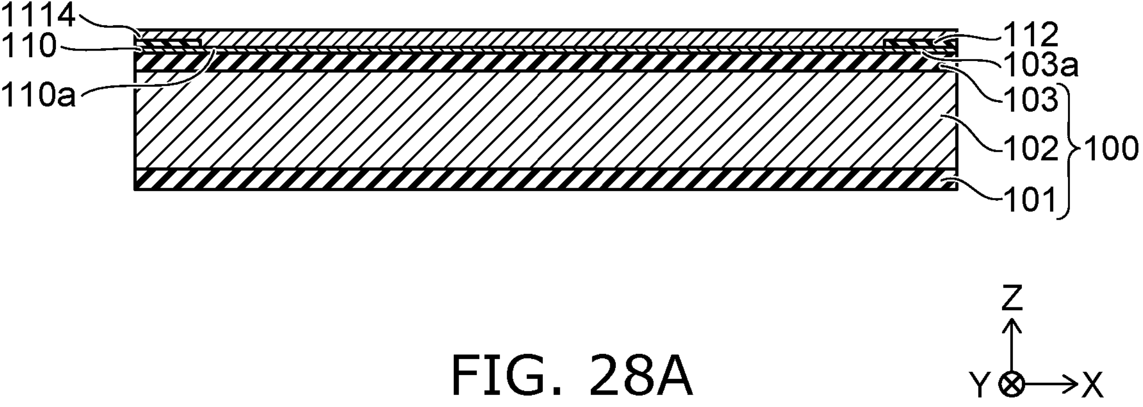
FIG. 28A is a schematic cross-sectional view illustrating a part of a method for manufacturing the image display device of the third embodiment.

As illustrated in FIG. 28A, the wiring layer 110 is formed on the first surface **103*a* of the substrate 100 to form the wiring line 110*a*. The insulating layer 112 is formed on the wiring layer 110 including the wiring line 110*a*. The insulating layer 112 is removed in a region where the semiconductor layer 350 is connected to the wiring line 110*a*. The metal layer 1114 is formed on the insulating layer 112 and the wiring line 110*a*, and the surface of the metal layer 1114** is preferably planarized.

Figure 28B:
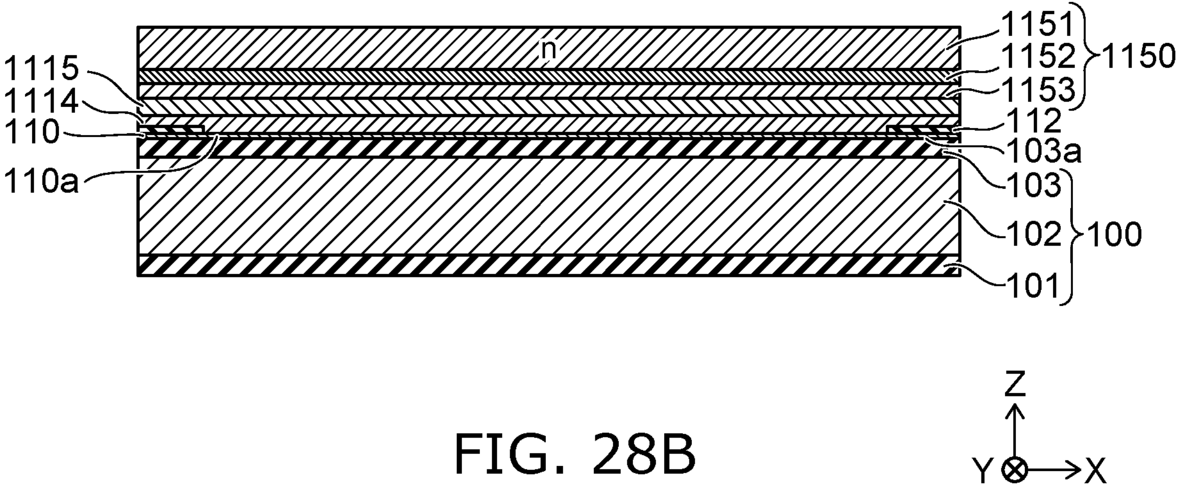
FIG. 28B is a schematic cross-sectional view illustrating a part of the method for manufacturing the image display device of the third embodiment.

As illustrated in FIG. 28B, the metal layer 1115 formed on the semiconductor layer 1150 is joined to the metal layer 1114, whereby the semiconductor layer 1150 is joined to the substrate 100 via the metal layers 1115 and 1114. These steps can be performed in the same manner as in the other embodiments described above.

As illustrated in FIG. 29A, the metal layers 1114 and 1115 illustrated in FIG. 28B are processed by etching to form the bonding metals 314 and 315. The bonding metals 314 and 315 are formed along the wiring line **110*a* and are formed in the same shape as the first wiring line 110*a*** in the XY plan view.

The semiconductor layer 1150 illustrated in FIG. 28B is processed by etching to form the semiconductor layer 350 illustrated in FIG. 29A. In the step of forming the semiconductor layer 350, the p-type semiconductor layer **353*a* is formed along the bonding metal 315 and is formed in the same shape as the bonding metals 314 and 315 and the wiring line 110*a*** in the XY plan view.

After the p-type semiconductor layer **353*a* is formed, the first light-emitting layer 352*a*1 to the third light-emitting layer 352*a*3 and the first n-type semiconductor layer 351*a*1 to the third n-type semiconductor layer 351*a*3 are formed. The first light-emitting layer 352*a*1 and the first n-type semiconductor layer 351*a*1 are formed in the same shape in the XY plan view. The second light-emitting layer 352*a*2 and the second n-type semiconductor layer 351*a*2 are formed in the same shape in the XY plan view. The third light-emitting layer 352*a*3 and the third n-type semiconductor layer 351*a*3 are formed in the same shape in the XY plan view. The first n-type semiconductor layer 351*a*1 to the third n-type semiconductor layer 351*a*3 are simultaneously formed, and the first light-emitting layer 352*a*1 to the third light-emitting layer 352*a*3 are simultaneously formed. At this time, some or all of the portions the p-type semiconductor layer 353*a* interposed between the first light-emitting layer 352*a*1 to the third light-emitting layer 352*a*3** may be etched.

As illustrated in FIG. 29B, the insulating film 156 is provided so as to cover the insulating layer 112, the bonding metals 314 and 315, and the semiconductor layer 350 illustrated in FIG. 29A. Portions of the insulating film 156 on the first n-type semiconductor layer **351*a*1 to the third n-type semiconductor layer 351*a*3 are removed to expose the first light-emitting surface 351S1 to the third light-emitting surface 351S3**, respectively.

As illustrated in FIG. 29C, first light-transmitting wiring layers 160 are formed along the Y-axis direction. The first light-transmitting electrode **160*k* is formed on each of the first light-emitting surface 351S1 to the third light-emitting surface 351S3**.

In this manner, the pixel 310 including a plurality of sub-pixels 320 is formed.

Effects of the image display device of the present embodiment will now be described. Because the image display device of the present embodiment has a passive matrix structure that does not use a circuit element such as a transistor as in the image display devices of the other embodiments described above, the pitches of the first light-emitting surface 351S1 to the third light-emitting surface 351S3 can be shortened. In addition, in the present embodiment, because the semiconductor layer 350 is not divided for each light-emitting element when forming the semiconductor layer 350, the manufacturing step can be shortened.

Fourth Embodiment

Figure 30A:
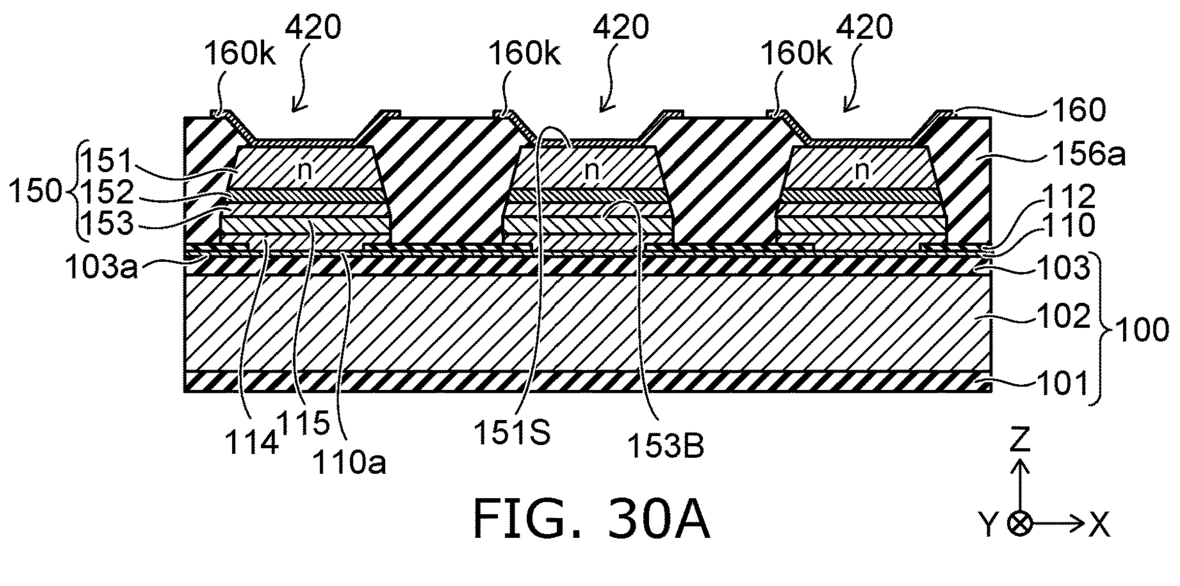
FIG. 30A is a schematic cross-sectional view illustrating a part of an image display device according to a fourth embodiment.
Figure 30B:
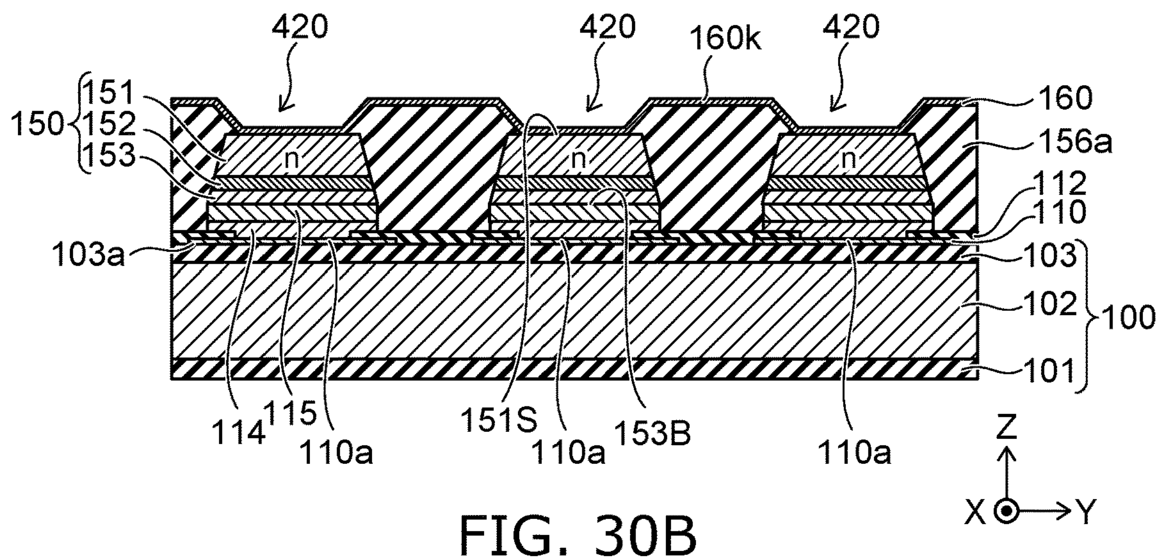
FIG. 30B is a schematic cross-sectional view illustrating a part of the image display device according to the fourth embodiment.
Figure 30C:
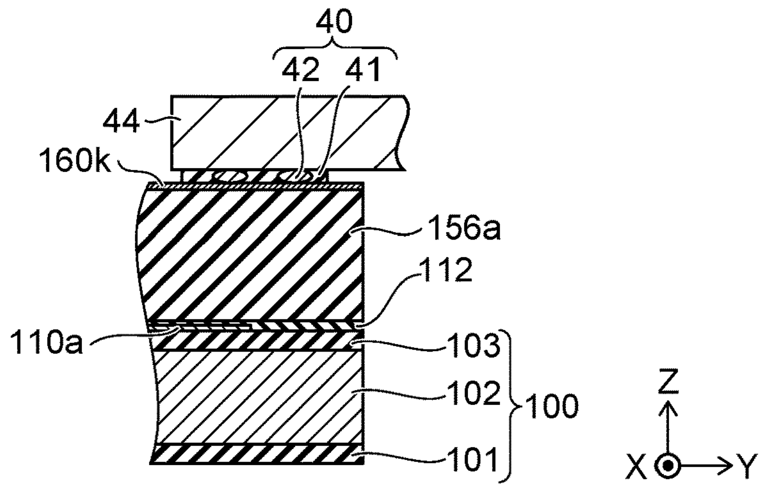
FIG. 30C is a schematic cross-sectional view illustrating a part of the image display device according to the fourth embodiment.

FIGS. 30A to 30C are schematic cross-sectional views illustrating a part of an image display device according to the present embodiment.

FIG. 30A is a cross-sectional view corresponding to the cross-section taken along line A-A' in FIG. 2. FIG. 30B is a cross-sectional view corresponding to the cross-section taken along line AA-AA' in FIG. 2. FIG. 30C is a cross-sectional view corresponding to the cross-section taken along line C-C' in FIG. 2. Because a cross section corresponding to the cross section taken along line B-B' in FIG. 2 is the same as that illustrated in FIG. 4A of the other embodiments described above, illustration and detailed description thereof will be omitted.

As illustrated in FIGS. 30A and 30B, the image display device of the present embodiment includes a plurality of sub-pixels 420. The sub-pixel 420 is different from the other embodiments described above in that the sub-pixel 420 includes an insulating film 156*a*. The same components are denoted by the same reference characters, and detailed description thereof will be omitted as appropriate.

In the present embodiment, the insulating film 156*a* covers the lateral surface of the light-emitting element 150 and is also provided between the adjacent light-emitting elements 150. In this example, the height of the insulating film 156*a* between two adjacent light-emitting elements 150 from the first surface 103 a is set to be higher than the height of the light-emitting surface 151S from the first surface 103*a*. The insulating film 156*a* is formed of a material having light reflectivity. The insulating film 156*a* is formed of, for example, a white resin. By using the white resin for the insulating film 156*a*, light emitted from the light-emitting element 150 in the crosswise direction can be reflected. In addition, by setting the height of the insulating film 156*a* between two adjacent light-emitting elements 150 from the first surface 103*a* higher than the height of the light-emitting surface 151S from the first surface 103*a*, light that tends to spread in the crosswise direction from the light-emitting surface 151S can be reflected. Thus, the light emission efficiency of the light-emitting element 150 is substantially improved.

The white resin is formed by dispersing scattering microparticles having a Mie scattering effect in a silicon-based resin such as spin on glass (SOG) or a transparent resin such as a novolac phenolic resin. The scattering microparticles are colorless or white and have a diameter of about one-tenth to several times the wavelength of light emitted by the light-emitting element 150. The scattering microparticles preferably used have a diameter of about half the wavelength of light. Examples of such scattering microparticles include $TiO_2$, $Al_2O_3$, and ZnO.

Alternatively, the white resin can also be formed by utilizing numerous fine pores or the like dispersed in the transparent resin.

The insulating film 156 formed of an inorganic film such as $SiO_2$ illustrated in FIG. 3A may be treated to have light reflectivity. In the case of whitening $SiO_2$, a $SiO_2$ film or the like formed by, for example, atomic-layer-deposition (ALD) or CVD may be used so as to overlap the SOG or the like.

The insulating film 156*a* may be made of a material having low light transparency. For example, the insulating film 156*a* may be formed of a black resin. By using the black resin for the insulating film 156*a*, the scattering of light in the sub-pixels 420 is suppressed, and stray light is more effectively suppressed. An image display device in which stray light is suppressed can display a sharper image.

As illustrated in FIG. 30C, the second terminal 44 is provided on the light-transmitting electrode 160*k* via the anisotropic conductive member 40. In the present embodiment, because the thickness of the insulating film 156*a* is set to be thicker than the height of the light-emitting surface 151S, the second terminal 44 is electrically connected to the light-transmitting electrode 160*k* provided on the thick insulating film 156*a* via the anisotropic conductive member 40, which is different from the other embodiments described above and otherwise the same as the other embodiments in the other respects.

A method for manufacturing the image display device of the present embodiment will now be described.

In the present embodiment, the step of forming the insulating film 156*a* is different from that in the other embodiments described above, and the other respects are the same as those in the other embodiments. When the insulating film 156*a* is made of an organic resin, a coating step, injection molding by using a mold, or the like is used. When the insulating film 156*a* is made of an inorganic material including $SiO_2$ or the like, the insulating film 156*a* is formed by CVD, ALD, sputtering, or the like as described above.

Effects of the image display device of the present embodiment will now be described. Because the image display device of the present embodiment has a passive matrix structure that does not use a circuit element such as a transistor as in the image display devices of the other embodiments described above, the pitch of the sub-pixels 420 can be shortened. In addition, the image display device includes the sub-pixels 420 each including the insulating film 156*a* having light reflectivity for separating the light-emitting elements 150 from each other. For that reason, the amount of light emitted from the light-emitting surface 151S can be increased by reflecting scattered light or the like reflected by the lateral surface and light emitted obliquely upward. Thus, the substantial light emission efficiency of the light-emitting element 150 can be improved.

Fifth Embodiment

Figure 31A:
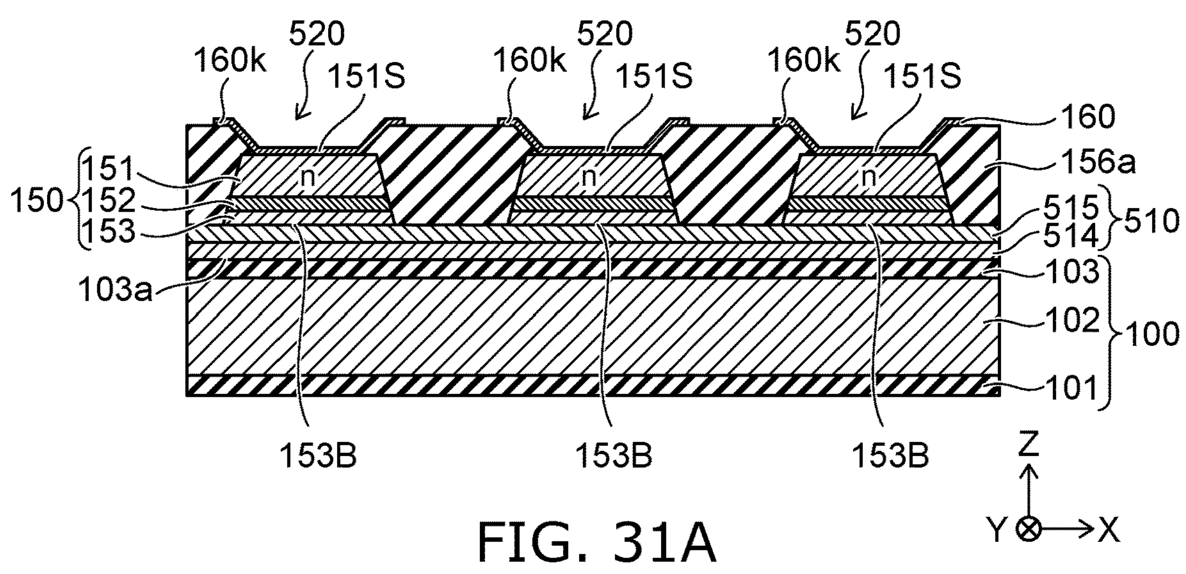
FIG. 31A is a schematic cross-sectional view illustrating a part of an image display device according to a fifth embodiment.
Figure 31B:
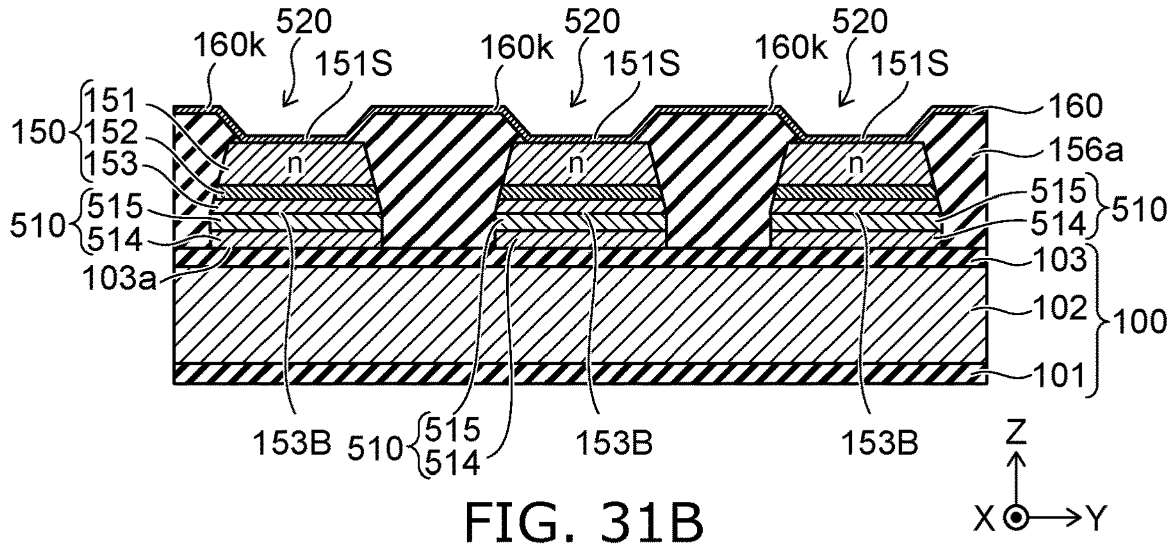
FIG. 31B is a schematic cross-sectional view illustrating a part of the image display device according to the fifth embodiment.
Figure 31C:
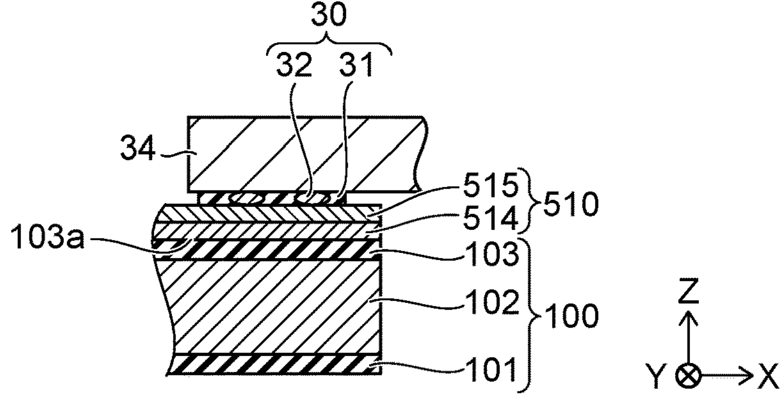
FIG. 31C is a schematic cross-sectional view illustrating a part of the image display device according to the fifth embodiment.

FIGS. 31A to 31C are schematic cross-sectional views illustrating a part of a method for manufacturing an image display device of the present embodiment.

FIG. 31A is a cross-sectional view corresponding to the cross-section taken along line A-A' in FIG. 2. FIG. 31B is a cross-sectional view corresponding to the cross-section taken along line AA-AA' in FIG. 2. FIG. 31C is a cross-sectional view corresponding to the cross-section taken along line B-B' in FIG. 2. Because a cross section corresponding to the cross section taken along line C-C' in FIG. 2 is the same as that illustrated in FIG. 30C of the fourth embodiment described above, illustration and detailed description thereof are omitted.

As illustrated in FIGS. 31A and 31B, the image display device of the present embodiment has sub-pixels 520 each including a metal wiring line 510. The metal wiring line 510 is provided along the X-axis direction instead of the wiring lines 110*a* and 210*k* in the other embodiments described above. Similarly to the wiring lines 110*a* and 210*k*, a plurality of metal wiring lines 510 are provided, and the plurality of metal wiring lines 510 are separated from each other in the Y-axis direction at substantially equal intervals and substantially parallel to each other. The separation distance between the adjacent metal wiring lines 510 is set to be substantially equal to the pitch of the light-emitting elements 150.

On the metal wiring line 510, the light-emitting elements 150 are provided at substantially equal intervals in the X-axis direction. The metal wiring line 510 includes bonding metals 514 and 515, and the bonding metals 514 and 515 are layered and bonded in this order from the first surface 103*a*. The bottom surface 153B of the light-emitting element 150 is in contact with the bonding metal 515, and the p-type semiconductor layer 153 is ohmic-connected to the bonding metal 515. Thus, the p-type semiconductor layer 153 is electrically connected to the first metal wiring line 510 and is electrically connected to the light-emitting element 150 provided adjacent thereto in the X-axis direction.

In this example, the insulating film 156*a* is formed of an insulating material having light reflectivity. However, the insulating film may be formed of a transparent resin as in the first and second embodiments.

As in the first embodiment, the light-transmitting electrode 160*k* is formed along the Y-axis direction and is connected to the light-emitting surfaces 151S of the light-emitting elements 150 arranged along the Y-axis direction.

As illustrated in FIG. 31C, the metal wiring line 510 is provided on the first surface 103*a* of the substrate 100. To be more specific, the bonding metal 514 is provided on the first surface 103*a*, and the bonding metal 515 is provided on the bonding metal 514. The first terminal 34 is provided on the bonding metal 515 via the anisotropic conductive member 30. The first terminal 34 is electrically connected to the metal wiring line 510 via the anisotropic conductive particles 32 of the anisotropic conductive member 30. The binder 31 in the anisotropic conductive member 30 is provided to fix the connection between the first terminal 34 and the metal wiring line 510, as described with reference to FIG. 4A and the like of the other embodiments described above.

A method for manufacturing the image display device of the present embodiment will now be described.

FIGS. 32A, 32B, 33A, 33B, 34A, and 34B are schematic cross-sectional views illustrating a part of the method for manufacturing the image display device of the present embodiment.

Figure 33A:
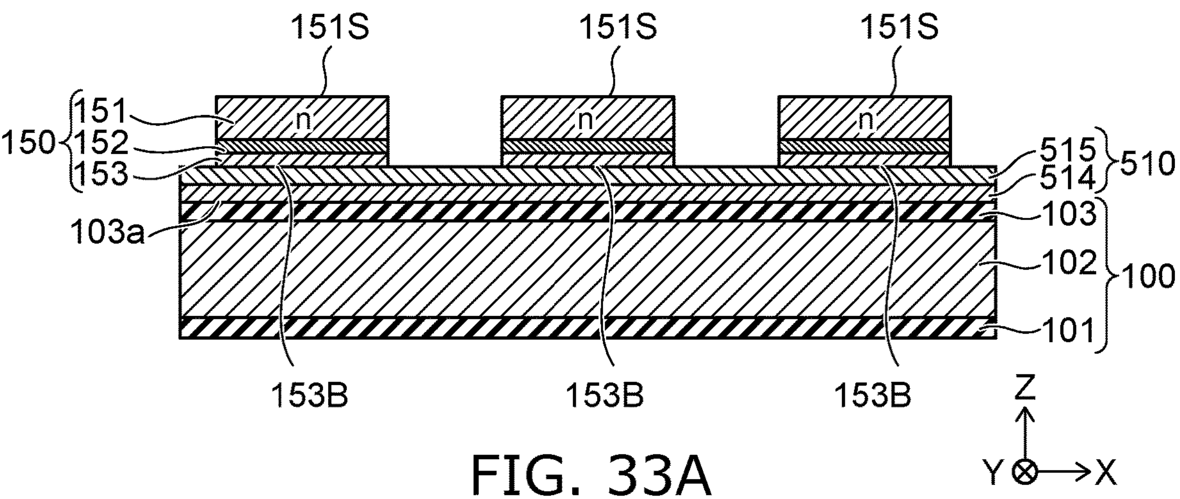
FIG. 33A is a schematic cross-sectional view illustrating a part of the method for manufacturing the image display device of the fifth embodiment.
Figure 34A:
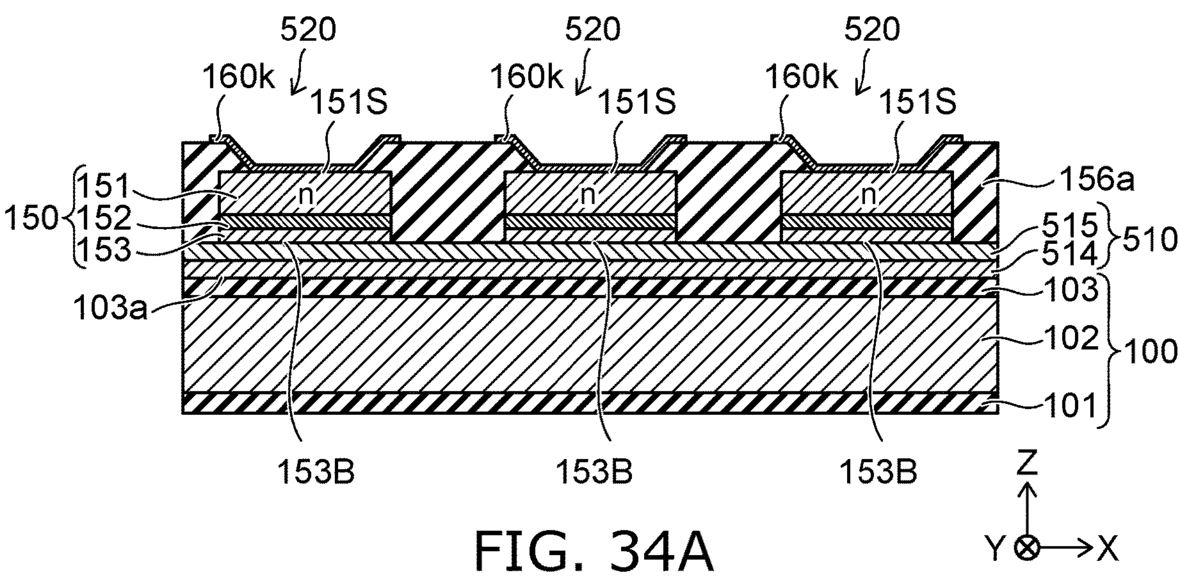
FIG. 34A is a schematic cross-sectional view illustrating a part of the method for manufacturing the image display device of the fifth embodiment.

FIGS. 33A and 34A are cross-sectional views corresponding to the cross-section taken along line A-A' in FIG. 2.

Figure 33B:
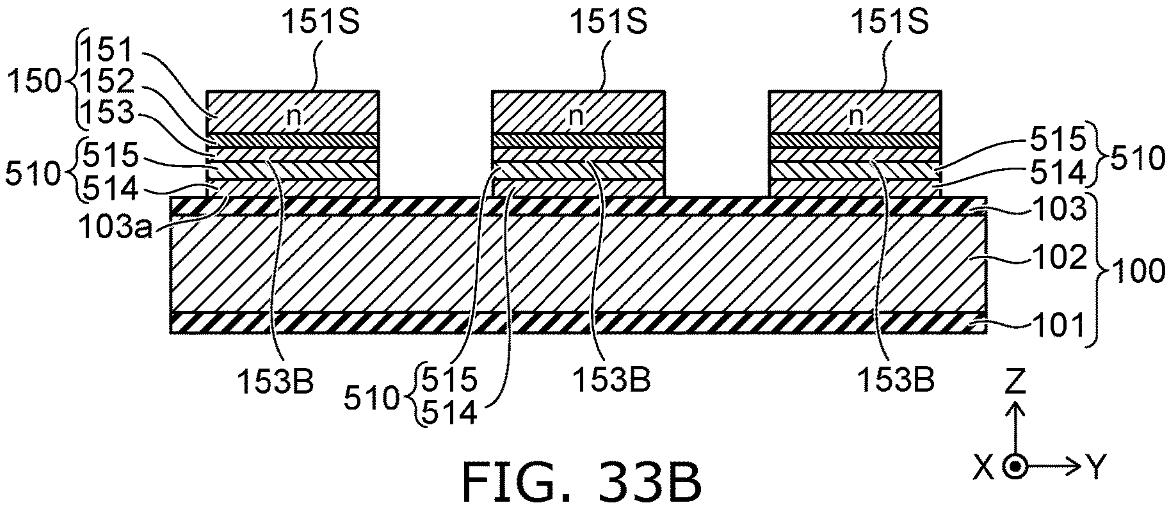
FIG. 33B is a schematic cross-sectional view illustrating a part of the method for manufacturing the image display device of the fifth embodiment.
Figure 34B:
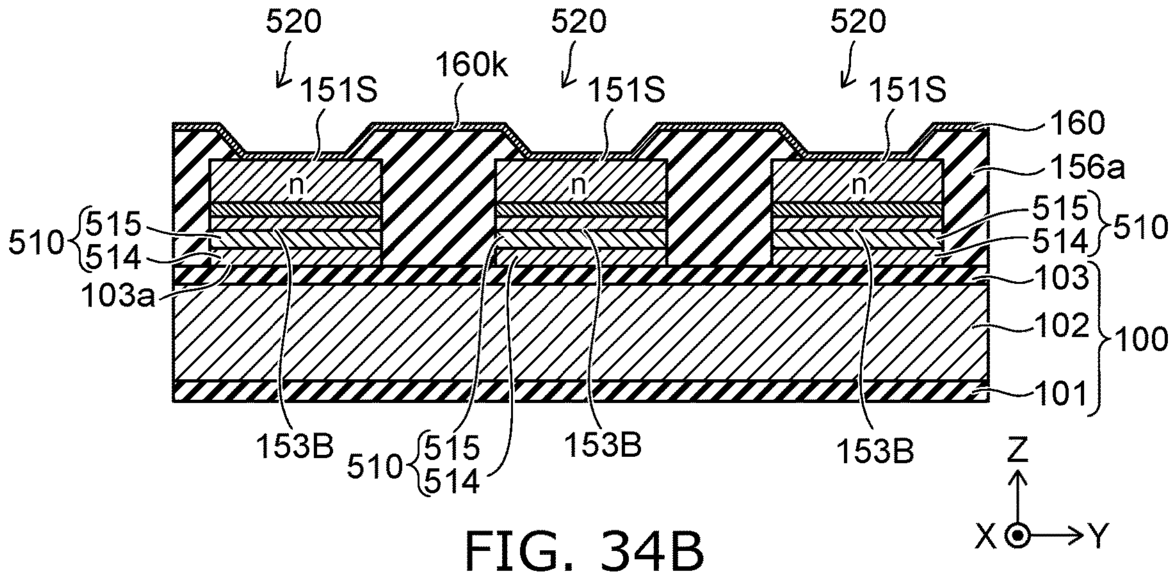
FIG. 34B is a schematic cross-sectional view illustrating a part of the method for manufacturing the image display device of the fifth embodiment.

FIGS. 33B and 34B are cross-sectional views corresponding to the cross-section taken along line AA-AA' in FIG. 2.

Figure 32A:
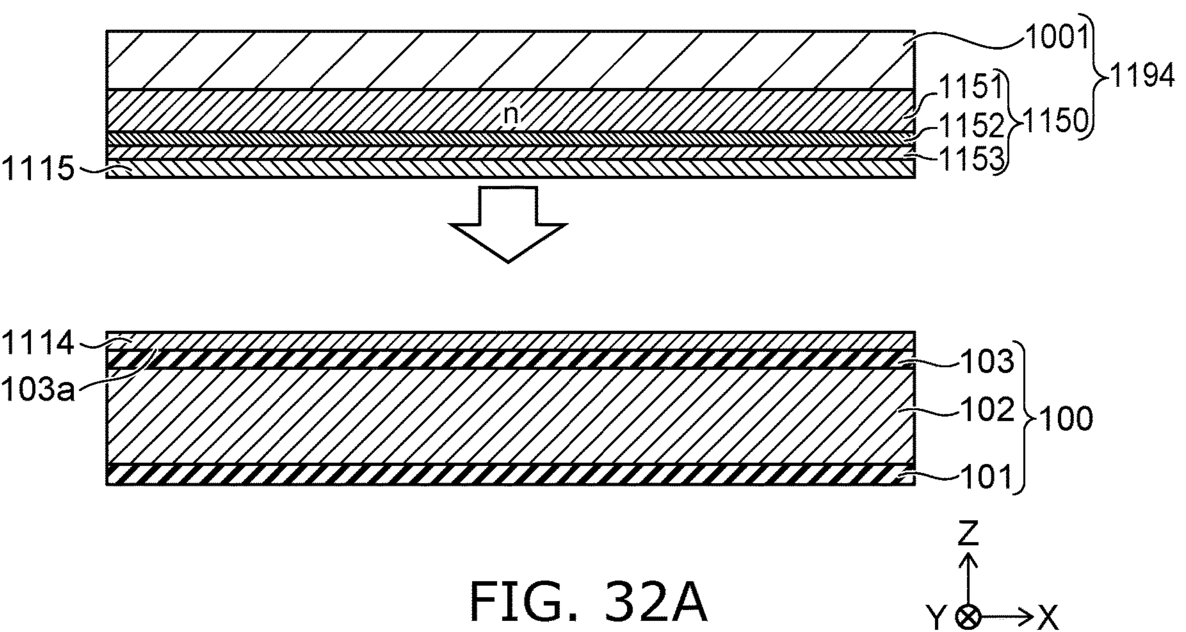
FIG. 32A is a schematic cross-sectional view illustrating a part of a method for manufacturing the image display device of the fifth embodiment.

As illustrated in FIG. 32A, the semiconductor growth substrate 1194 is provided, and the metal layer 1115 is formed on the p-type semiconductor layer 1153 of the semiconductor growth substrate. The semiconductor growth substrate 1194 is joined to the first surface 103*a* of the substrate 100 via the metal layers 1115 and 1114. The step of joining the semiconductor layer 1150 and the substrate 100 via the metal layers 1114 and 1115 has been described with reference to FIG. 10A in the above-described other embodiments and is thus omitted.

Figure 32B:
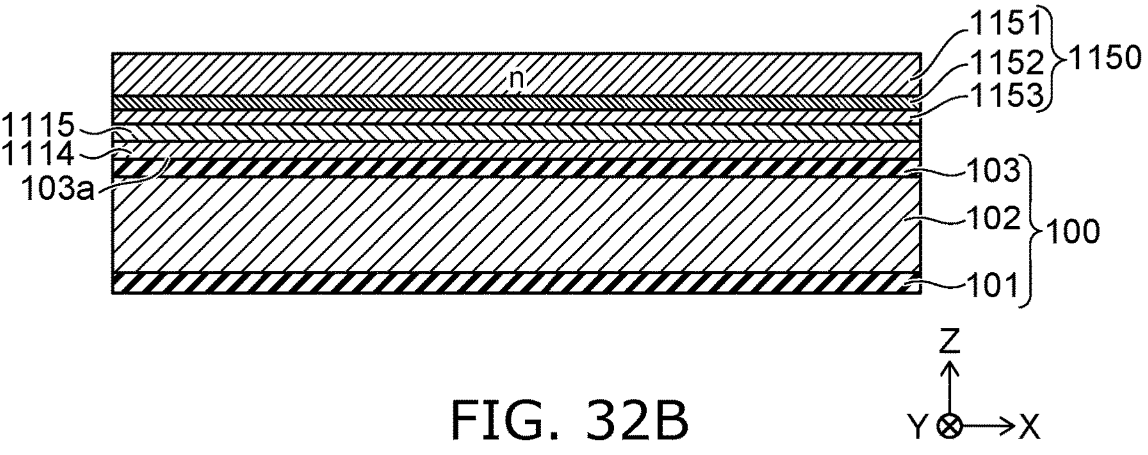
FIG. 32B is a schematic cross-sectional view illustrating a part of the method for manufacturing the image display device of the fifth embodiment.

As illustrated in FIG. 32B, the crystal growth substrate 1001 illustrated in FIG. 32A is removed by wet etching or laser lift-off.

As illustrated in FIGS. 33A and 33B, the metal layers 1115 and 1114 illustrated in FIG. 32B are processed by etching to form the metal wiring line 510. The plurality of metal wiring lines 510 are divided to be separate from each other in the Y-axis direction at substantially equal intervals and to be substantially parallel to each other, thereby forming individual metal wiring lines 510. The metal layers 1115 and 1114 illustrated in FIG. 32B are continuously etched by using the same mask.

The semiconductor layer 1150 illustrated in FIG. 32B is processed by etching, and the light-emitting elements 150 are formed as illustrated in FIGS. 33A and 33B. In this example, the light-emitting element 150 has a cylindrical shape whose diameter is substantially equal in the height direction of the light-emitting element 150 but may have a prismatic shape. Further, as in the other embodiments described above, the shape may be a truncated cone shape or a truncated pyramid shape.

As illustrated in FIGS. 34A and 34B, the insulating film 156*a* is formed to cover the first surface 103*a*, the metal wiring lines 510, and the light-emitting elements 150. In this example, the insulating film 156*a* is formed of an insulating material having light reflectivity. The insulating film 156*a* is formed such that the height of the insulating film 156*a* from the first surface 103*a* is higher than the height of the light-emitting surface 151S from the first surface 103 a.

A portion of the insulating film 156*a* on the light-emitting element 150 is removed to expose the light-emitting surface 151S. The light-transmitting wiring layer 160 including the plurality of light-transmitting electrodes 160*k* is formed on the insulating film 156*a* and the light-emitting surfaces 151S. The light-transmitting electrodes 160*k* are formed along the Y-axis direction, separated from each other in the X-axis direction at substantially equal intervals, and substantially parallel to each other.

Thereafter, if necessary, a color filter is provided above the light-emitting surface 151S.

Thus, the sub-pixel 520 is formed.

Effects of the image display device of the present embodiment will now be described. Because the image display device of the present embodiment has a passive matrix structure that does not use a circuit element such as a transistor as in the image display devices of the other embodiments described above, the pitch of the sub-pixels 520 can be shortened. In addition, the sub-pixel 520 of the image display device includes the metal wiring line 510, and the metal wiring line is used as a wiring line connected to the row selection circuit 5. Because the metal wiring line 510 is formed by the metal layers 1114 and 1115 each having sufficient thickness, the resistance of the metal wiring line 510 in the routing direction can be reduced. For that reason, even when a current flows through the light-emitting element 150 provided in a column away from the row selection circuit 5 in the display region 2 illustrated in FIG. 2, a voltage drop of the metal wiring line 510 can be suppressed. Thus, the voltage of the DC power supply to be supplied to the row selection circuit 5 can be set lower, and the power consumption of the image display device can be reduced. When the voltage of the DC power supply to be supplied to the row selection circuit 5 is allowed to be set high to some extent, a sufficient voltage can be supplied also to the light-emitting element provided even at a position farther away from the row selection circuit 5, so that an image display device with a larger screen size can be implemented.

In the image display device of the present embodiment, the metal wiring line 510 can be used instead of the wiring line 110*a* in the other embodiments described above. The metal wiring line 510 also functions as a bonding metal in other embodiments. For that reason, the step of forming the wiring layer 110 including the plurality of wiring lines 110*a* and the insulating layer 112 can be omitted. Thus, the manufacturing step of the image display device can be shortened, and cost reduction, improvement in productivity, and the like can be achieved.

Sixth Embodiment

Figure 35:
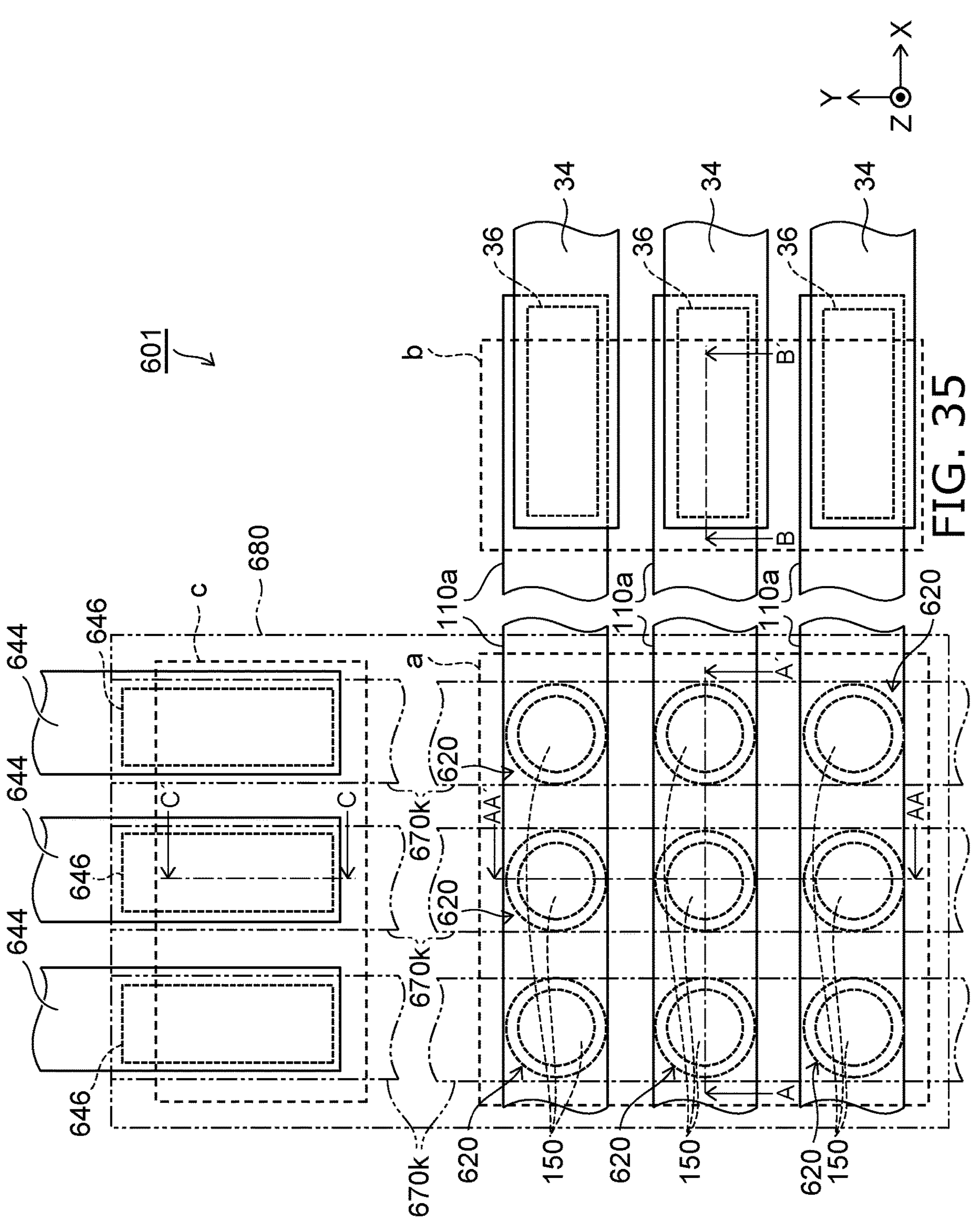
FIG. 35 is a schematic plan view illustrating a part of an image display device according to a sixth embodiment.

FIG. 35 is a schematic plan view illustrating a part of an image display device according to the present embodiment.

FIG. 35 illustrates enlarged views of the portions a, b, and c illustrated in FIG. 1. The portion a corresponds to a part of the display region 2 illustrated in FIG. 1. The portion b is a portion corresponding to a part of the region extending over the display region 2 and the row wiring region 6 illustrated in FIG. 1. The portion c is a portion corresponding to a part of the region extending over the display region 2 and the column wiring region 8 illustrated in FIG. 1.

As illustrated in FIG. 35, the image display device 601 of the present embodiment includes the wiring lines 110*a*, the light-emitting elements 150, a light-transmitting electrodes 670*k*, the first terminals 34, a second terminals 644, and a light-transmitting substrate 680. In the present embodiment, the image display device 601 is different from the above-described other embodiments in that the image display device 601 includes the light-transmitting substrate 680. In the image display device 601 of the present embodiment, the configuration of the second terminal 644 is different from that of the other embodiments described above. Furthermore, in the image display device 601 of the present embodiment, the configuration of the sub-pixel 620 is different from that of the other embodiments described above. Components that are the same as those of the other embodiments described above are denoted by the same reference characters, and detailed descriptions thereof will be omitted as appropriate.

In the image display device 601, the light-transmitting substrate 680 is provided so as to cover the display region 2 illustrated in FIG. 1. The light-transmitting substrate 680 is provided so as to cover a part of the column wiring region 8 illustrated in FIG. 1 beyond the display region 2. The light-transmitting substrate 680 is, for example, a glass substrate. The light-transmitting electrode 670*k* is provided along the Y-axis direction. A plurality of light-transmitting electrodes 670*k* are provided. The plurality of light-transmitting electrodes 670*k* are separated from each other in the X-axis direction at substantially equal intervals so as to be substantially parallel to each other. The light-transmitting substrate 680 and the light-transmitting electrodes 670*k* are provided above the light-emitting elements 150 as will be described below with reference to FIG. 36A and subsequent drawings and are indicated by the two-dot chain lines in FIG. 35.

The sub-pixel 620 of the image display device 601 is different from the above-described other embodiments in that the light-transmitting substrate 680 is provided above the light-emitting elements 150. The second terminal 644 is different from that in the other embodiments described above in that the second terminal 644 is connected to the light-transmitting electrode 670*k* provided on the light-transmitting substrate 680. The same components as those in the other embodiments are denoted by the same reference characters, and detailed description thereof will be omitted as appropriate.

Figures 36A, 36B, 36C:
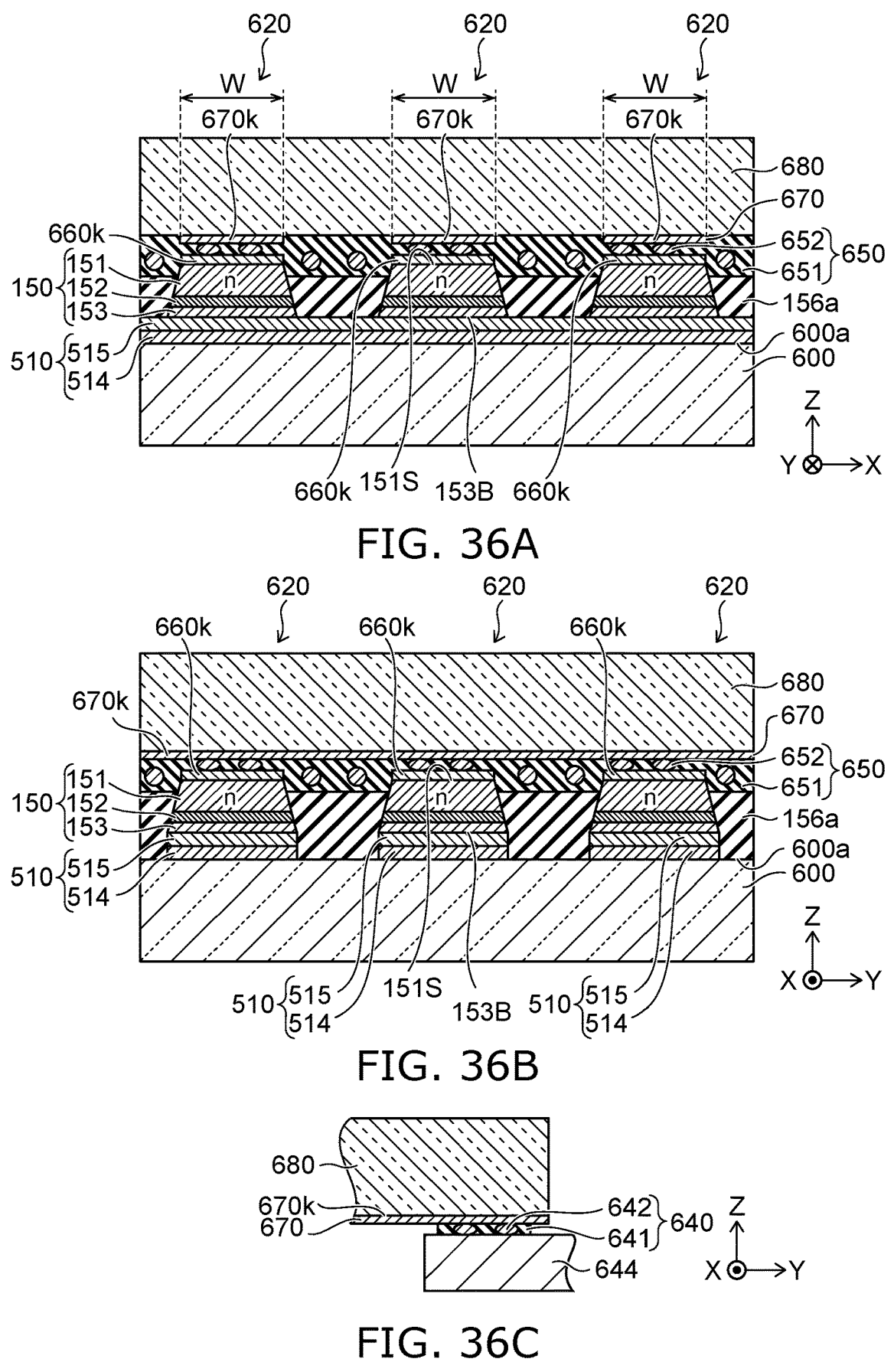

FIGS. 36A to 36C are schematic cross-sectional views illustrating a part of the image display device according to the present embodiment.

FIG. 36A is a cross-sectional view taken along line A-A' of FIG. 35. FIG. 36B is a cross-sectional view taken along line AA-AA' in FIG. 35. FIG. 36C is a cross-sectional view taken along line C-C' of FIG. 35. Because the cross section taken along line B-B' in FIG. 35 is the same as that illustrated in FIG. 4A of the other embodiments described above, illustration and detailed description thereof will be omitted.

It is assumed that the example described in the present embodiment is a monochrome image display device without a color filter. Hereinafter, because one sub-pixel constitutes one pixel, the one pixel is referred to as a sub-pixel.

As illustrated in FIGS. 36A and 36B, the metal wiring line 510 and the insulating film 156*a* are provided on a first surface 600*a* which is one surface of a substrate 600. In this example, the substrate 600 is a substrate having light-transmitting properties, for example, a glass substrate. Instead of the glass substrate, a Si substrate having oxide films formed on both surfaces thereof may be used as in the other embodiments described above. The first surface 600*a* is a flat surface substantially parallel to the XY plane. The metal wiring line 510 is the same as that in the fifth embodiment. The metal wiring line 510 is provided along the X-axis direction. A plurality of metal wiring lines 510 are provided, and the plurality of metal wiring lines 510 are separated from each other in the Y-axis direction at substantially equal intervals so as to be substantially parallel to each other. Instead of the metal wiring line 510, as in the first embodiment, the bonding metals 114 and 115 may be provided for each of the light-emitting elements on the wiring line 110*a* illustrated in FIG. 3A or the like.

As in the fifth embodiment, the plurality of light-emitting elements (first light-emitting elements or second light-emitting elements) 150 are provided on the metal wiring line 510, and the bottom surfaces (first bottom surfaces or second bottom surfaces) 153B are in contact with the bonding metal 515. Thus, the p-type semiconductor layer 153 is electrically connected to the metal wiring line 510. A plurality of light-emitting elements 150 are arranged on the metal wiring line 510, and arrays of the plurality of light-emitting elements are provided on each of the metal wiring lines 510 so as to be separate from each other in the Y-axis direction at substantially equal intervals.

A light-transmitting electrode (third light-transmitting electrode or fourth light-transmitting electrode) 660*k* is provided over the light-emitting surface 151S. The light-transmitting electrode 660*k* is provided on the light-emitting surface (first light-emitting surface or second light-emitting surface) 151S of each of the plurality of light-emitting elements 150. The light-transmitting electrodes 660*k* are provided separately for each light-emitting element 150 between an anisotropic conductive member 650 and the light-emitting surface 151S. By providing the light-transmitting electrode 660*k* for each light-emitting surface 151S, the connection resistance when the light-transmitting electrode 660*k* is connected to the anisotropic conductive member 650 can be reduced compared to the connection resistance when the light-transmitting electrode 660*k* is not provided.

The insulating film 156*a* is provided to cover the first surface 600*a*, the metal wiring lines 510, the p-type semiconductor layers 153, and the light-emitting layers 152. The insulating film 156*a* cover the lateral surface of the n-type semiconductor layer 151 and does not cover the light-emitting surface 151S and the lateral surface of the n-type semiconductor layer 151 in the vicinity of the light-emitting surface 151S in order to ensure light transparency of a portion above the light-emitting surface 151S.

The anisotropic conductive member (third anisotropic conductive member) 650 is provided on the insulating film 156*a*, a portion of the lateral surface of the n-type semiconductor layer 151 that is not covered with the insulating film 156*a*, and the light-transmitting electrode 660*k*. The anisotropic conductive member 650 includes a binder 651 and anisotropic conductive particles 652. The binder 651 has the same function as the binders 31 and 41 illustrated in FIGS. 4A and 4B but is made of a material having light transparency. The binder 651 may be formed of the same material as that of the binders 31 and 41 or may be formed of a different material as long as it has light transparency. The binder 651 functions as an adhesive that fixes the light-transmitting electrode 660*k* and the light-transmitting electrode 670*k* that face each other. The anisotropic conductive particles 652 have the same function as that of the anisotropic conductive particles 32 and 42 illustrated in FIGS. 4A and 4B. The anisotropic conductive particles 652 may be formed of the same configuration and material as the anisotropic conductive particles 32 and 42 or may be different therefrom. The anisotropic conductive particles 652 electrically connect the light-transmitting electrode 660*k* and the light-transmitting electrode 670*k* that face each other.

The light-transmitting electrode 670*k* is provided on the light-transmitting electrode 660*k* via an anisotropic conductive member 650. The light-transmitting electrode 670*k* is provided along the Y-axis direction. A plurality of light-transmitting electrodes 670*k* are provided, and the plurality of light-transmitting electrodes 670*k* are separated from each other in the X-axis direction at substantially equal intervals so as to be substantially parallel to each other.

The plurality of light-emitting elements 150 and the plurality of light-transmitting electrodes 660*k* are disposed along the X-axis direction on the metal wiring line 510. The anisotropic conductive member 650 is provided between the light-transmitting electrode 670*k* and the light-transmitting electrode 660*k* and is also provided between the light-transmitting electrodes 670*k* adjacent to each other in the X-axis direction. Furthermore, the anisotropic conductive member 650 is also provided between the light-transmitting electrodes 660*k* adjacent to each other in the X-axis direction and is also provided between adjacent n-type semiconductor layers 151 in the X-axis direction.

The anisotropic conductive member 650 is also provided between the light-transmitting electrodes 660*k* adjacent to each other in the Y-axis direction and is also provided between the n-type semiconductor layers 151 of the light-emitting elements 150 adjacent to each other in the Y-axis direction.

Each of the light-transmitting electrodes 670*k* is provided on the light-transmitting electrodes 660*k* via the anisotropic conductive member 650. The anisotropic conductive particles 652 of the anisotropic conductive member 650 are in a conductive state in the region of a width W of the light-transmitting electrode 670*k* illustrated in FIG. 36A. The anisotropic conductive particles 652 are in a non-conductive state in a region between the light-transmitting electrode 670*k* and another light-transmitting electrode 670*k* provided adjacent to the light-transmitting electrode 670*k* in the X-axis direction. Thus, the light-transmitting electrode 660*k* is electrically connected to the light-transmitting electrode 670*k* provided to face the light-transmitting electrode 660*k* via the third anisotropic conductive member 650.

The light-transmitting substrate 680 is provided on the third anisotropic conductive member 650. The light-transmitting substrate 680 is a substrate having light-transmitting properties and is, for example, a glass substrate.

As illustrated in FIG. 36C, the second terminal 644 is connected to the light-transmitting electrode 670*k* formed on the light-transmitting substrate 680 via an anisotropic conductive member (second anisotropic conductive member) 640. The anisotropic conductive member 640 includes a binder 641 and anisotropic conductive particles 642. The configurations, materials, and functions of the binder 641 and the anisotropic conductive particles 642 are the same as those of the binder 651 and the anisotropic conductive particles 652. The anisotropic conductive particles 642 are in contact with the light-transmitting electrode 670*k* and the second terminal 644 and electrically connect the light-transmitting electrode 670*k* and the second terminal 644.

A plurality of second terminals 644 are provided, and the plurality of second terminals 644 are separated from each other in the X-axis direction at substantially equal intervals so as to be substantially parallel to each other. The anisotropic conductive members 640 are provided between the plurality of light-transmitting electrodes 670*k* and the plurality of second terminals 644, respectively. The anisotropic conductive member 640 is also provided between the light-transmitting electrodes 670*k* adjacent to each other in the X-axis direction and is also provided between the second terminals (third terminals) 644 adjacent to each other in the X-axis direction.

The n-type semiconductor layer 151 is electrically connected to the current drive circuit 7 illustrated in FIG. 1 via the light-transmitting electrode 660*k*, the anisotropic conductive member 650, and the light-transmitting electrode 670*k*.

Figure 37:
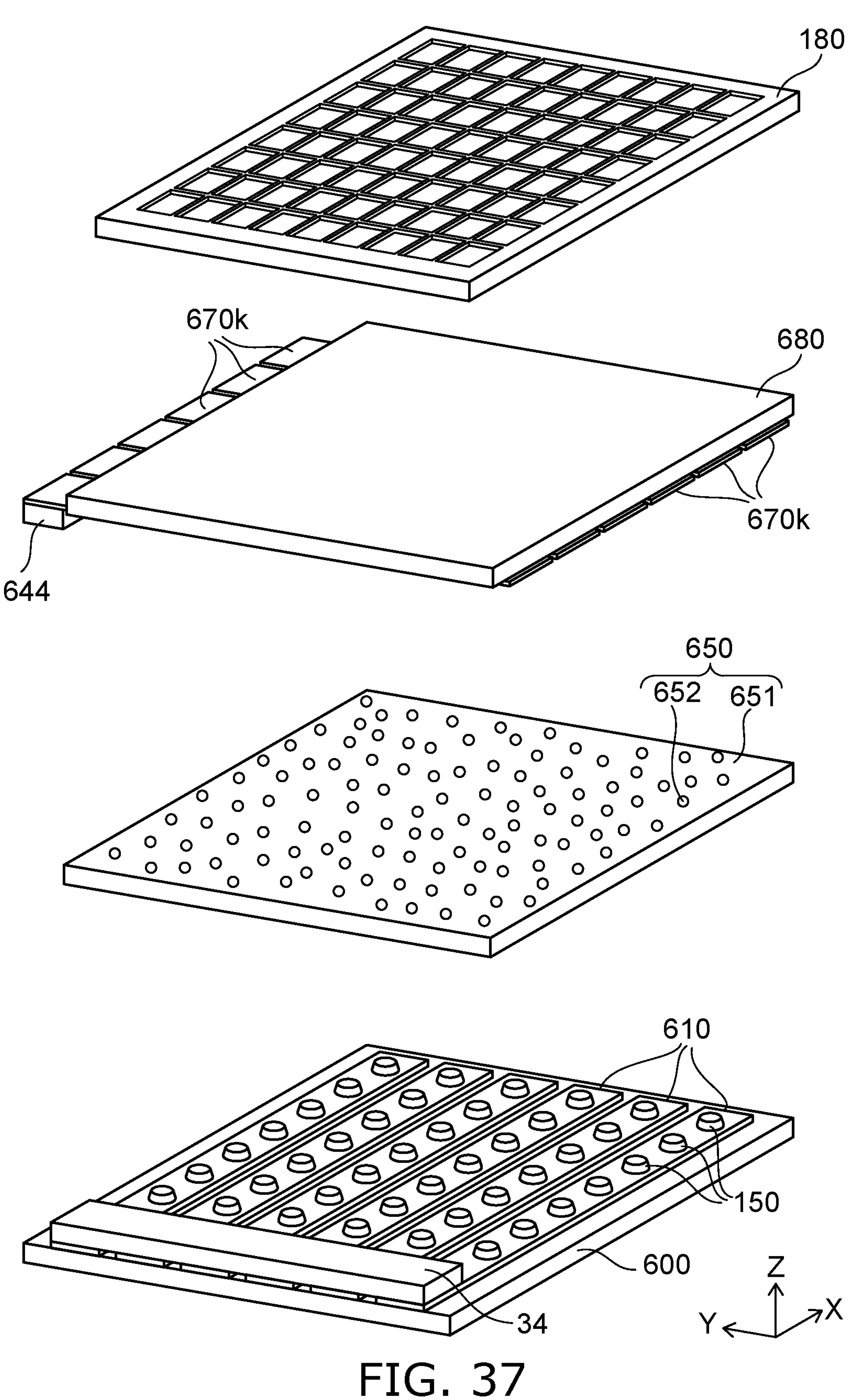
FIG. 37 is a schematic perspective view illustrating the image display device of the sixth embodiment.

FIG. 37 is a schematic perspective view illustrating the image display device of the present embodiment.

As illustrated in FIG. 37, the image display device of the present embodiment includes a large number of the light-emitting elements 150 arranged in a matrix on the substrate 600. The region in which a large number of light-emitting elements 150 are arranged is the display region 2 illustrated in FIG. 1, and the first terminal 34 is provided at an end portion of the display region 2. The anisotropic conductive member 650 including the binder 651 and the anisotropic conductive particles 652 is provided on the light-emitting elements 150 arranged in a matrix. The light-transmitting substrate 680 on which light-transmitting electrodes 670*k* are formed is provided on the anisotropic conductive member 650. The light-transmitting electrodes 670*k* are formed facing the anisotropic conductive member 650, and the light-transmitting electrodes 670*k* and the light-emitting elements 150 arranged in a matrix are electrically connected to each other via the anisotropic conductive member 650 as described above.

As illustrated in the example of FIG. 37, the color filter 180 can be further provided on the light-transmitting substrate 680. In a case in which the color filter 180 is provided, the thickness of the light-transmitting substrate 680 may be reduced in order to reduce loss when light is transmitted through the light-transmitting substrate 680.

FIG. 37 illustrates an example in which the light-transmitting electrodes 670*k* are connected to the light-emitting elements 150 via the anisotropic conductive member 650; however, in an aspect in which the light-transmitting electrodes 160*k* are directly provided on the light-emitting elements 150 in the other embodiments described above, a large number of light-emitting elements 150 are also arranged in a matrix as in this example.

A method for manufacturing the image display device of the present embodiment will now be described.

Figures 38A, 38B:
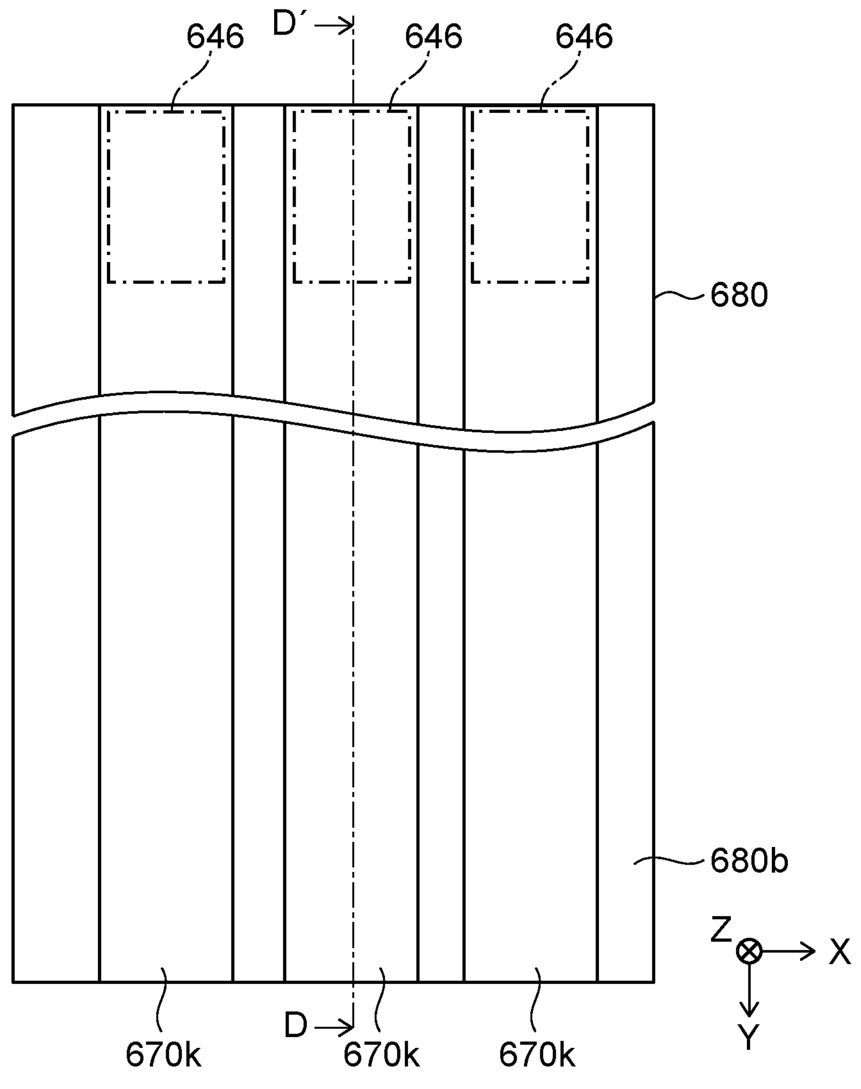
FIG. 38A is a schematic bottom view illustrating a part of a method for manufacturing the image display device of the sixth embodiment.
FIG. 38B is a schematic cross-sectional view illustrating a part of the method for manufacturing the image display device of the sixth embodiment.

FIG. 38A is a bottom view illustrating a part of the method for manufacturing the image display device of the present embodiment.

FIG. 38B is a cross-sectional view illustrating a part of the method for manufacturing the image display device of the present embodiment.

FIG. 38A is a bottom view of the light-transmitting substrate 680 viewed from the negative direction to the positive direction of the Z-axis. FIG. 38B is a cross-sectional view taken along line D-D' of FIG. 38A.

As illustrated in FIGS. 38A and 38B, the light-transmitting substrate (fourth substrate) 680 has a first surface 680*a* and a second surface 680*b*. The second surface 680*b* is a surface opposite to the first surface 680*a*. The plurality of light-transmitting electrodes (first light-transmitting electrodes or second light-transmitting electrodes) 670*k* are formed on the second surface 680*b*. For the light-transmitting electrodes 670*k*, for example, a light-transmitting conductive film is formed over the second surface 680*b*, and the light-transmitting conductive film is etched to form the light-transmitting electrodes 670*k* along the Y-axis direction. In FIG. 38A, it is illustrated that an end portion of the light-transmitting electrode 670*k* serves as a connection region 646.

Figure 39A:
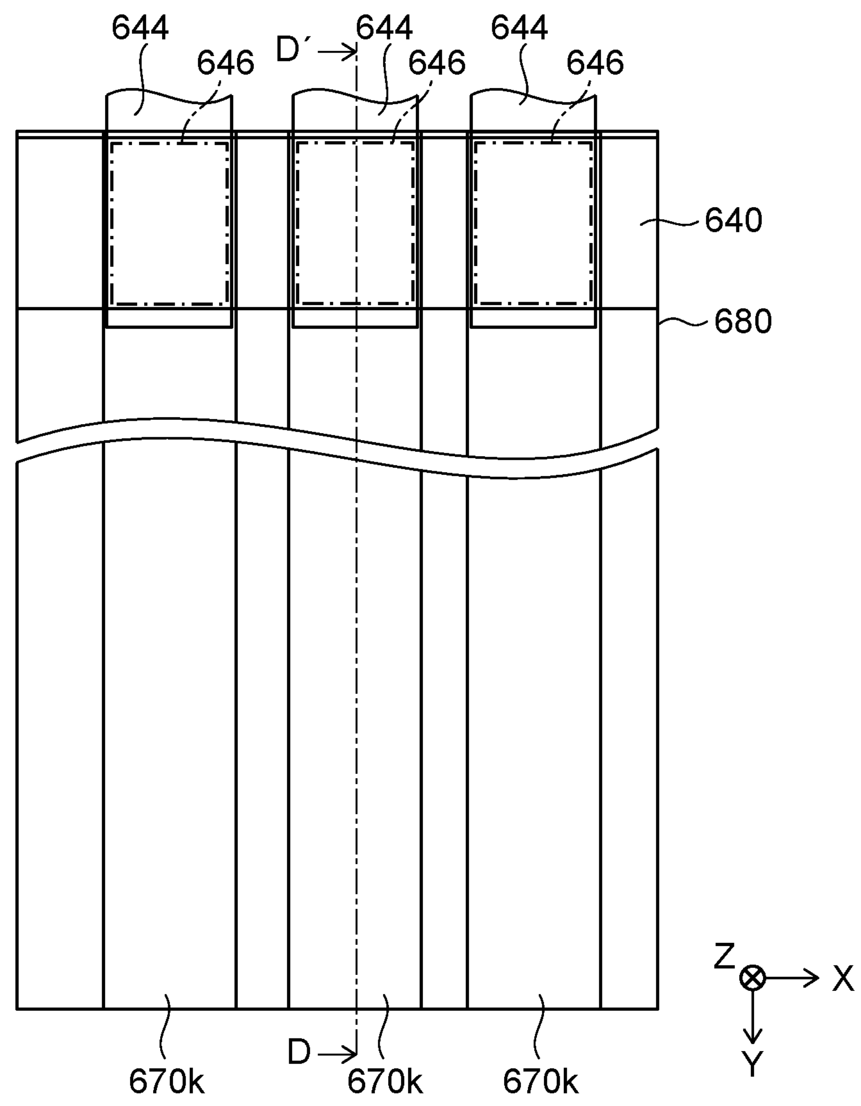
FIG. 39A is a schematic bottom view illustrating a part of the method for manufacturing the image display device of the sixth embodiment.

FIG. 39A is a bottom view illustrating a part of the method for manufacturing the image display device of the present embodiment.

Figure 39B:
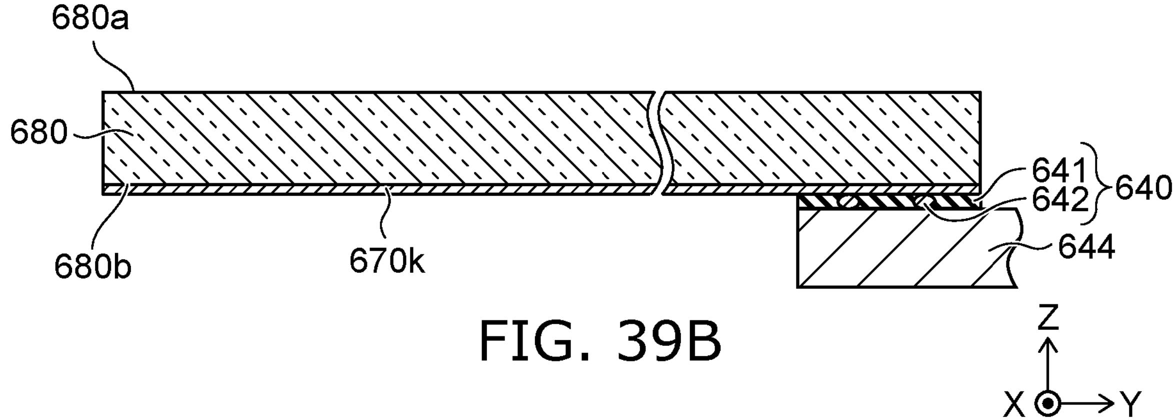
FIG. 39B is a schematic cross-sectional view illustrating a part of the method for manufacturing the image display device of the sixth embodiment.

FIG. 39B is a cross-sectional view illustrating a part of the method for manufacturing the image display device of the present embodiment.

FIG. 39A is a bottom view of the light-transmitting substrate 680 viewed from the negative direction to the positive direction of the Z-axis. FIG. 39B is a cross-sectional view taken along line D-D' of FIG. 39A.

As illustrated in FIGS. 39A and 39B, each of the plurality of light-transmitting electrodes (first light-transmitting electrodes or second light-transmitting electrodes) 670*k* is electrically connected to the corresponding one of the plurality of second terminals (second terminals or third terminals) 644 via the anisotropic conductive member 640. For example, the anisotropic conductive member 640 is applied or attached to the end portion of the second surface 680*b* over the X-axis direction such that the anisotropic conductive member 640 covers the connection regions 646. That is, the anisotropic conductive member 640 is also provided in a region between two adjacent connection regions 646.

The light-transmitting substrate 680 and the second terminal 644 are pressed in the Z-axis direction and heated to electrically connect the light-transmitting electrode 670*k* and the second terminal 644 via the anisotropic conductive particles 642 in the connection region 646. Because the binder 641 containing the heat-curable adhesive is cured by heating, the second terminal 644 is fixed while the second terminal 644 maintains electrical connection with the light-transmitting electrode 670*k*.

Figure 40A:
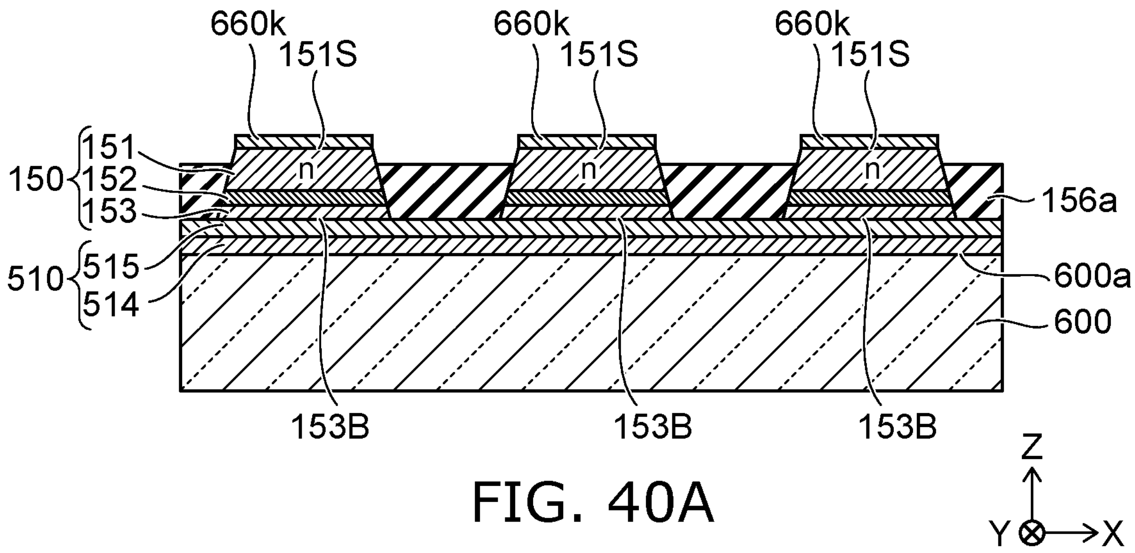
FIG. 40A is a schematic cross-sectional view illustrating a part of the method for manufacturing the image display device of the sixth embodiment.
Figure 40B:
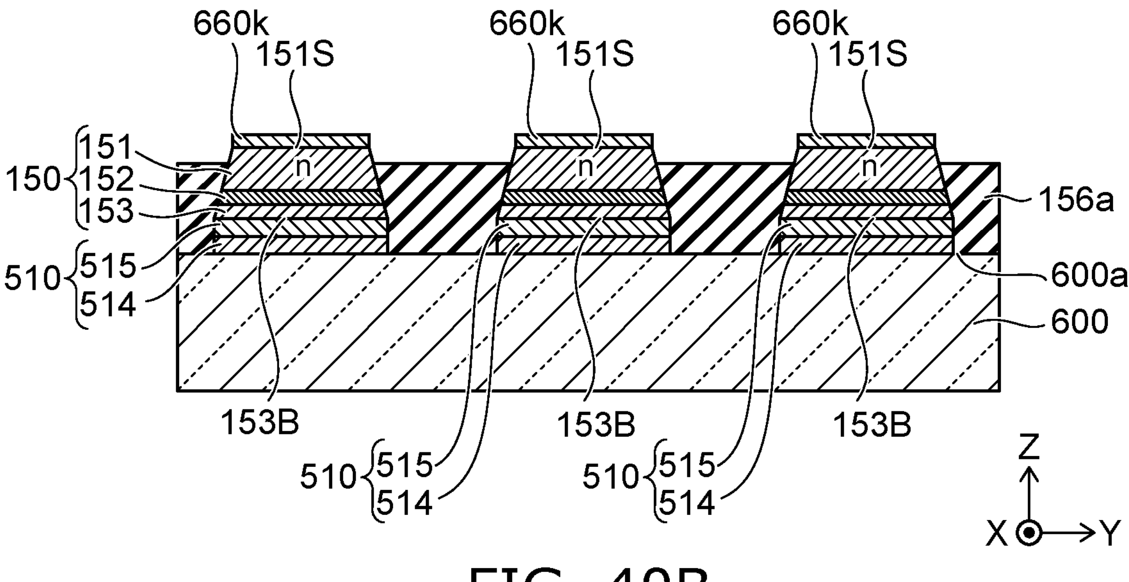
FIG. 40B is a schematic cross-sectional view illustrating a part of the method for manufacturing the image display device of the sixth embodiment.

FIGS. 40A and 40B are schematic cross-sectional views illustrating a part of the method for manufacturing the image display device of the present embodiment.

FIGS. 40A, 41A, 42A and 43A are cross-sectional views corresponding to the cross section taken along line A-A' in FIG. 35.

FIGS. 40B, 41B, 42B and 43B are cross-sectional views corresponding to the cross-section taken along line AA-AA' in FIG. 35.

In the subsequent manufacturing steps, the same configurations as that described in FIGS. 32A and 32B of the fifth embodiment are applied. The steps after the steps of FIGS. 32A and 32B will be described below.

As illustrated in FIGS. 40A and 40B, the light-transmitting electrode 660*k* is formed on the light-emitting surface 151S for each light-emitting element 150. In the step of forming the light-transmitting electrode 660*k*, for example, a light-transmitting conductive film is formed on the n-type semiconductor layer 1151 illustrated in FIGS. 32A and 32B, and the light-transmitting electrode 660*k* is formed by processing the conductive film by etching. Thereafter, the semiconductor layer 1150 illustrated in FIGS. 32A and 32B is processed by etching to form the light-emitting element 150.

Figure 41A:
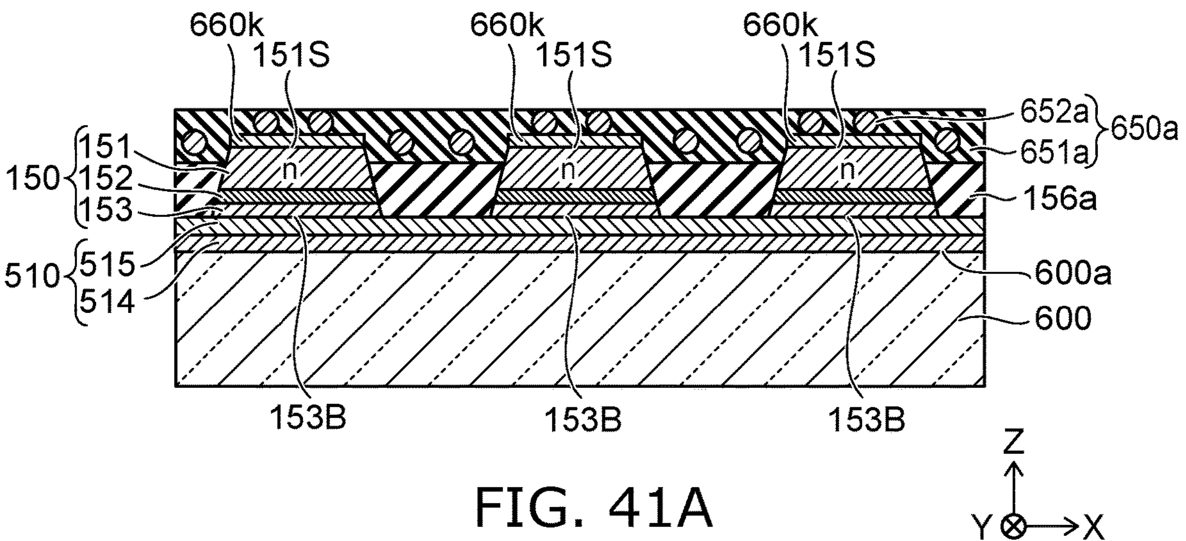
FIG. 41A is a schematic cross-sectional view illustrating a part of the method for manufacturing the image display device of the sixth embodiment.
Figure 41B:
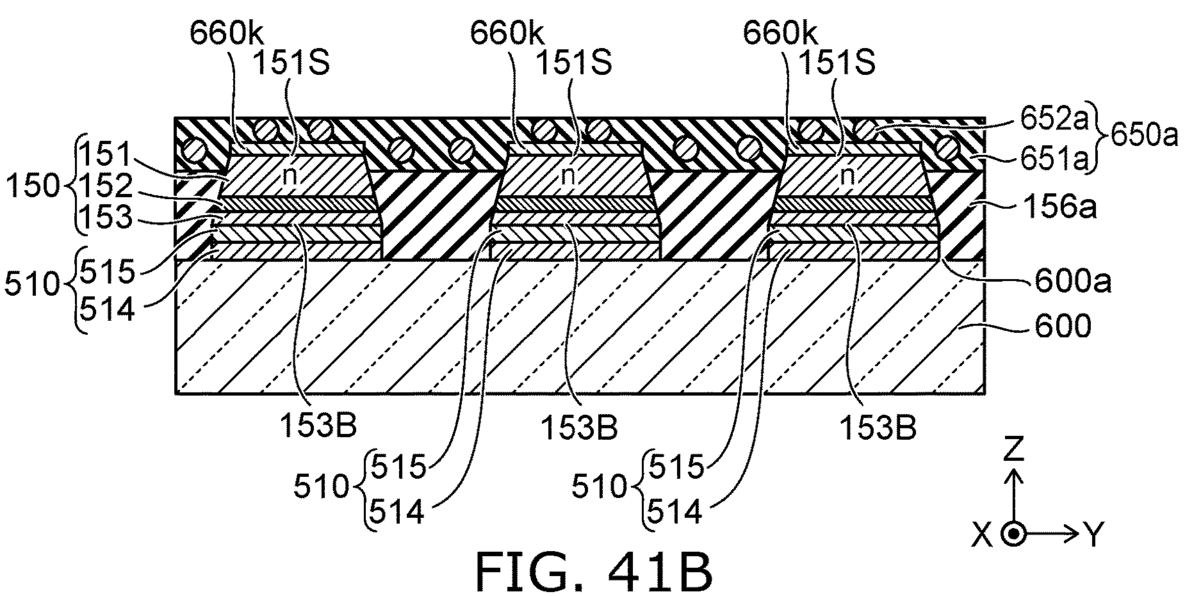
FIG. 41B is a schematic cross-sectional view illustrating a part of the method for manufacturing the image display device of the sixth embodiment.

As illustrated in FIGS. 41A and 41B, the anisotropic conductive member 650*a* is applied or attached so as to cover the insulating film 156*a*, the light-emitting elements 150, and the light-transmitting electrodes 660*k*. In this example, in the light-emitting element 150, the lateral surface of the n-type semiconductor layer 151 not covered with the insulating film 156*a* is covered with the anisotropic conductive member 650*a*. The anisotropic conductive member 650*a* is provided on the light-transmitting electrode 660*k* and is also provided between the adjacent light-emitting elements 150.

The anisotropic conductive member 650*a* includes a binder 651*a* and anisotropic conductive particles 652*a*. The binder 651*a* and the anisotropic conductive particles 652*a* are in an initial state because they are not pressurized and heated. In the initial state, the binder 651*a* is in a state of having fluidity and viscosity and is in a state of not exhibiting adhesive force. The anisotropic conductive particles 652*a* are not conductive in any direction in the initial state.

Figure 42A:
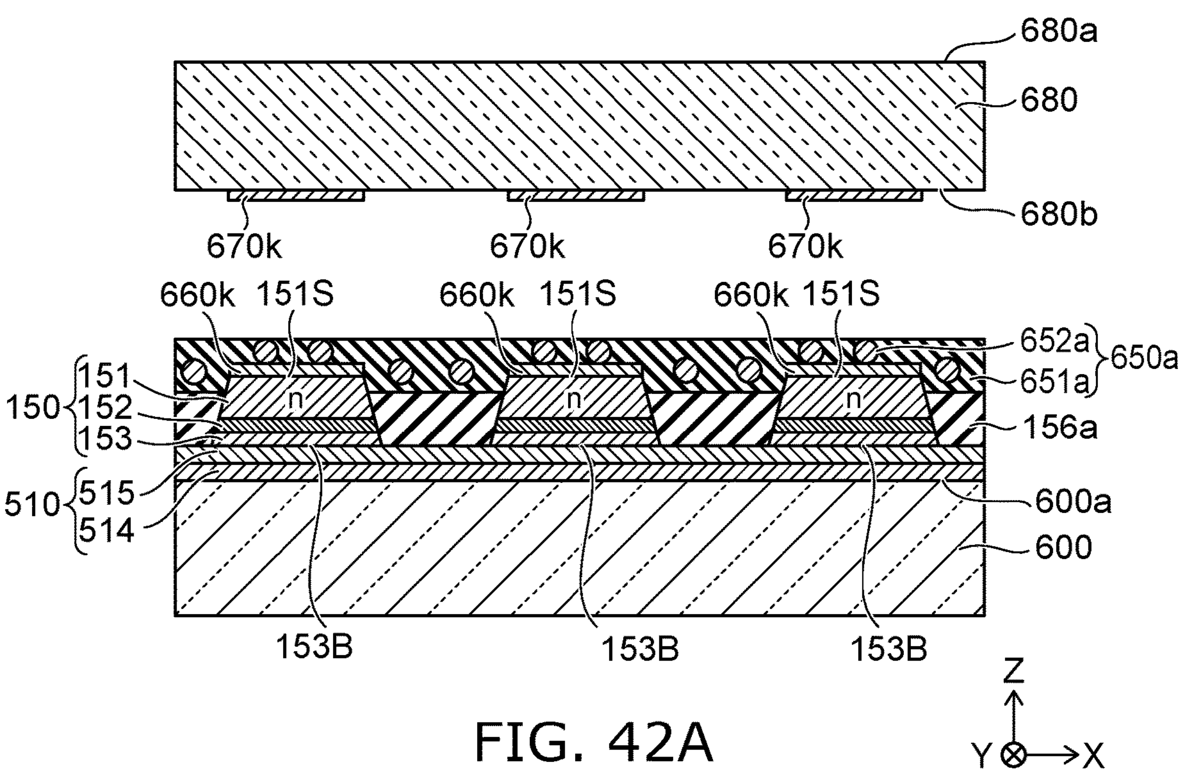
FIG. 42A is a schematic cross-sectional view illustrating a part of the method for manufacturing the image display device of the sixth embodiment.
Figure 42B:
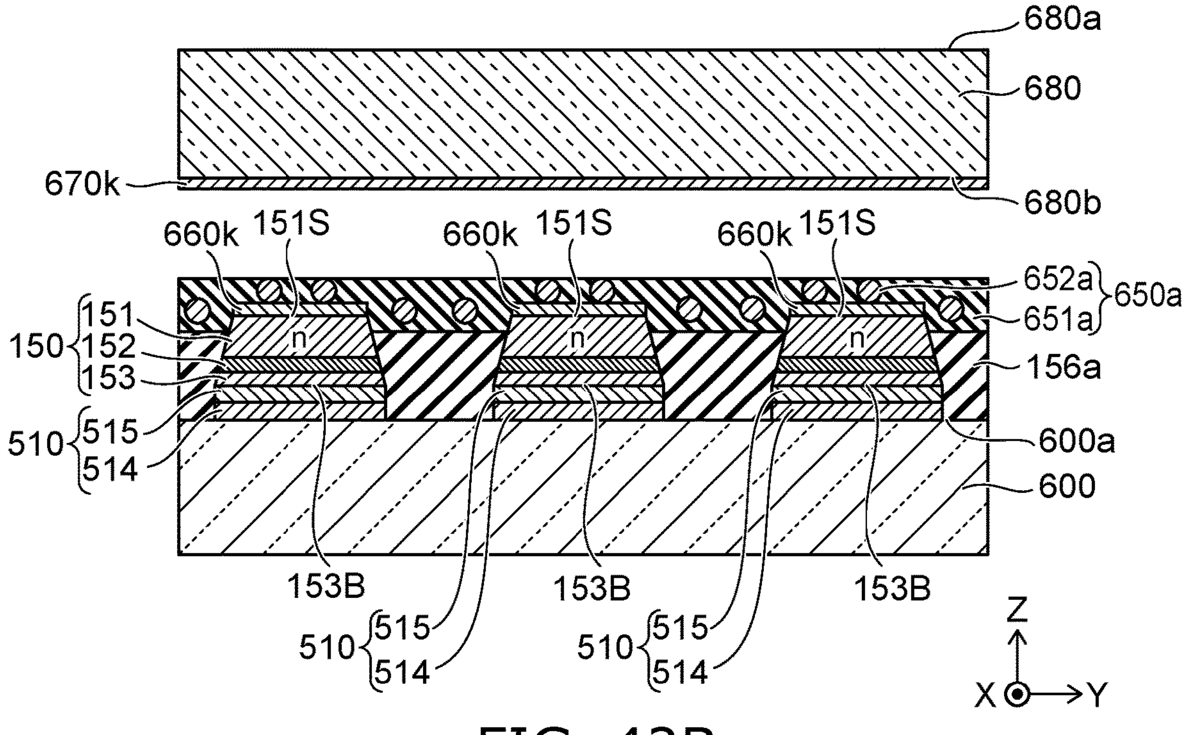
FIG. 42B is a schematic cross-sectional view illustrating a part of the method for manufacturing the image display device of the sixth embodiment.

As illustrated in FIGS. 42A and 42B, the light-transmitting substrate 680 to which the second terminals 644 (not illustrated) are connected is provided. The light-transmitting substrate 680 is disposed such that the second surface 680*b* faces the anisotropic conductive member 650*a*. The light-transmitting electrode 670*k* is disposed in a direction orthogonal to the metal wiring line 510 and aligned with the light-transmitting electrode 660*k* provided on the light-emitting surface 151S.

Figure 43A:
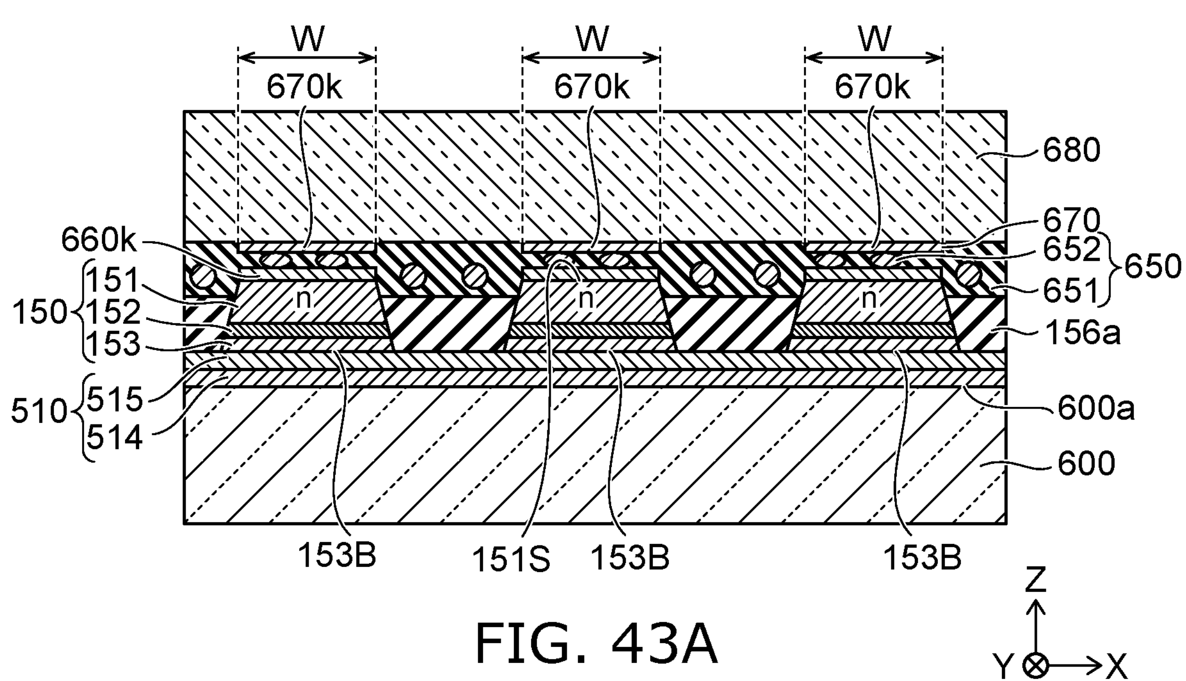
FIG. 43A is a schematic cross-sectional view illustrating a part of the method for manufacturing the image display device of the sixth embodiment.
Figure 43B:
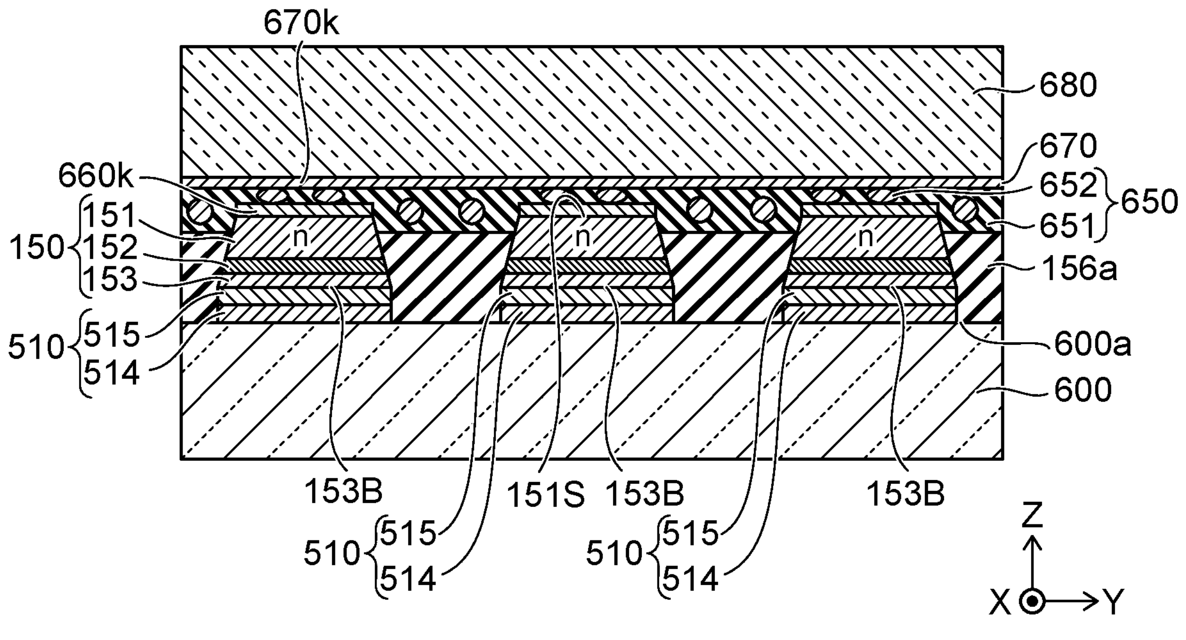
FIG. 43B is a schematic cross-sectional view illustrating a part of the method for manufacturing the image display device of the sixth embodiment.

As illustrated in FIGS. 43A and 43B, the light-transmitting substrate 680 and the substrate 600 are pressed in the Z-axis direction and heated. By the applied pressures, the light-transmitting electrode 670*k* and the light-transmitting electrode 660*k* are electrically connected to each other via the anisotropic conductive particles 652. The binder 651 cured by heating fixes the light-transmitting electrode 660*k* and the light-transmitting electrode 670*k* in an electrically connected state.

In the anisotropic conductive member 650, a conduction path is formed along the direction in which the pressure is applied. For that reason, the range in which the light-transmitting electrode 660*k* and the light-transmitting electrode 670*k* are electrically connected to each other is, for example, a range defined by the length of the light-transmitting electrode 670*k* in the X-axis direction. In the region between the two light-transmitting electrodes 670*k* adjacent to each other in the X-axis direction, because no pressure is applied in the X-axis direction, no electrical connection is established between the two light-transmitting electrodes 670*k*.

Because no pressure in the Y-axis direction is applied to the anisotropic conductive member 650 between the two light-transmitting electrodes 660*k* adjacent to each other in the Y-axis direction, the electrical connection between the two light-transmitting electrodes 660*k* is not established.

Although the anisotropic conductive member 650 is provided on the light-emitting element 150 in the above description, the anisotropic conductive member 650 may be applied or attached over the second surface 680*b* of the light-transmitting substrate 680 and the light-transmitting electrodes 670*k*.

The same applies to the function of the anisotropic conductive member 640. That is, the conduction between the second terminal 644 and the light-transmitting electrode 670*k* provided to face each other with the anisotropic conductive member 640 interposed therebetween is ensured by the pressure in the Z-axis direction. On the other hand, no pressure in the X-axis direction is applied between two second terminals 644 adjacent to each other in the X-axis direction and between two light-transmitting electrodes 670*k* adjacent to each other in the X-axis direction. For that reason, conduction is not ensured between the two second terminals 644 and between the two light-transmitting electrodes 670*k*.

Effects of the image display device of the present embodiment will now be described. Because the image display device has a passive matrix structure that does not use a circuit element such as a transistor as in the image display devices of the other embodiments described above, the pitch of the sub-pixels 620 can be shortened. In the present embodiment, as described above, in the manufacturing method, the light-transmitting electrode 670*k* to be formed on the light-emitting element 150 is formed in advance on the light-transmitting substrate 680, and the light-transmitting electrode 670*k* is connected to the light-emitting element 150 by using the anisotropic conductive member 650. For that reason, because the light-transmitting electrode is not formed on a surface having steps, even when the pitch of the light-emitting elements 150 is shortened, a decrease in yield due to disconnection of the light-transmitting electrode or the like can be reduced.

In addition, because the light-transmitting electrode 670*k* and the light-transmitting electrode 660*k* are connected to each other via the anisotropic conductive member 650, thermal stress during manufacturing can be reduced.

Furthermore, the connection step of the light-transmitting electrode 670*k* can be shortened to a forming step and a connection step of the anisotropic conductive member 650. For that reason, the manufacturing step of the image display device can be shortened, and the cost can be reduced.

Seventh Embodiment

Figure 44A:
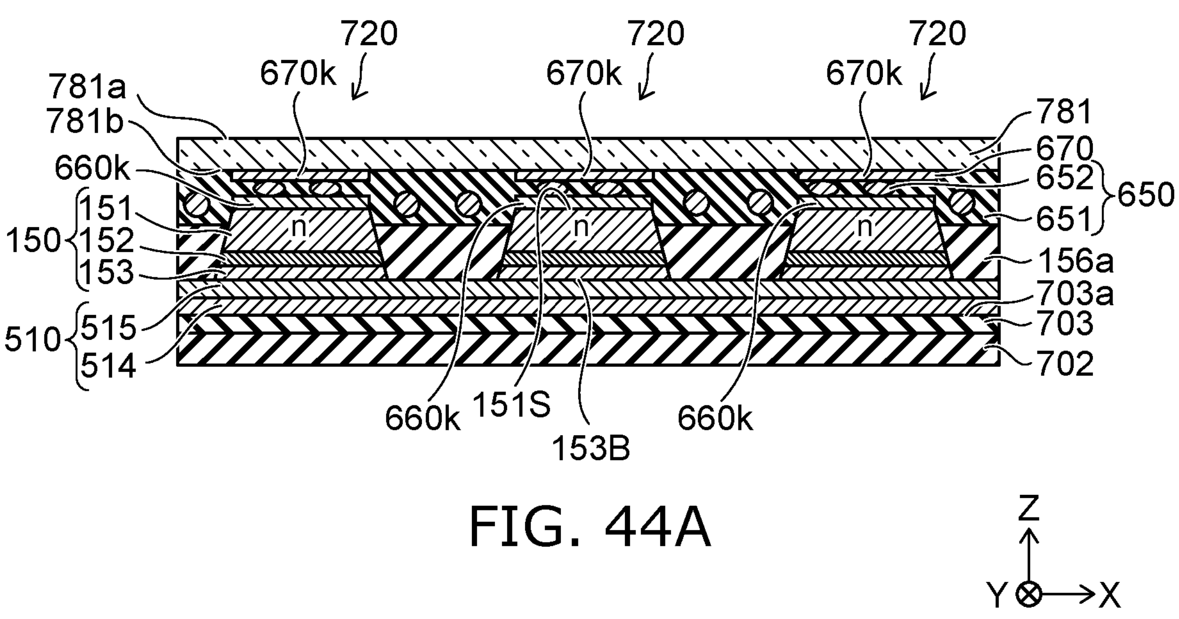
FIG. 44A is a schematic cross-sectional view illustrating a part of an image display device of a seventh embodiment.
Figure 44B:
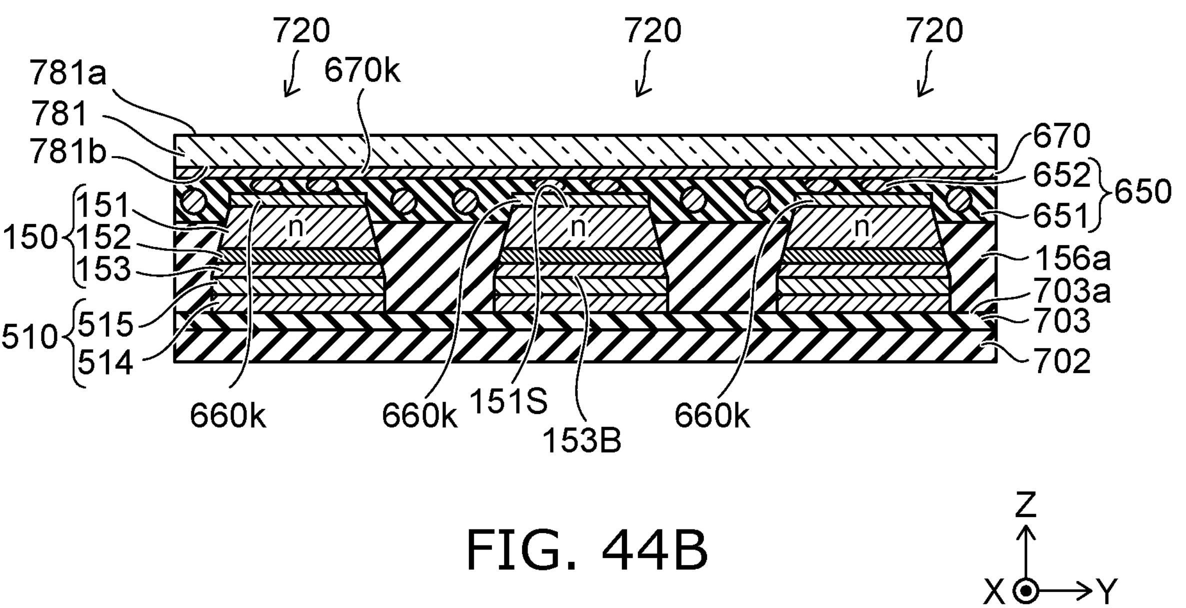
FIG. 44B is a schematic cross-sectional view illustrating a part of the image display device of the seventh embodiment.

FIGS. 44A and 44B are schematic cross-sectional views illustrating a part of an image display device of the present embodiment.

FIG. 44A is a cross-sectional view corresponding to the cross section taken along line A-A' in FIG. 35.

FIG. 44B is a cross-sectional view corresponding to the cross section taken along line AA-AA' in FIG. 35.

As illustrated in FIGS. 44A and 44B, in the image display device of the present embodiment, a sub-pixel 720 includes a substrate 702. The substrate 702 is formed of an organic resin and preferably has flexibility. A layer 703 containing a Si compound such as $SiO_2$ is provided on the substrate 702. The layer 703 is provided to improve adhesion of a metal material when the metal wiring lines 510 are formed. The metal wiring lines 510 and the insulating film 156*a* are provided on the first surface 703*a*.

In the image display device of the present embodiment, the sub-pixel 720 includes a substrate 781. The substrate 781 is formed of, for example, a transparent organic resin material, and preferably has flexibility. The substrate 781 has a first surface 781*a* and a second surface 781*b*. The second surface 781*b* is a surface opposite to the first surface 781*a*. The light-transmitting electrodes 670*k* are provided on the second surface 781*b*. The image display device of the present embodiment includes the same components as those of the sixth embodiment except for the substrate 702 having the above-described layer 703 and the substrate 781. The same components are denoted by the same reference characters, and detailed description thereof will be omitted.

A method for manufacturing the image display device of the present embodiment will now be described.

Figure 45A:
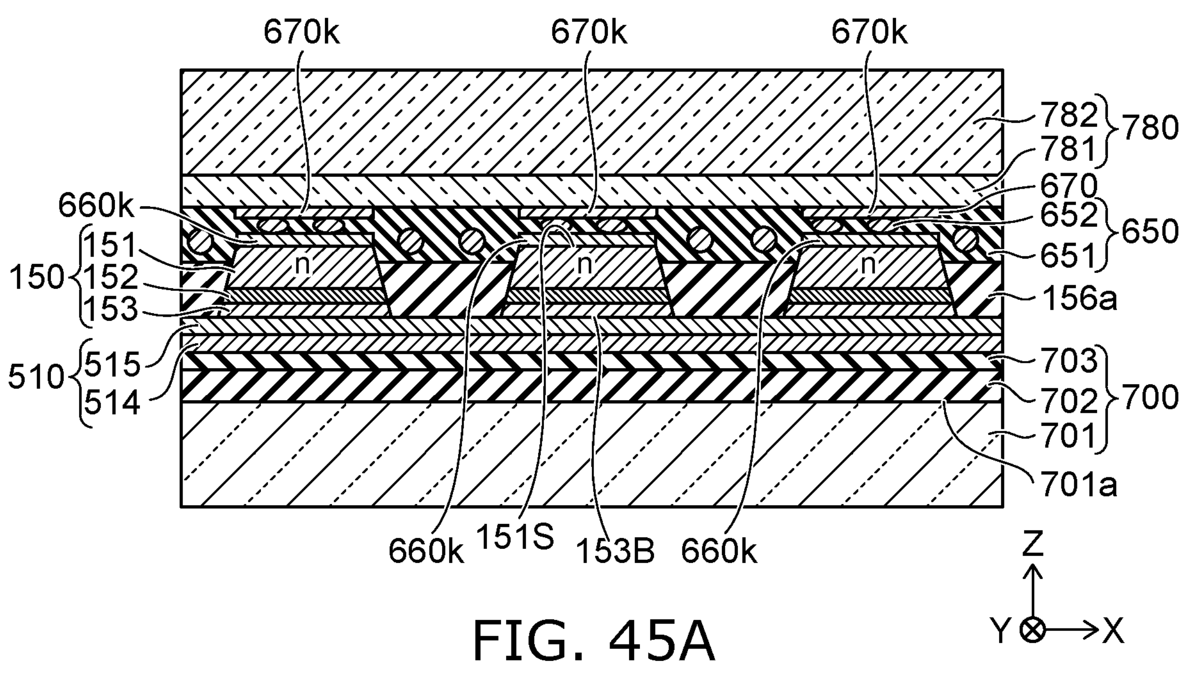
FIG. 45A is a schematic cross-sectional view illustrating a part of a method for manufacturing the image display device of the seventh embodiment.
Figure 45B:
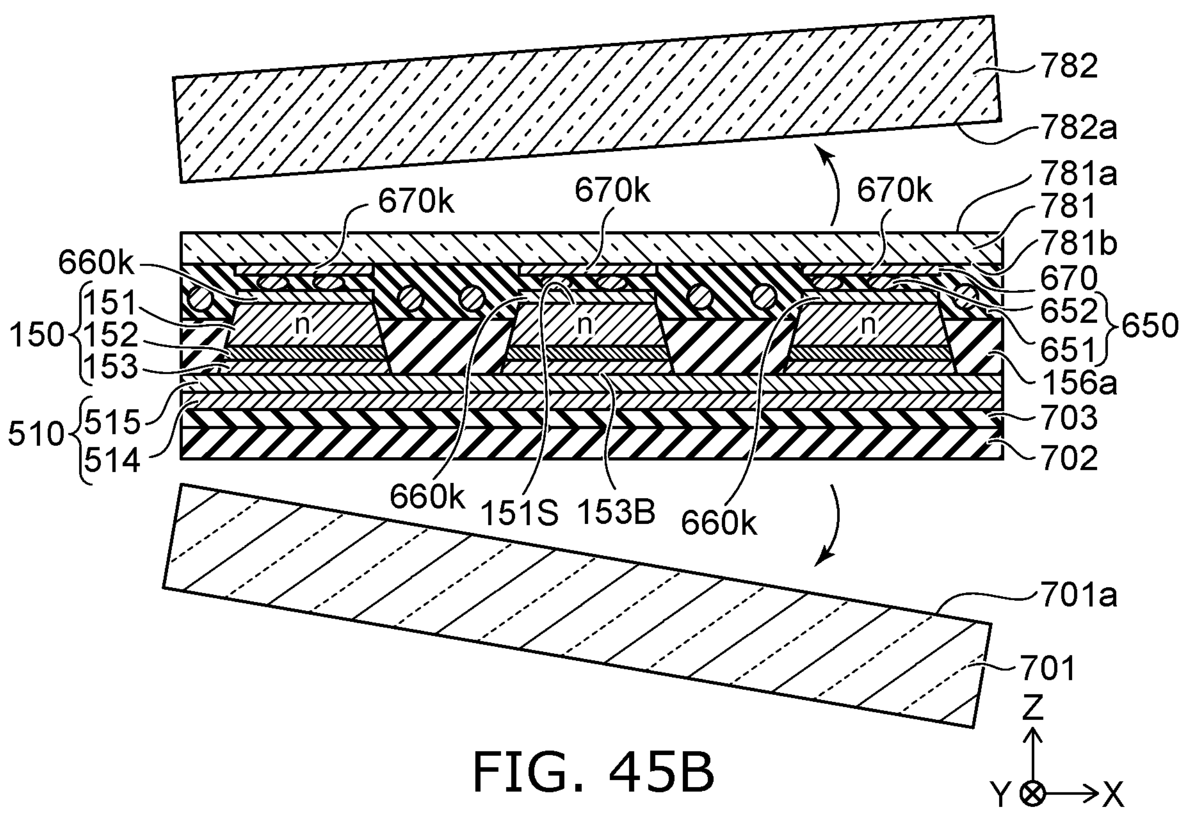
FIG. 45B is a schematic cross-sectional view illustrating a part of the method for manufacturing the image display device of the seventh embodiment.

FIGS. 45A and 45B are schematic cross-sectional views illustrating a part of the method for manufacturing the image display device of the present embodiment.

FIGS. 45A and 45B are cross-sectional views corresponding to the cross section taken along line A-A' in FIG. 35.

As illustrated in FIG. 45A, the metal wiring lines 510, the light-emitting elements 150, the light-transmitting electrodes 660*k*, the insulating film 156*a*, and the third anisotropic conductive member 650 described in the sixth embodiment and the like are formed on the provided substrate 700. The substrate 700 includes two layers of substrates 701 and 702 and the layer 703. For example, the substrate 702 is formed by applying a polyimide material on a first surface 701*a* of the substrate 701 and baking the polyimide material. Before forming the substrate 702, an inorganic film such as $SiN_x$ may be formed on the one surface 701*a*. In this case, the substrate 702 is formed by applying a polyimide material onto the inorganic film formed on the surface 701*a* and baking the polyimide material. The layer 703 is formed over the first surface 701*a* of the substrate 701.

In the present embodiment, a substrate 780 is used instead of the light-transmitting substrate 680 illustrated in FIGS. 38A, 38B, 39A, and 39B. The substrate (fourth substrate) 780 includes two layers of substrates 781 and 782. The substrate 782 is, for example, a substrate having light-transmitting properties and is a glass substrate. The substrate 781 is a transparent substrate made of an organic resin. As illustrated in FIG. 45B, the substrate 781 is formed on a surface 782*a* of the substrate 782. The substrates 781 and 782 are joined by, for example, an adhesive or the like.

The substrate 701 is removed by, for example, wet etching or laser lift-off. The substrate 782 is also removed by, for example, wet etching.

Effects of the image display device of the present embodiment will now be described. In the present embodiment, because the substrates 702 and 781 are formed of a thinly molded organic resin, the image display device can be further reduced in weight and thickness. Because the substrates 702 and 781 can be formed by using a flexible material, the image display device can be bent, thereby it is possible to achieve attachment to a curved surface, use in a wearable terminal such as goggles for virtual reality, and the like without a sense of incongruity.

Eighth Embodiment

Figure 46:
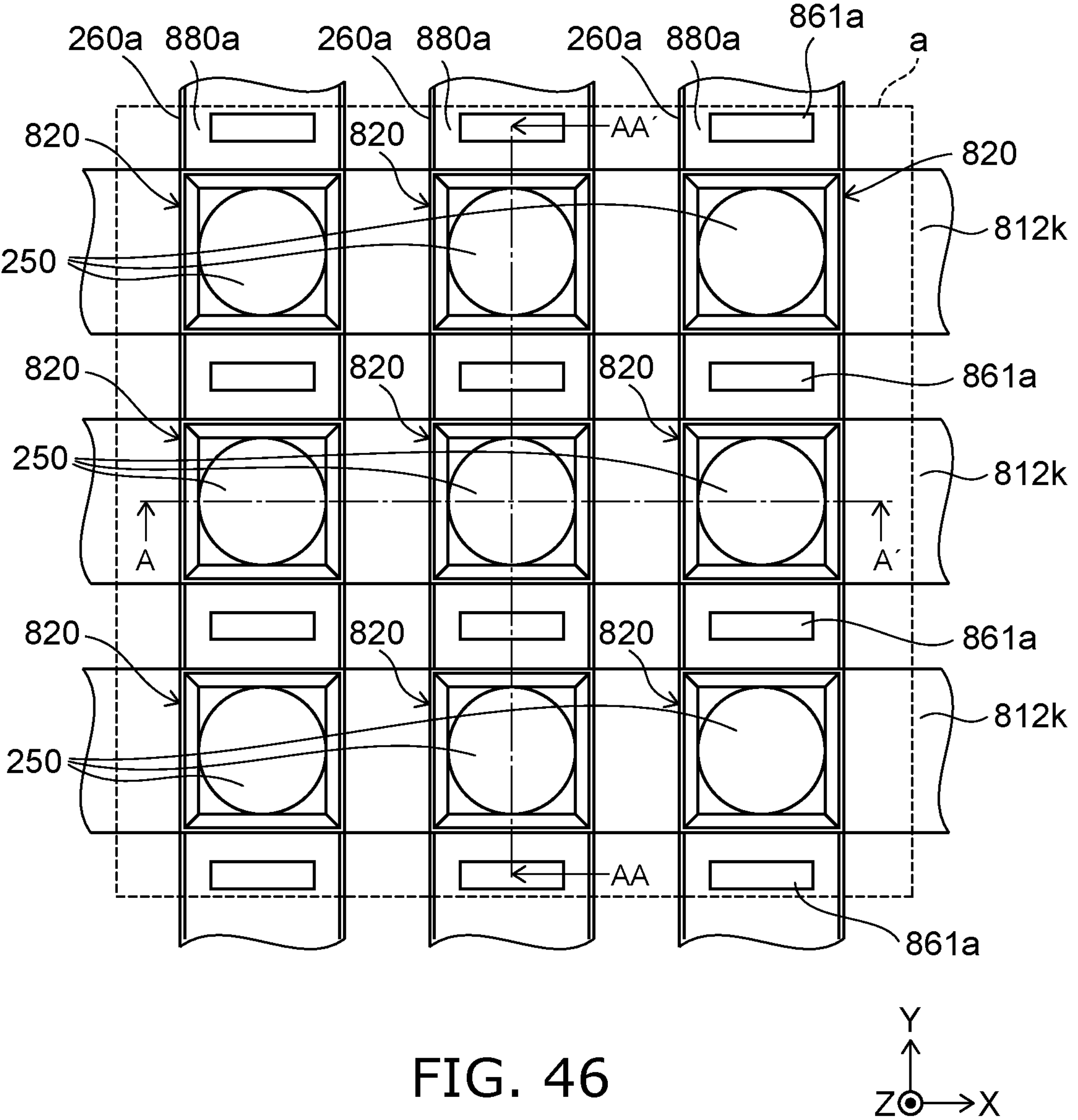
FIG. 46 is a schematic plan view illustrating a part of an image display device of an eighth embodiment.

FIG. 46 is a schematic plan view illustrating a part of an image display device of the present embodiment.

In the case of the other embodiments described above, the wiring line for connection to the row selection circuit is formed of a conductive material having high conductivity such as metal, but in the present embodiment, a wiring line for connection to the current drive circuit is also formed of a conductive material having high conductivity.

As illustrated in FIG. 46, the image display device of the present embodiment includes first metal wiring lines 812*k*, the light-emitting elements 250, the light-transmitting electrodes 260*a*, and a second metal wiring lines 880*a*. The first metal wiring line 812*k* is provided along the X-axis direction. A plurality of first metal wiring lines 812*k* are provided, and the plurality of first metal wiring lines 812*k* are separated from each other in the Y-axis direction at substantially equal intervals and substantially parallel to each other. The separation distance between the first metal wiring lines 812*k* in the Y-axis direction is set to be equal to the pitch of the light-emitting elements 250. In the present embodiment, the second metal wiring line 880*a* can be directly connected to the second terminal 44.

The light-transmitting electrode 260*a* is provided along the Y-axis direction. A plurality of light-transmitting electrodes 260*a* are provided, and the plurality of light-transmitting electrodes 260*a* are separated from each other in the X-axis direction at substantially equal intervals and substantially parallel to each other. The second metal wiring line 880*a* is provided along the Y-axis direction. A plurality of second metal wiring lines 880*a* are provided, and the plurality of second metal wiring lines 880*a* are separated from each other in the X-axis direction at substantially equal intervals and substantially parallel to each other. The second metal wiring lines 880*a* are provided in a layer different from the light-transmitting electrodes 260*a* so as to be substantially parallel to the light-transmitting electrodes 260*a* in the XY plan view.

The light-emitting element 250 is provided at an intersection of the first metal wiring line 812*k* and the second metal wiring line 880*a*. Because the second metal wiring line 880*a* is provided in a layer different from the light-transmitting electrode 260*a* and substantially parallel to the light-transmitting electrode 260*a* in the XY plan view, the light-emitting element 250 is provided at an intersection of the first metal wiring line 812*k* and the light-transmitting electrode 260*a*.

In the present embodiment, the light-emitting element 250 has a truncated pyramidal shape having a square cross section, and the light-emitting surface 253S illustrated in FIGS. 47A and 47B to be described below has a circular shape. The shape of the light-emitting element 250 may be a truncated cone shape, a cylinder, or a prism, as in the other embodiments described above.

Figure 47A:
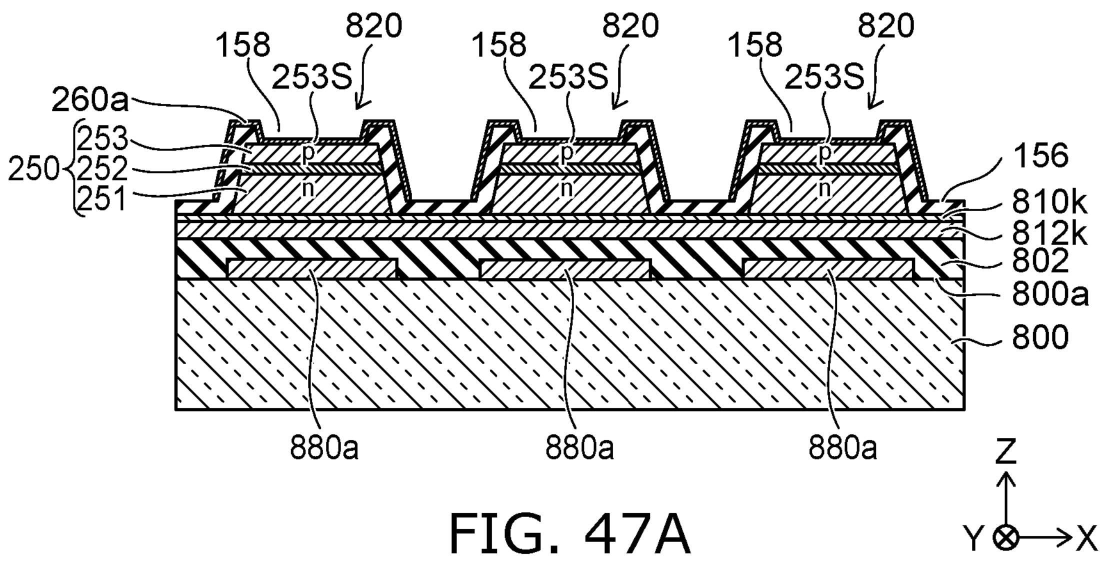
FIG. 47A is a schematic cross-sectional view illustrating a part of the image display device of the eighth embodiment.
Figure 47B:
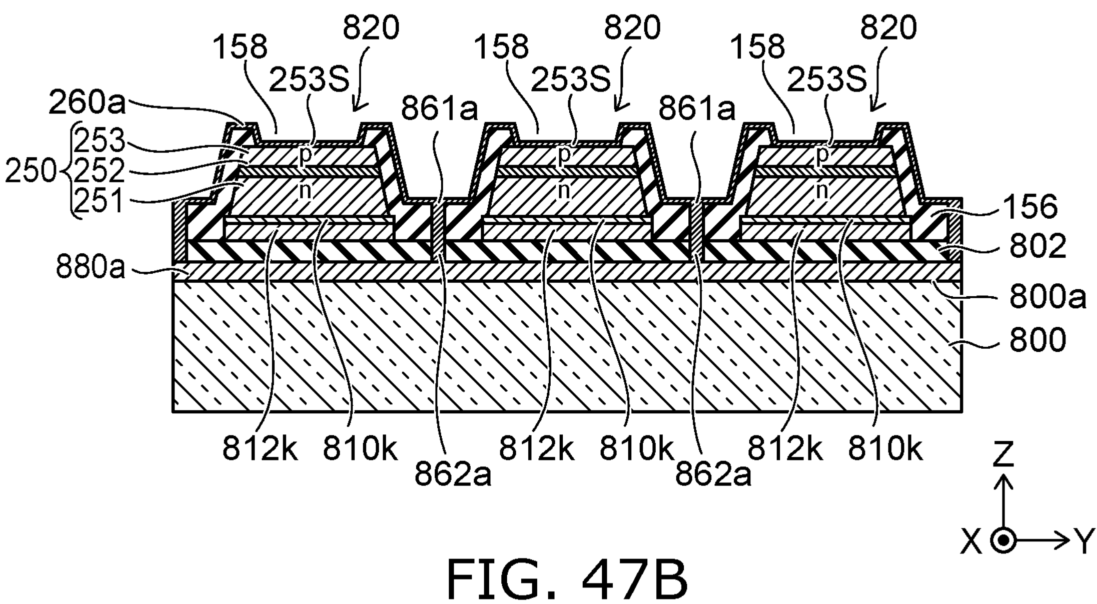
FIG. 47B is a schematic cross-sectional view illustrating a part of the image display device of the eighth embodiment.

FIGS. 47A and 47B are schematic cross-sectional views illustrating a part of the image display device of the present embodiment.

FIG. 47A is a cross-sectional view taken along line A-A' in FIG. 46.

FIG. 47B is a cross-sectional view taken along line AA-AA' in FIG. 46.

As illustrated in FIGS. 47A and 47B, an upper structure including the second metal wiring lines 880*a*, the first metal wiring lines 812*k*, the light-emitting elements 250, and the light-transmitting electrodes 260*a* is formed on the substrate 800. The substrate 800 is, for example, a light-transmitting substrate and is a glass substrate. The substrate may be a substrate including a Si substrate and an oxide film as in the other embodiments described above. The second metal wiring line 880*a* is provided on the first surface 800*a* of the substrate 800. The second metal wiring line 880*a* is provided along the Y-axis direction. A plurality of second metal wiring lines 880*a* are provided and the plurality of second metal wiring lines 880*a* are separated from each other in the X-axis direction at substantially equal intervals and substantially parallel to each other. The second metal wiring line 880*a* is connected to the current drive circuit 7 at the end portion of the display region 2 illustrated in FIG. 1. The second metal wiring line 880*a* is formed of, for example, a metal material having high conductivity such as Al or Cu, alloys containing Al or Cu, or the like.

An insulating layer 802 is provided on the first surface 800*a* and the second metal wiring lines 880*a*. The insulating layer 802 is, for example, an oxide film such as $SiO_2$ and is formed by, for example, CVD.

The surface of the insulating layer 802 is planarized, and the first metal wiring lines 812*k* are formed on the planarized insulating layer 802. The first metal wiring line 812*k* is formed along the X-axis direction. A plurality of first metal wiring lines 812*k* are provided, and the plurality of first metal wiring lines 812*k* are separated from each other in the Y-axis direction at substantially equal intervals and substantially parallel to each other. The first metal wiring line 812*k* is connected to the row selection circuit 5 at the end portion of the display region 2 illustrated in FIG. 1.

The bonding metal 810*k* is provided over the first metal wiring line 812*k*, and the light-emitting element 250 is provided on the bonding metal 810*k*. In the present embodiment, the light-emitting element 250 has the p-type semiconductor layer 253 as a light-emitting surface 253S and the n-type semiconductor layer 251 as a bottom surface. The bonding metal 810*k* is provided for ohmic connection with the n-type semiconductor layer 251 of the light-emitting element 250, as in the other embodiments described above. In addition, the bonding metal 810*k* is provided to reflect downward scattered light or the like from the light-emitting element 250 to the light-emitting surface 253S. Accordingly, substantial light emission efficiency of the light-emitting element 250 is improved. The configuration of the light-emitting element 250 is the same as that in the second embodiment, and a detailed description thereof will be omitted.

The insulating film 156 is provided to cover the insulating layer 802, the first metal wiring lines 812*k*, the bonding metals 810*k*, and the light-emitting elements 250. The light-emitting surface 253S is formed by removing a portion of the insulating film 156 above the light-emitting element 250. The material of the insulating film 156 is the same as in the other embodiments described above and will not be described in detail. The configuration of the insulating film 156 is the same as that in the other embodiments described above, and the insulating film 156 may also be the insulating film 156*a* formed of an insulating material having light reflectivity as in the other embodiments described above.

The light-transmitting electrode 260*a* is provided along the Y-axis direction on the insulating film 156 and the light-emitting elements 250. The light-transmitting electrode 260*a* connects the light-emitting surfaces 253S of the light-emitting elements 250 arranged along the Y-axis direction to each other. A plurality of light-transmitting electrodes 260*a* are provided. The plurality of light-transmitting electrodes 260*a* are separated from each other in the X-axis direction at substantially equal intervals and substantially parallel to each other. The plurality of light-transmitting electrodes 260*a* and the plurality of second metal wiring lines 880*a* are formed in different layers and substantially parallel to each other. To be more specific, in the region where the light-emitting elements 250 are present, the plurality of light-transmitting electrodes 260*a* and the plurality of second metal wiring lines 880*a* are layered in the Z-axis direction with the light-emitting elements 250, the bonding metals 810*k*, the first metal wiring lines 812*k*, and the insulating layer 802 interposed therebetween and have the same XY coordinates. In the region where the light-emitting elements 250 are not present, the plurality of light-transmitting electrodes 260*a* and the plurality of second metal wiring lines 880*a* are layered in the Z-axis direction with the insulating film 156 and the insulating layer 802 interposed therebetween and have the same XY coordinates.

The light-transmitting electrode 260*a* has a contact portion 861*a* and is connected to a via 862*a* at the contact portion 861*a*. The contact portion 861*a* and the via 862*a* are provided between the adjacent light-emitting elements 250. A plurality of contact portions 861*a* and a plurality of vias 862*a* are provided, and in this example, the contact portion 861*a* and the via 862*a* are provided between every two adjacent light-emitting elements 250. Without being limited to this example, the contact portion 861*a* and the via 862*a* may be provided for each set of a plurality of light-emitting elements arranged in the Y-axis direction.

The via 862*a* penetrates the insulating film 156 and the insulating layer 802 to reach the second metal wiring line 880*a*. The via 862*a* is provided between the light-transmitting electrode 260*a* and the second metal wiring line 880*a* and electrically connects the light-transmitting electrode 260*a* and the second metal wiring line 880*a*. Thus, the p-type semiconductor layer 253 is electrically connected to the current drive circuit 7 via the light-transmitting electrode 260*a*, the contact portion 861*a*, the via 862*a*, and the second metal wiring line 880*a*.

In this example, the contact portion 861*a* and the via 862*a* are formed of the same material as the light-transmitting electrode 260*a*. By forming the light-transmitting electrode 260*a*, the contact portion 861*a*, and the via 862*a* with the same material, the formation of the light-transmitting electrode 260*a* and the formation of the via 862*a* can be performed at the same time. By forming the light-transmitting electrode 260*a* and the via 862*a* at the same time, mutual connection at the contact portion 861*a* can also be performed at the same time as the formation of the light-transmitting electrode 260*a* and the via 862*a*.

The shape of the contact portion 861*a* and the cross-sectional shape of the via 862*a* can be appropriately set depending on the materials of the contact portion 861*a* and the via 862*a*. In this example, because the contact portion 861*a* and the via 862*a* are made of the same material as the light-transmitting electrode 260*a*, a sufficient cross-sectional area is provided to reduce the resistance value.

A method for manufacturing the image display device of the present embodiment will now be described.

In the method for manufacturing the image display device of the present embodiment, the step of forming the second metal wiring line 880*a* and the step of forming the via 862*a* are different from those in the other embodiments described above. Otherwise, the case of the other embodiments described above can be applied.

In the step of forming the second metal wiring line 880*a*, a metal layer may be formed on the first surface 800*a* of the provided substrate 800, and the second metal wiring lines 880*a* can be formed by etching. After the formation of the second metal wiring lines 880*a*, the insulating layer 802 is formed to cover the first surface 800*a* and the second metal wiring lines 880*a*, and the upper surface of the insulating layer 802 is planarized.

The step of forming the via 862*a* is performed after the step of forming the insulating film 156. In the step of forming the via 862*a*, a via hole is formed at the contact portion 861*a*, which is a connection position between the via 862*a* and the second metal wiring line 880*a*. As described above, a position between two light-emitting elements 250 adjacent to each other in the Y-axis direction is selected as the contact portion 861*a*. The via hole for the via 862*a* penetrates the insulating film 156 and the insulating layer 802 to reach the second metal wiring line 880*a*.

In this example, a light-transmitting conductive film for forming the light-transmitting electrodes 260*a* is formed over the insulating film 156 and the light-emitting elements 250, and the formed conductive film is etched to form the light-transmitting electrodes 260*a*. The via 862*a* is formed by filling the via hole with a conductive film material at the time of forming the conductive film, and the connection between the via 862*a* and the light-transmitting electrode through the contact portion 861*a* is simultaneously performed.

Effects of the image display device of the present embodiment will now be described. Because the image display device of the present embodiment has a passive matrix structure that does not use a circuit element such as a transistor as in the image display devices of the other embodiments described above, the pitch of the sub-pixels 820 can be shortened. In addition, the connection between the current drive circuit 7 and each light-emitting element 250 is achieved by the second metal wiring lines 880*a* in addition to the light-transmitting electrode 260*a*. By connecting the light-transmitting electrode 260*a* and the second metal wiring line 880*a* in parallel, the resistance value in the routing direction of the wiring line between the current drive circuit 7 and each light-emitting element 250 is reduced. By using a metal material containing Al, Cu, or the like having high conductivity for the second metal wiring line 880*a*, the resistance in the routing direction between the current drive circuit 7 and each the light-emitting element 250 can be reduced. For that reason, because the resistance of the wiring line for supplying the current to each light-emitting element 250 is reduced, the voltage value of the DC power supply for driving each light-emitting element 250 can be further reduced, and the power consumption of the image display device can be further reduced. A sufficient voltage can be applied between the terminals of each light-emitting element 250 even if the voltage of the DC power supply for driving each light-emitting element 250 is lowered, so that the display region can be made larger.

In the case of manufacturing the image display device of the present embodiment, because a technique for forming a via penetrating a plurality of insulating layers has already been established and the image display device can be manufactured by using a proven process, the manufacturing yield can be increased, and the quality can be improved by reducing connection failure or the like.

In the present embodiment, although an example in which the p-type semiconductor layer 253 is used as the light-emitting surface 253S has been described, an image display device in which, for example, the n-type semiconductor layer 151 is used as the light-emitting surface 151S illustrated in FIG. 3A can also be easily manufactured by applying the examples of the other embodiments described above.

Ninth Embodiment

The image display device described above can be used for, as an image display module including an appropriate number of pixels, a computer display, a television, a mobile terminal such as a smartphone, or a car navigation system, for example.

Figure 48:
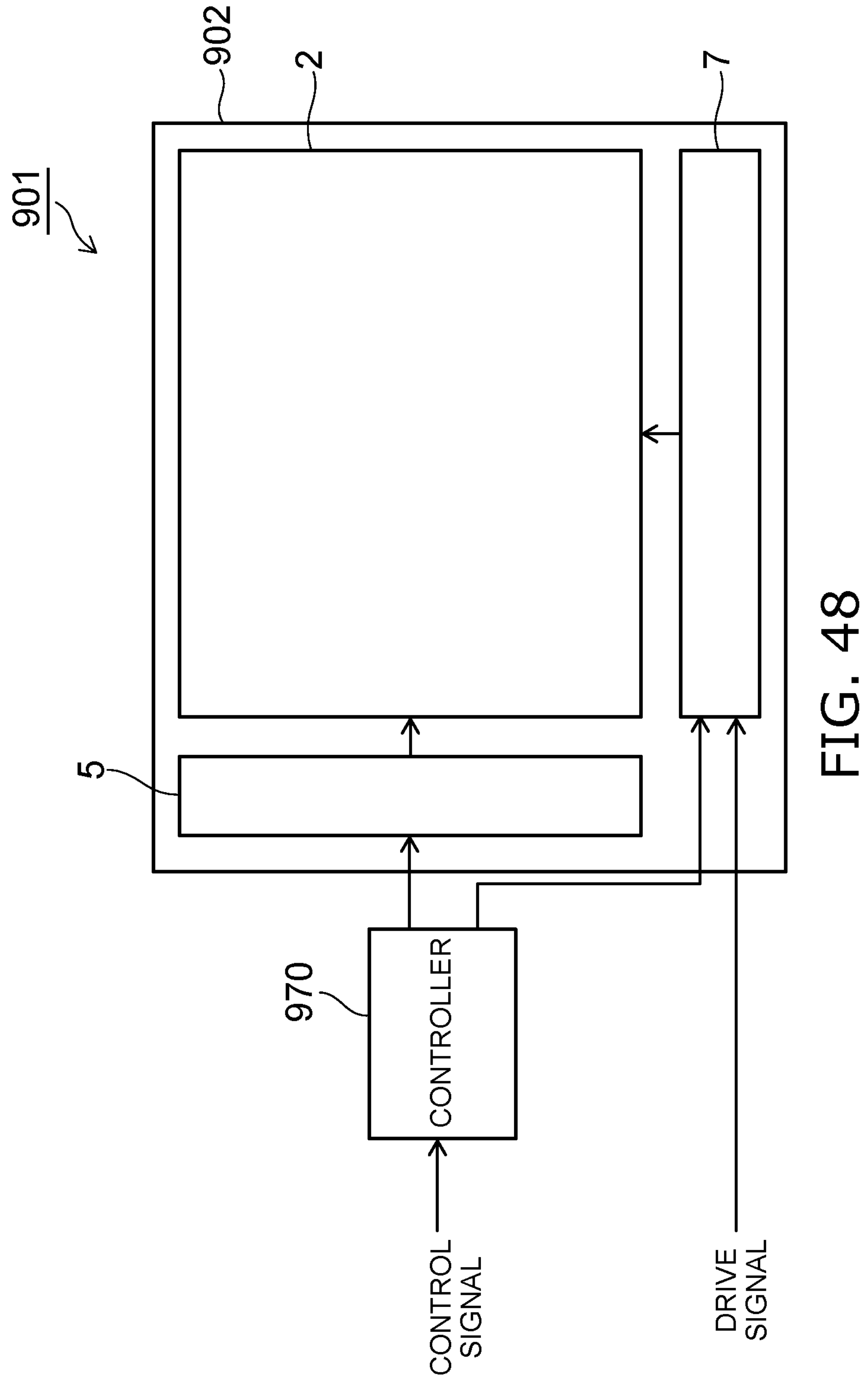
FIG. 48 is a block diagram illustrating an image display device according to a ninth embodiment.

FIG. 48 is a block diagram illustrating an image display device according to the present embodiment.

FIG. 48 illustrates a main portion of a configuration of a computer display.

As illustrated in FIG. 48, an image display device 901 includes an image display module 902. The image display module 902 is, for example, an image display device including the configuration of the first embodiment described above. The image display module 902 includes the display region 2 in which a plurality of sub-pixels including the sub-pixel 20 are arranged, the row selection circuit 5, and the current drive circuit 7.

The image display device 901 further includes a controller 970. The controller 970 receives control signals separated and generated by an interface circuit (not illustrated) to control the drive and drive sequence of each sub-pixel with respect to the row selection circuit 5 and the current drive circuit 7.

Variation

The image display device described above can be used for, as an image display module including an appropriate number of pixels, a computer display, a television, a mobile terminal such as a smartphone, or a car navigation system, for example.

Figure 49:
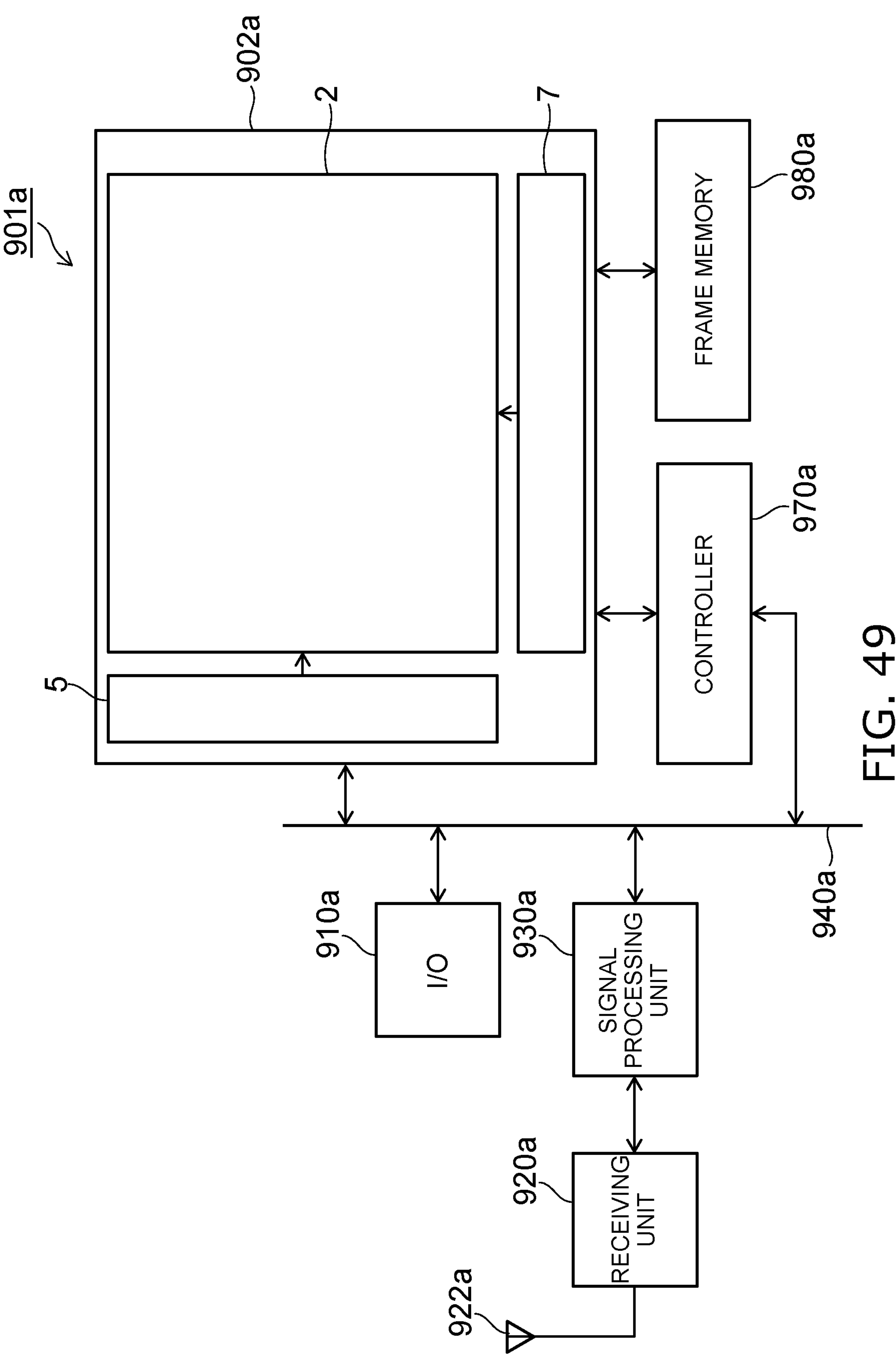
FIG. 49 is a block diagram illustrating an image display device of a variation of the ninth embodiment.

FIG. 49 is a block diagram illustrating an image display device according to a variation of the present embodiment.

FIG. 49 illustrates a configuration of a high-definition, flat-screen television. As illustrated in FIG. 49, an image display device 901*a* includes an image display module 902*a*. The image display module 902*a* is, for example, the image display device 1 including the configuration of the first embodiment described above. The image display device 901*a* includes a controller 970*a* and a frame memory 980*a*. The controller 970*a* controls the drive sequence of each sub-pixel in the display region 2 based on the control signal supplied by a bus 940*a*. The frame memory 980*a* stores the display data of one frame and is used for processing, such as smooth video playback.

The image display device 901*a* includes an I/O circuit 910*a*. The I/O circuit 910*a* is simply denoted as "I/O" in FIG. 49. The I/O circuit 910*a* provides an interface circuit and the like for connection to an external terminal, device, or the like. The I/O circuit 910*a* includes, for example, a USB interface for connecting an external hard disk device or the like, and an audio interface.

The image display device 901*a* includes a receiving unit 920*a* and a signal processing unit 930*a*. The receiving unit 920*a* is connected to an antenna 922*a*, and separates and generates necessary signals from radio waves received by the antenna 922*a*. The signal processing unit 930*a* includes a digital signal processor (DSP), a central processing unit (CPU), and the like, and signals separated and generated by the receiving unit 920*a* are separated and generated into image data, audio data, and the like by the signal processing unit 930*a*.

Other image display devices can be made as well by using high-frequency communication modules for mobile phone transmission and reception, for WiFi, for global positioning system (GPS) receivers, and the like for the receiving unit 920*a* and the signal processing unit 930*a*. For example, an image display device including an image display module with an appropriate screen size and resolution may be made into a mobile information terminal such as a smartphone or a car navigation system.

The image display module of the present embodiment is not limited to the configuration of the image display device of the first embodiment and may have the configuration of a variation of the first embodiment or other embodiments. As illustrated in FIG. 37, the image display module according to the present embodiment and the variation includes a large number of sub-pixels.

According to the embodiments described above, it is possible to implement an image display device that enables high definition and high-speed response.

While several embodiments of the present invention have been described above, these embodiments have been presented by way of example and are not intended to limit the scope of the invention. These novel embodiments may be implemented in various other forms, and various omissions, substitutions, and changes can be made without departing from the spirit of the invention. These embodiments and variations thereof are included in the scope and spirit of the invention and are within the scope of the invention described in the claims and equivalents thereof. Furthermore, each of the aforementioned embodiments may be implemented in combination with each other.

What is claimed is:

1. An image display device comprising:

a substrate;

a first wiring line formed on the substrate along a first direction;

a first light-emitting element located on the first wiring line and comprising a first light-emitting surface;

a first light-transmitting electrode formed along a second direction intersecting the first direction and located on the first light-emitting surface;

a first anisotropic conductive member located on the first wiring line;

a first terminal electrically connected to the first wiring line via the first anisotropic conductive member;

a second anisotropic conductive member located on the first light-transmitting electrode;

an insulating film located on a lateral surface of the first light-emitting element, the first wiring line, and the substrate, wherein the insulating film has light reflectivity; and a second terminal located on the substrate via the insulating film, the first light-transmitting electrode, and the second anisotropic conductive member, the second terminal being electrically connected to the first light-transmitting electrode via the second anisotropic conductive member, wherein:

the first light-emitting element comprises a first bottom surface in contact with the first wiring line, and the first light-emitting surface is located on a side of the first light-emitting element opposite to the first bottom surface.

2. The image display device according to claim 1, further comprising:

a metal layer located between the first wiring line and the first light-emitting element.

3. The image display device according to claim 1, further comprising:

a second light-emitting element located adjacent to the first light-emitting element on the first wiring line and comprising a second light-emitting surface;

a second light-transmitting electrode formed along the second direction and located on the second light-emitting surface;

a light-transmitting substrate located on the first light-transmitting electrode and the second light-transmitting electrode; and a third anisotropic conductive member located between the first light-emitting surface and the first light-transmitting electrode and electrically connecting the first light-emitting surface and the first light-transmitting electrode, and located between the second light-emitting surface and the second light-transmitting electrode and electrically connecting the second light-emitting surface and the second light-transmitting electrode, wherein:

the second light-emitting element comprises a second bottom surface in contact with the first wiring line, and the second light-emitting surface is located on a side of the second light-emitting element opposite to the second bottom surface.

4. The image display device according to claim 3, further comprising:

a third light-transmitting electrode located between the first light-emitting surface and the third anisotropic conductive member; and a fourth light-transmitting electrode located between the second light-emitting surface and the third anisotropic conductive member, wherein:

the first light-emitting surface is electrically connected to the first light-transmitting electrode via the third light-transmitting electrode and the third anisotropic conductive member on the third light-transmitting electrode, and the second light-emitting surface is electrically connected to the second light-transmitting electrode via the fourth light-transmitting electrode and the third anisotropic conductive member on the fourth light-transmitting electrode.

5. The image display device according to claim 3, further comprising:

a third terminal connected to the second light-transmitting electrode via the second anisotropic conductive member, wherein:

the second terminal is connected to the first light-transmitting electrode via the second anisotropic conductive member between the second terminal and the first light-transmitting electrode, and the third terminal is connected to the second light-transmitting electrode via the second anisotropic conductive member between the third terminal and the second light-transmitting electrode.

6. The image display device according to claim 3, wherein the light-transmitting substrate comprises a glass substrate.

7. The image display device according to claim 3, wherein the light-transmitting substrate comprises a flexible substrate.

8. The image display device according to claim 3, wherein:

the first light-emitting element comprises a first semiconductor layer, a first light-emitting layer, and a second semiconductor layer, the first semiconductor layer, the first light-emitting layer, and the second semiconductor layer are layered in this order from the first bottom surface toward the first light-emitting surface, the second light-emitting element comprises a third semiconductor layer, a second light-emitting layer, and a fourth semiconductor layer, the third semiconductor layer, the second light-emitting layer, and the fourth semiconductor layer are layered in this order from the second bottom surface toward the second light-emitting surface, and the first semiconductor layer and the third semiconductor layer are n-type, and the second semiconductor layer and the fourth semiconductor layer are p-type.

9. The image display device according to claim 1, wherein the first light-emitting element comprises a gallium nitride compound.

10. The image display device according to claim 1, further comprising:

a wavelength conversion member on the first light-emitting element.

11. An image display device comprising:

a substrate;

a first wiring line formed on the substrate along a first direction;

a first semiconductor layer located on the first wiring line;

a first light-emitting layer located on the first semiconductor layer;

a second light-emitting layer located, on the first semiconductor layer, away from the first light-emitting layer along the first direction;

a second semiconductor layer being a semiconductor layer of a conductivity type different from a conductivity type of the first semiconductor layer, located on the first light-emitting layer, and comprising a first light-emitting surface;

a third semiconductor layer being a semiconductor layer of a conductivity type identical to a conductivity type of the second semiconductor layer, located on the second light-emitting layer, and comprising a second light-emitting surface;

a first light-transmitting electrode formed along a second direction intersecting the first direction and located on the first light-emitting surface;

a second light-transmitting electrode formed along the second direction and located on the second light-emitting surface;

a first anisotropic conductive member located on the first wiring line;

a first terminal electrically connected to the first wiring line via the first anisotropic conductive member;

a second anisotropic conductive member located on the first light-transmitting electrode and the second light-transmitting electrode;

a second terminal electrically connected to the first light-transmitting electrode via the second anisotropic conductive member; and a third terminal electrically connected to the second light-transmitting electrode via the second anisotropic conductive member, wherein:

the first light-emitting surface is located on a surface of the second semiconductor layer that is opposite to a surface of the second semiconductor layer that is in contact with the first light-emitting layer, and the second light-emitting surface is located on a surface of the third semiconductor layer that is opposite to a surface of the third semiconductor layer that is in contact with the second light-emitting layer.

12. A method for manufacturing an image display device, the method comprising:

providing a second substrate that comprises a first substrate, and a semiconductor layer formed on a first substrate, the semiconductor layer comprising a light-emitting layer;

forming a first conductive layer on a first surface of a third substrate;

bonding the semiconductor layer to the third substrate via the first conductive layer;

removing the first substrate;

forming a first wiring line along a first direction by processing the first conductive layer;

forming a first light-emitting element comprising a first light-emitting surface and a second light-emitting element comprising a second light-emitting surface by processing the semiconductor layer;

forming an insulating film covering the first surface, the first wiring line, the first light-emitting element, and the second light-emitting element;

exposing the first light-emitting surface and the second light-emitting surface by removing a part of the insulating film;

forming a first light-transmitting electrode located along a second direction intersecting the first direction on the first light-emitting surface, and forming a second light-transmitting electrode located along the second direction on the second light-emitting surface;

electrically connecting a first terminal and the first wiring line by a pressure applied between the first terminal and the first wiring line, by locating a first anisotropic conductive member between the first terminal and the first wiring line; and electrically connecting the first light-transmitting electrode and a second terminal via a second anisotropic conductive member, and electrically connecting the second light-transmitting electrode and a third terminal via the second anisotropic conductive member, wherein the first light-emitting element comprises a first bottom surface connected to the first wiring line, and the first light-emitting surface is located on a side of the first light-emitting element opposite to the first bottom surface, and the second light-emitting element comprises a second bottom surface connected to the first wiring line, and the second light-emitting surface is located on a side of the second light-emitting element opposite to the second bottom surface.

13. The method for manufacturing an image display device according to claim 12, wherein:

the step of electrically connecting the first light-transmitting electrode and the second terminal, and electrically connecting the second light-transmitting electrode and the third terminal comprises:

electrically connecting the second terminal and the first light-transmitting electrode by a pressure applied between the second terminal and the first light-transmitting electrode, and electrically connecting the third terminal and the second light-transmitting electrode by a pressure applied between the second light-transmitting electrode and the third terminal, by locating the second anisotropic conductive member between the first light-transmitting electrode and the second terminal and between the second light-transmitting electrode and the third terminal.

14. The method for manufacturing an image display device according to claim 12, wherein:

the step of forming the first light-transmitting electrode and forming the second light-transmitting electrode comprises:

forming a first light-transmitting electrode and a second light-transmitting electrode on a second surface of a fourth substrate having light-transmitting properties, and electrically connecting the first light-emitting surface and the first light-transmitting electrode and electrically connecting the second light-emitting surface and the second light-transmitting electrode by a pressure applied between the fourth substrate and the third substrate, by disposing the first light-emitting surface and the second light-emitting surface in a state of facing the second surface via a third anisotropic conductive member.

15. The method for manufacturing an image display device according to claim 12, further comprising:

after the step of exposing the first light-emitting surface and the second light-emitting surface, forming a third light-transmitting electrode on the first light-emitting surface, and forming a fourth light-transmitting electrode on the second light-emitting surface.

16. The method for manufacturing an image display device according to claim 14, wherein:

the step of electrically connecting the first light-transmitting electrode and the second terminal, and electrically connecting the second light-transmitting electrode and the third terminal comprises:

electrically connecting the second terminal and the first light-transmitting electrode by a pressure applied between the second terminal and the fourth substrate and electrically connecting the third terminal and the second light-transmitting electrode by a pressure applied between the fourth substrate and the third terminal, by locating the second anisotropic conductive member between the first light-transmitting electrode and the second terminal and between the second light-transmitting electrode and the third terminal.

17. The method for manufacturing an image display device according to claim 14, wherein the fourth substrate comprises a glass layer.

18. The method for manufacturing an image display device according to claim 17, wherein:

the fourth substrate further comprises an organic resin layer located on the glass layer, and the method further comprises, after electrically connecting the first light-emitting surface and the first light-transmitting electrode and electrically connecting the second light-emitting surface and the second light-transmitting electrode, removing the glass layer.

19. The method for manufacturing an image display device according to claim 12 wherein:

the step of forming the first wiring line is performed after the step of bonding the semiconductor layer to the third substrate.

20. The method for manufacturing an image display device according to claim 12, further comprising:

forming a wavelength conversion member on the first light-emitting element and the second light-emitting element.

21. The method for manufacturing an image display device according to claim 20, wherein the step of forming the wavelength conversion member comprises forming the wavelength conversion member on a plurality of light-emitting elements comprising the first light-emitting element and the second light-emitting element.

22. A method for manufacturing an image display device, the method comprising:

providing a second substrate that comprises a first substrate, and a semiconductor layer formed on a first substrate, the semiconductor layer comprising a light-emitting layer;

forming a second conductive layer on the semiconductor layer;

providing a third substrate comprising a first surface;

bonding the semiconductor layer to the first surface via the second conductive layer;

removing the first substrate;

forming a first wiring line along a first direction by processing the second conductive layer;

forming a first light-emitting element comprising a first light-emitting surface and a second light-emitting element comprising a second light-emitting surface by processing the semiconductor layer;

forming an insulating film covering the first surface, the first wiring line, the first light-emitting element, and the second light-emitting element;

exposing the first light-emitting surface and the second light-emitting surface by removing a part of the insulating film;

forming a first light-transmitting electrode located along a second direction intersecting the first direction on the first light-emitting surface, and forming a second light-transmitting electrode located along the second direction on the second light-emitting surface;

electrically connecting a first terminal and the first wiring line by a pressure applied between the first terminal and the first wiring line, by locating a first anisotropic conductive member between the first terminal and the first wiring line; and electrically connecting the first light-transmitting electrode and a second terminal via a second anisotropic conductive member, and electrically connecting the second light-transmitting electrode and a third terminal via the second anisotropic conductive member, wherein the first light-emitting element comprises a first bottom surface connected to the first wiring line, and the first light-emitting surface is located on a side of the first light-emitting element opposite to the first bottom surface, and the second light-emitting element comprises a second bottom surface connected to the first wiring line, and the second light-emitting surface is located on a side of the second light-emitting element opposite to the second bottom surface.

* * * * *